(12) United States Patent
Mack

(10) Patent No.: US 11,521,825 B2
(45) Date of Patent: *Dec. 6, 2022

(54) SYSTEM AND METHOD FOR PREDICTING STOCHASTIC-AWARE PROCESS WINDOW AND YIELD AND THEIR USE FOR PROCESS MONITORING AND CONTROL

(71) Applicant: FRACTILIA, LLC, Austin, TX (US)

(72) Inventor: Chris Mack, Austin, TX (US)

(73) Assignee: Fractilia, LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/200,419

(22) Filed: Mar. 12, 2021

(65) Prior Publication Data

US 2021/0225609 A1 Jul. 22, 2021

Related U.S. Application Data

(63) Continuation-in-part of application No. 17/097,593, filed on Nov. 13, 2020, which is a
(Continued)

(51) Int. Cl.
*H01J 37/22* (2006.01)
*G06T 7/13* (2017.01)
(Continued)

(52) U.S. Cl.
CPC ............ *H01J 37/222* (2013.01); *G01Q 30/02* (2013.01); *G01Q 30/06* (2013.01); *G06T 5/002* (2013.01);
(Continued)

(58) Field of Classification Search
CPC .. H01J 37/222; H01J 37/28; H01J 2237/2814; H01J 2237/2817; G06T 7/42; G06T 7/49; G06T 7/13; G06T 5/002; G06T 7/40; G06T 2207/10061; G06T 2207/30148; G01Q 30/02; G01Q 30/06
See application file for complete search history.

(56) References Cited

U.S. PATENT DOCUMENTS 7,049,589 B2 5/2006 Yamaguchi et al.
7,310,155 B1 12/2007 Capodieci et al.
(Continued)

FOREIGN PATENT DOCUMENTS

WO 2018160502 A1 9/2018

OTHER PUBLICATIONS

Mack et al., "Modelling Metrology for Calibration of OPC Models", Metrology, Inspection, and Process Control for Micolithography XXX, Proc. SPIE vol. 9778 (2016), pp. 1-9.
(Continued)

*Primary Examiner* — Nicole M Ippolito
*Assistant Examiner* — Hanway Chang
(74) *Attorney, Agent, or Firm* — Dickinson Wright PLLC; Stephen A. Mason; Jonathan H. Harder

(57) ABSTRACT

In one embodiment, a method includes generating a model trained to predict a low-probability stochastic defect, using the model to predict the low-probability stochastic defect, determining a process window based on the low-probability stochastic defect, and controlling, based on the process window, a lithography tool to manufacture a device.

20 Claims, 27 Drawing Sheets

Related U.S. Application Data continuation-in-part of application No. 16/730,393, filed on Dec. 30, 2019, now Pat. No. 11,004,654, and a continuation of application No. 16/716,131, filed on Dec. 16, 2019, now Pat. No. 11,004,653, which is a continuation of application No. 16/222,668, filed on Dec. 17, 2018, now Pat. No. 10,510,509, said application No. 16/730,393 is a continuation of application No. 16/218,346, filed on Dec. 12, 2018, now Pat. No. 10,522,322, which is a continuation-in-part of application No. 15/892,080, filed on Feb. 8, 2018, now Pat. No. 10,176,966, said application No. 16/222,668 is a continuation of application No. 15/892,080, filed on Feb. 8, 2018, now Pat. No. 10,176,966.

(60) Provisional application No. 62/739,721, filed on Oct. 1, 2018, provisional application No. 62/678,866, filed on May 31, 2018, provisional application No. 62/602,152, filed on Apr. 13, 2017.

(51) Int. Cl.
*G06T 7/40* (2017.01)
*G06T 7/42* (2017.01)
*G06T 7/49* (2017.01)
*G06T 5/00* (2006.01)
*H01J 37/28* (2006.01)
*G01Q 30/02* (2010.01)
*G01Q 30/06* (2010.01)

(52) U.S. Cl.
CPC ............. *G06T 7/13* (2017.01); *G06T 7/40* (2013.01); *G06T 7/42* (2017.01); *G06T 7/49* (2017.01); *H01J 37/28* (2013.01); *G06T 2207/10061* (2013.01); *G06T 2207/30148* (2013.01); *H01J 2237/2814* (2013.01); *H01J 2237/2817* (2013.01)

(56) References Cited

U.S. PATENT DOCUMENTS

| | | | |
|---|---|---|---|
| 7,366,620 B2 | 4/2008 | Yamaguchi et al. | |
| 7,633,061 B2 | 12/2009 | Tanaka et al. | |
| 8,013,301 B2 | 9/2011 | Tam | |
| 8,050,898 B2 | 11/2011 | Hansen | |
| 8,108,805 B2 | 1/2012 | Rathsack | |
| 8,142,965 B2 | 3/2012 | Yoel | |
| 8,300,919 B2 | 10/2012 | Yamaguchi et al. | |
| 8,340,393 B2 | 12/2012 | Tam et al. | |
| 8,401,273 B2 | 3/2013 | Momonoi et al. | |
| 8,488,128 B2 | 7/2013 | Brill | |
| 9,236,219 B2 | 1/2016 | Chen et al. | |
| 9,824,938 B2 | 11/2017 | Yamaguchi et al. | |
| 10,176,966 B1 | 1/2019 | Mack | |
| 10,488,188 B2 | 11/2019 | Mack | |
| 10,510,509 B2 | 12/2019 | Mack | |
| 10,522,322 B2 | 12/2019 | Mack | |
| 10,648,801 B2 | 5/2020 | Mack | |
| 10,656,532 B2 | 5/2020 | Mack | |
| 10,664,955 B2 | 5/2020 | Mack | |
| 10,665,417 B2 | 5/2020 | Mack | |
| 10,665,418 B2 | 5/2020 | Mack | |
| 2018/0173839 A1 | 6/2018 | Fang et al. | |
| 2019/0113338 A1 | 4/2019 | Mack | |
| 2019/0139736 A1 | 5/2019 | Mack | |
| 2019/0164303 A1 | 5/2019 | Mack | |
| 2019/0180976 A1 | 6/2019 | Mack | |
| 2019/0180977 A1 | 6/2019 | Mack | |
| 2019/0186909 A1 | 6/2019 | Mack | |
| 2019/0187570 A1 | 6/2019 | Mack | |
| 2021/0202204 A1* | 7/2021 | Mack | G06T 7/49 |

OTHER PUBLICATIONS

Mack et al., "Using the Analytical Linescan Modle for SEM Metrology", Metrology, Inspection, and Process Control for Micolithography XXXI, Proc. (2017), pp. 1-8.

Mack et al., "Reducing Roughness in Extreme Ultraviolet Lithography", International Conference on Extreme Ultraviolet Lithography, SPI vol. 1045, (2017), pp. 1-14.

Lorusso et al., "Unbiased Roughness Mesaurements: Subtracting Out SEM Effects", Microelectronic Engineering 190, available Jan. 6, 2018, pp. 33-37.

\* cited by examiner

POWER SPECTRAL DENSITY (PSD) VS. FREQUENCY FOR SAMPLE WITH ROUGH EDGE

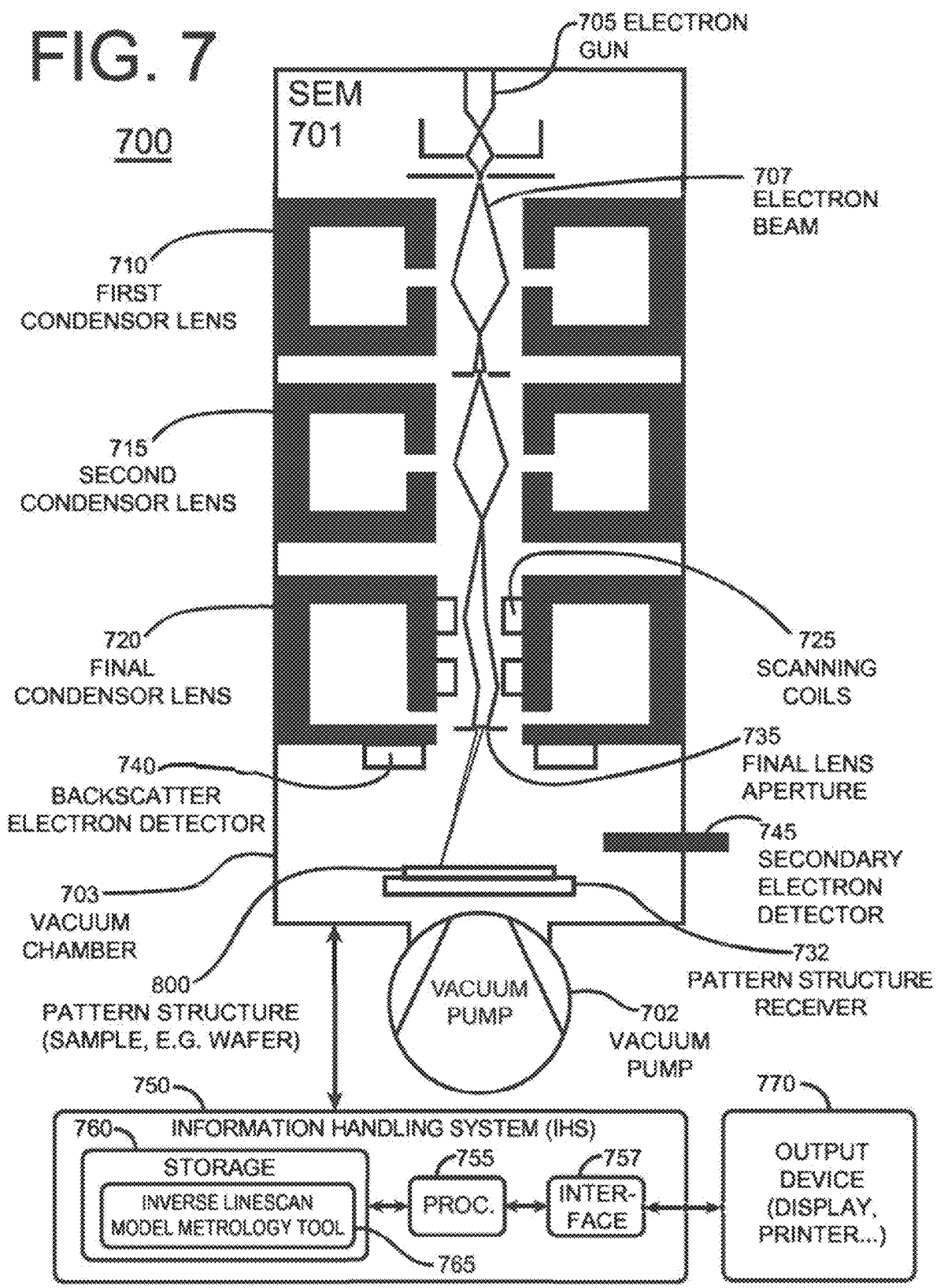

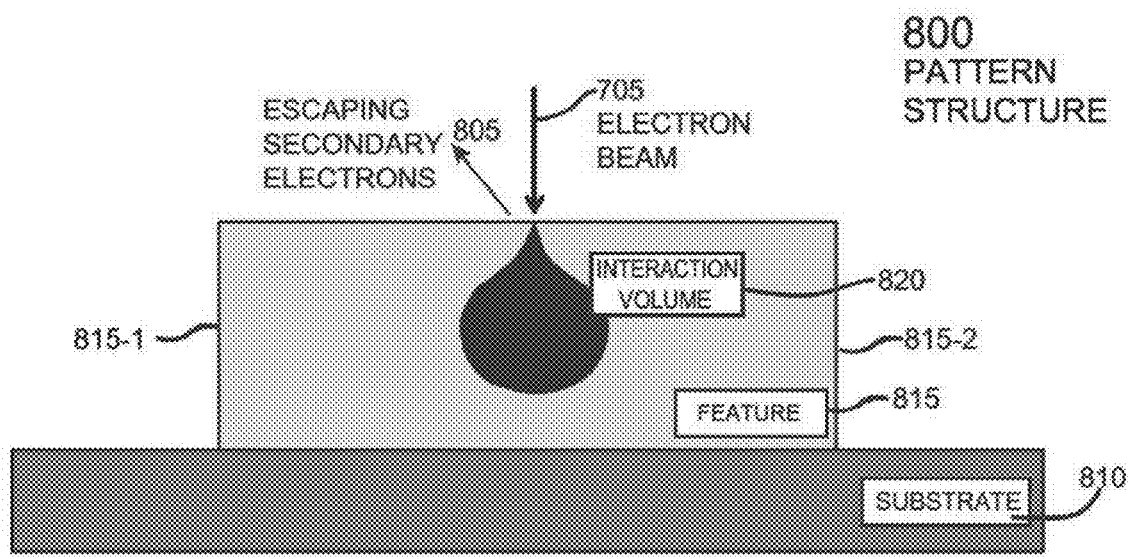
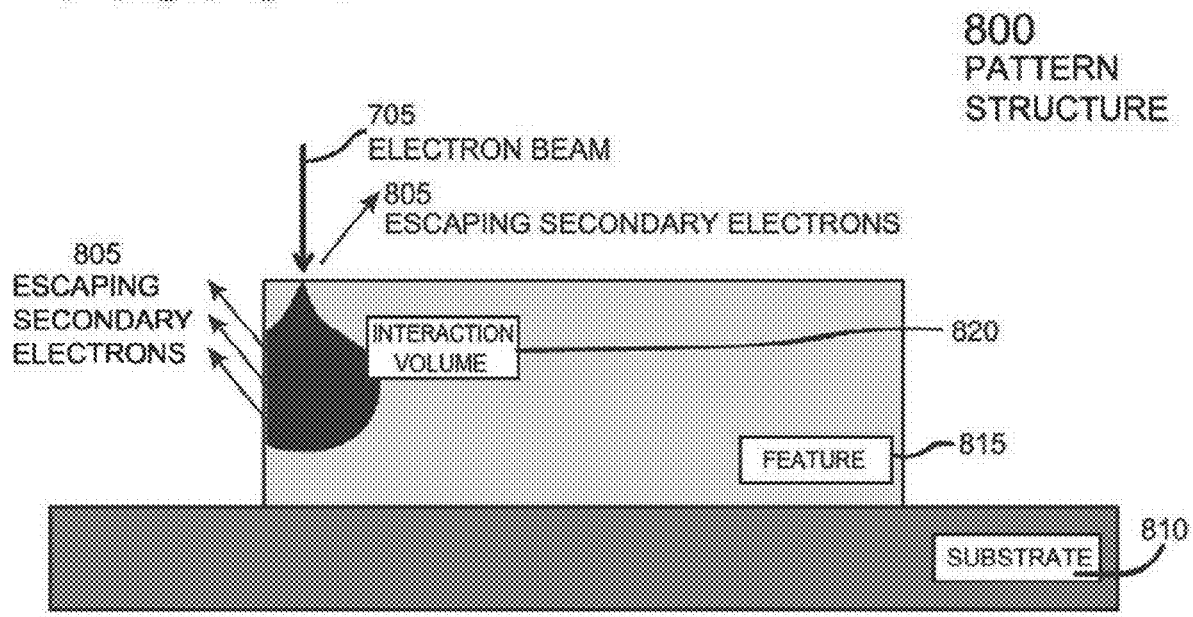

FIG. 16
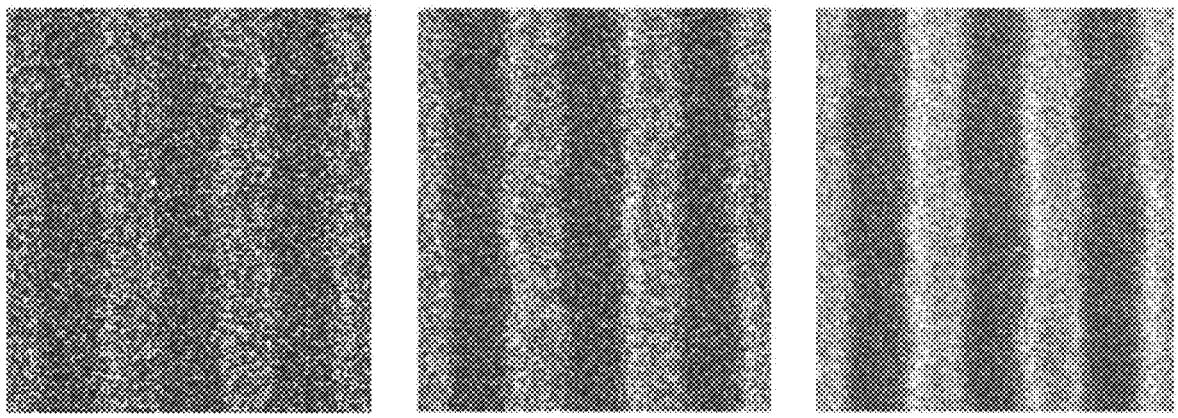
FIG. 17C
No Filter
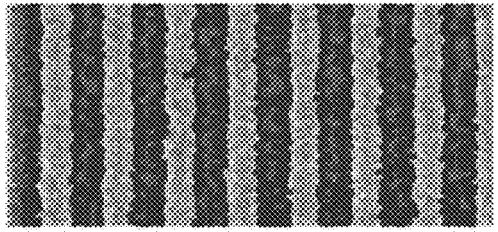
7X2 Gaussian Filter
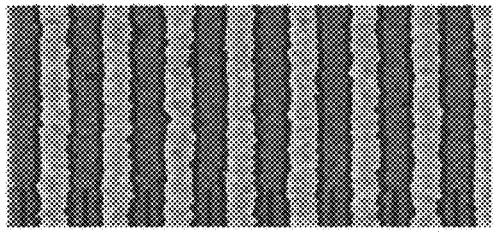

Greyscale value (vertical axis) versus horizontal position

After Spike Removal

Original PSDs

Bump Type II (Wiggle)

Bump Type I

SYSTEM AND METHOD FOR PREDICTING STOCHASTIC-AWARE PROCESS WINDOW AND YIELD AND THEIR USE FOR PROCESS MONITORING AND CONTROL

CROSS REFERENCE TO RELATED APPLICATIONS

This patent application is a continuation-in-part of U.S. application Ser. No. 17/097,593 filed Nov. 13, 2020 titled "System and Method for Generating and Analyzing Roughness Measurements and Their Use for Process Monitoring and Control", which is a continuation-in-part of U.S. application Ser. No. 16/730,393 filed Dec. 20, 2019 titled "System and Method for Generating and Analyzing Roughness Measurements", which is a continuation of U.S. application Ser. No. 16/218,346 titled "System and Method for Generating and Analyzing Roughness Measurements" (now U.S. Pat. No. 10,522,322), which is a continuation-in-part of and claims priority to U.S. application Ser. No. 15/892,080 filed Feb. 8, 2018 titled "Edge Detection System" (now U.S. Pat. No. 10,176,966). This application further claims priority to U.S. Provisional patent Application No. 62/739,721 filed Oct. 1, 2018 titled "System and Method for Generating and Analyzing Roughness Measurements" and U.S. Provisional Patent Application No. 62/678,866 filed May 31, 2018 titled "System and Method for Removing Noise From Roughness Measurements." Further, as a continuation of U.S. application Ser. No. 16/218,346, this application claims priority to U.S. Provisional Patent Application Ser. No. 62/602,152, filed Apr. 13, 2017 and titled "Edge Detection System." All applications are incorporated by reference herein as if reproduced in full below.

This patent application is a continuation-in-part of U.S. application Ser. No. 17/097,593 filed Nov. 13, 2020 titled "System and Method for Generating and Analyzing Roughness Measurements and Their Use for Process Monitoring and Control", which is a continuation of U.S. application Ser. No. 16/716,131 filed Dec. 16, 2019 titled "Edge Detection System", which is a continuation of U.S. application Ser. No. 16/222,668 filed Dec. 17, 2018 titled "Edge Detection System," (now U.S. Pat. No. 10,510,509), which is a continuation of U.S. application Ser. No. 15/892,080 filed Feb. 8, 2018 titled "Edge Detection System" (now U.S. Pat. No. 10,176,966). The Ser. No. 15/892,080 application claims priority to U.S. Provisional Patent Application Ser. No. 62/602,152, filed Apr. 13, 2017 and also titled "Edge Detection System." Both applications are incorporated by reference herein as if reproduced in full below.

BACKGROUND

The disclosures herein relate generally to roughness measurements of pattern structures, and more particularly, to roughness measurements of pattern structures in noise-prone images, such as in images formed when using a scanning electron microscope (SEM) or other imaging apparatus that produce images including undesired noise, and even more particularly, to analyzing such roughness measurements to remove unwanted artifacts (spikes) and measure desired features (bumps). Further, the disclosures generally relate to controlling a manufacturing process through the use of such measurements.

BRIEF SUMMARY

Disclosed herein are systems and methods that remove noise from roughness measurements to determine roughness of a feature in a pattern structure and extracting useful information from those measurements. In one embodiment, a method for determining roughness of a feature in a pattern structure includes generating, using an imaging device, a set of one or more images. Each image of the set includes one or more instances of a feature within a respective pattern structure, and each image includes measured linescan information corresponding to the pattern structure that includes noise. The method also includes detecting edges of the features within the pattern structure of each image of the set without filtering the images, generating a biased power spectral density (PSD) dataset representing feature geometry information corresponding to the edge detection measurements of the set of images, evaluating a high-frequency portion of the biased PSD dataset to determine a noise model for predicting noise over all frequencies of the biased PSD dataset, and subtracting the noise predicted by the determined noise model from a biased roughness measure to obtain an unbiased roughness measure. The method further includes filtering out unwanted spikes in the PSD caused by measurement artifacts or other phenomenon to better reveal the true PSD behavior of the rough features. The method further includes modeling the PSD to extract information about bumps in the PSD caused by, for example, mask roughness or stress-related wiggle.

The method may further includes using the unbiased roughness measure to assess the quality of the pattern structure. The method further includes using the unbiased roughness measure to assess the quality of the process and process materials used to fabricate the pattern structure. The method further includes using the unbiased roughness measure to assess the quality of the process equipment used to fabricate the pattern structure. The method further includes using the biased and unbiased roughness measures to assess the quality of the metrology used to measure the pattern structure. The method further includes using the unbiased roughness measure and said quality assessment to make changes to the fabrication process, fabrication process equipment, or metrology process or equipment to affect an improvement in quality of the patterned structure, either in a manual or automated way. The method further includes using the unbiased roughness measure and said quality assessment to make changes to the fabrication process, fabrication process equipment, or metrology process or equipment to affect an increase in throughput of the fabrication process without loss of quality of the patterned structure. The method further includes using the unbiased roughness measure and said quality assessment to make changes to the fabrication process, fabrication process equipment, or metrology process or equipment to affect a reduction in cost of the fabrication process without loss of quality of the patterned structure. The method further includes an automated feedback system to perform such process changes.

In another embodiment, a system for determining roughness of a feature in a pattern structure includes an imaging device for generating a set of one or more images, and a processor. Each image of the set includes one or more instances of a feature within a respective pattern structure, and each image includes measured linescan information corresponding to the pattern structure that includes noise. The processor is coupled to receive the measured linescan information from the imaging device. The processor is configured to detect edges of the features within the pattern structure of each image of the set without filtering the images, generate a biased power spectral density (PSD) dataset representing feature geometry information corresponding to the edge detection measurements of the set of images, evaluate a high-frequency portion of the biased PSD dataset to determine a noise model for predicting noise over all frequencies of the biased PSD dataset, subtract the noise predicted by the determined noise model from a biased roughness measure to obtain an unbiased roughness measure, and filter and/or model the PSD to remove unwanted artifacts and reveal artifacts of interest. In some embodiments, the processor is configured to use the obtained roughness measures to assess the quality of the patterned structure and its fabrication process, and control the fabrication process based on such roughness measures and quality assessments.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 7 is a block diagram of a scanning electron microscope (SEM) coupled to an information handling system (IHS) that together form one embodiment of the disclosed edge detection apparatus.

FIG. 8A is a representation of a feature disposed on a substrate that depicts an electron beam impinging on the center of the feature.

FIG. 8B is a representation of a feature disposed on a substrate that depicts an electron beam impinging on the feature near its edge.

FIG. 16 shows portions of three SEM images of nominally the same lithographic features taken at different SEM electron doses.

FIG. 17C shows grayscale images as an example of using a simple threshold edge detection algorithm with image filtering in the right image, and without image filtering in the left image.

DETAILED DESCRIPTION

Figure 1A:
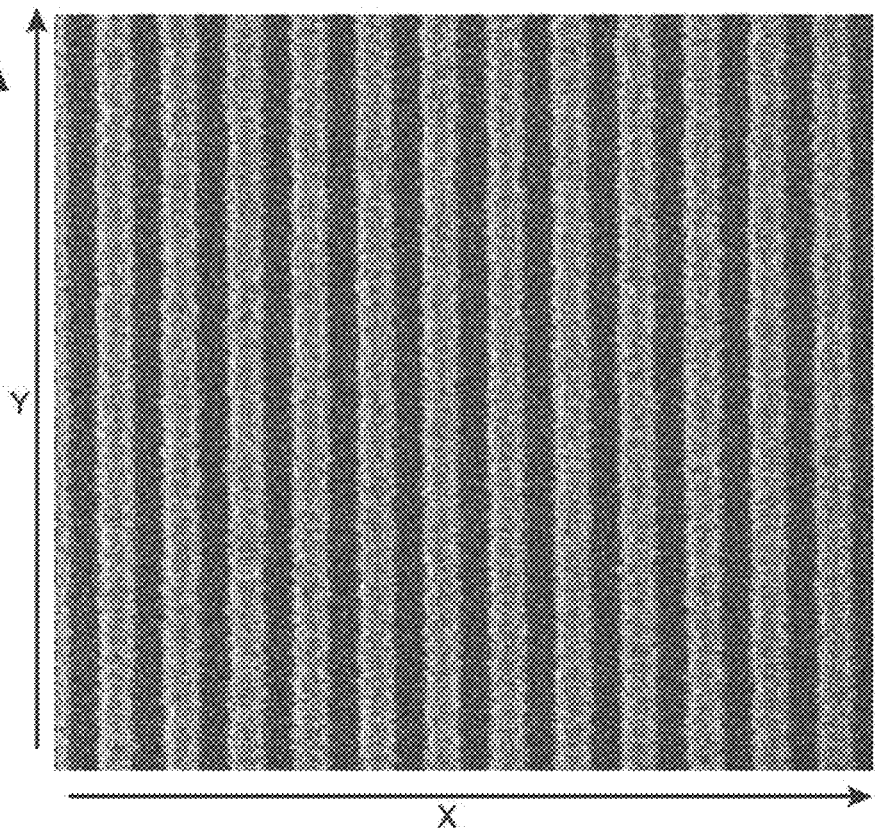
FIG. 1A is a representation of a pattern structure that exhibits parallel line features with spaces in between the lines.

Measuring the roughness of a pattern is complicated by that fact that noise in the measurement system is difficult to differentiate from the roughness being measured. It is common to using an imaging tool, such as a microscope, to create a detailed image of an object to be measured and then analyze the information on that image to measure and characterize the roughness of one or more features of the object. In this case, noise in the acquired image can appear to be roughness of the features in the image. Described below are techniques useful to separate the noise in the image from the actual roughness of the features in order to produce more accurate measurements of the roughness of the features.

Measuring the roughness of a pattern is further complicated by that fact that undesirable artifacts at specific spatial frequencies can be present in the images. These artifacts might be caused by imaging anomalies such as jitter in the scanning used to acquire the image. These artifacts might also be caused by physical aspects of the object to be measured, such as regular topographical structures lying below the features to be measured, that interfere with the measurement of those features.

As an example, scanning electron microscopes (SEMs) are very useful for studying the features of pattern structures, such as semiconductor devices, for example. Unfortunately, measuring feature roughness of these structures is often challenging because of the noise that is inherent in SEM images. Filtering (smoothing) of the SEM image is typically needed to achieve accurate edge detection, but such filtering undesirably changes the feature roughness that is measured. An edge detection approach is needed that reliably detects edges in very noisy SEM images without the use of image filtering (or at least without any filtering that would change the feature roughness that is measured).

Pattern roughness is a major problem in many fields. Many if not all techniques for creating patterns of various shapes produce roughness on the edges of those patterns, at least on the near molecular scale if not larger scales. For example, in advanced lithography for semiconductor manufacturing, especially for extreme ultraviolet (EUV) lithography but for other lithography methods as well, roughness of the printed and etched patterns can cause many negative effects. Reduction in roughness requires a better understanding of the sources of stochastic variation, which in turn requires better measurement and characterization of rough features. Prior art roughness measurement approaches suffer from severe bias because noise in the image adds to the roughness on the wafer. The disclosures herein provide a practical approach to making unbiased roughness measurements through the use of a physics-based inverse linescan model. This enables accurate and robust measurement of roughness parameters over a wide range of SEM metrology conditions.

Before discussing embodiments of the disclosed technology that address the SEM image noise problem, this disclosure first discusses lithography of pattern structures and the frequency dependence of roughness.

1. Stochastic Effects in Lithography

Lithography and patterning advances continue to propel Moore's Law by cost-effectively shrinking the area of silicon consumed by a transistor in an integrated circuit. Besides the need for improved resolution, these lithography advances should also allow improved control of the smaller features being manufactured. Historically, lithographers focused on "global" sources of variation that affect patterning fidelity (e.g., exposure dose and focus variations, hotplate temperature non-uniformity, scanner aberrations) by attempting to minimize the sources of these variations and by developing processes with minimum sensitivity to these variations. Today's small features, however, also suffer from "local" variations caused by the fundamental stochastics of patterning near the molecular scale.

In lithography, light is used to expose a photosensitive material called a photoresist. The resulting chemical reactions (including those that occur during a post-exposure bake) change the solubility of the resist, enabling patterns to be developed and producing the desired critical dimension (CD). For a volume of resist that is "large" (that is, a volume that contains many, many resist molecules), the amount of light energy averaged over that volume produces a certain amount of chemical change (on average) which produces a certain (average) amount of dissolution to create the pattern. The relationships between light energy, chemical concentration, and dissolution rate can be described with deterministic equations that predict outputs for a given set of inputs. These models of lithography are extremely useful and are commonly used to understand and control lithography processes for semiconductor manufacturing.

This deterministic view of a lithography process (certain inputs always produce certain outputs) is only approximately true. The "mean field theory" of lithography says that, on average, the deterministic models accurately predict lithographic results. If we average over a large number of photons, a single number for light energy (the average) is sufficient to describe the light energy. For a large volume of resist, the average concentration of a chemical species sufficiently describes its chemical state. But for very small volumes, the number of atoms or molecules in the volume becomes random even for a fixed "average" concentration. This randomness within small volumes (that is, for small quantities of photons or molecules or numbers of events) is generally referred to as "shot noise", and is an example of a stochastic variation in lithography that occurs when the region of interest approaches the molecular scale.

A stochastic process is one in which the results of the process are randomly determined. At the atomic/molecular level, essentially all processes are stochastic. For semiconductor patterning at the 20-nm node and below (with minimum feature sizes below 40 nm), the dimensions of interest are sufficiently small that stochastic effects become important and may even dominate the total variations that affect the dimensions, shapes, and placements of the patterns being fabricated. These stochastic effects can also be important for larger feature sizes under some circumstances.

Figure 1B:
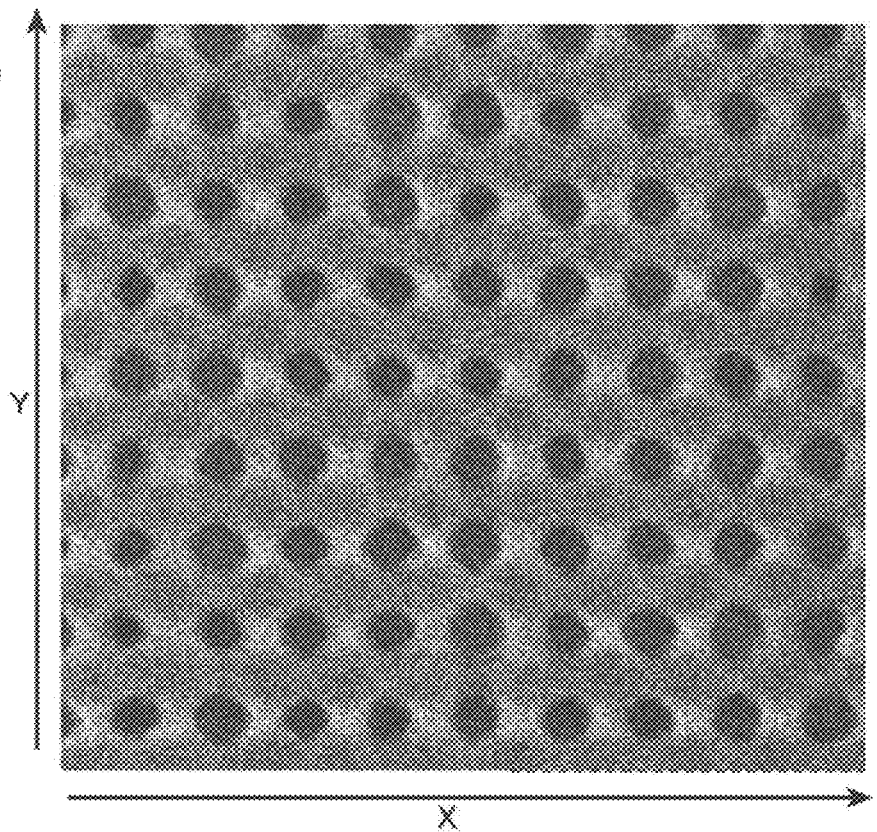
FIG. 1B is a representation of a pattern structure that includes contact hole features.

The most prominent manifestation of stochastic variations in lithography (as well as etch and other parts of the patterning process) is that the patterns being produced are rough rather than smooth (FIG. 1A). In the pattern structure shown in FIG. 1A, nominally parallel vertical lines appear as bright vertical regions, while spaces appear as dark vertical regions between the lines. The roughness of the edge of a feature is called line-edge roughness (LER), and the roughness of the width of a feature is called linewidth roughness (LWR). The roughness of the centerline of the feature (the midpoint between left and right edges) is called pattern placement roughness (PPR). Another important consequence of these stochastic variations is the random variation of the size, shape, and placement of features, which are especially evident for contact hole features (FIG. 1B).

Stochastic effects in patterning can reduce the yield and performance of semiconductor devices in several ways: a) Within-feature roughness can affect the electrical properties of a device, such as metal line resistance and transistor gate leakage; b) Feature-to-feature size variation caused by stochastics (also called local CD uniformity, LCDU) adds to the total budget of CD variation, sometimes becoming the dominant source; c) Feature-to-feature pattern placement variation caused by stochastics (also called local pattern placement error, LPPE) adds to the total budget of PPE, sometimes becoming the dominant source; d) Rare events leading to greater than expected occurrence of catastrophic bridges or breaks are more probable if error distributions have fat tails; and e) Decisions based on metrology results (including process monitoring and control, as well as the calibration of optical proximity correction (OPC) models) can be poor if those metrology results do not properly take into account stochastic variations. For these reasons, proper measurement and characterization of stochastic-induced roughness is critical.

Many other kinds of devices are also sensitive to feature roughness. For example, roughness along the edge of an optical waveguide can cause loss of light due to scattering. Feature roughness in radio frequency microelectromechanical systems (MEMS) switches can affect performance and reliability, as is true for other MEMS devices. Feature roughness can degrade the output of light emitting diodes. Edge roughness can also affect the mechanical and wetting properties of a feature in microfluidic devices. Roughness of the features in a wire grid polarizer can affect the efficiency and transmission of the polarizer.

Unfortunately, prior art roughness measurements (such as the measurement of linewidth roughness or line-edge roughness using a critical dimension scanning electron microscope, CD-SEM) are contaminated by measurement noise caused by the measurement tool. This results in a biased measurement, where the measurement noise adds to the true roughness to produce an apparent roughness that overestimates the true roughness. Furthermore, these biases are dependent on the specific measurement tool used and on its settings. These biases are also a function of the patterns being measured. Prior art attempts at providing unbiased roughness estimates often struggle in many of today's applications due to the smaller feature sizes and higher levels of SEM noise.

Thus, there is a need for a new approach to making unbiased roughness measurements that avoids the problems of prior art attempts and provides an unbiased estimate of the feature roughness that is both accurate and precise. Further, a good pattern roughness measurement method should have minimum dependence on metrology tool settings. CD-SEM settings such as magnification, pixel size, number of frames of averaging (equivalent to total electron dose in the SEM), voltage, and current may cause fairly large changes in the biased roughness that is measured. Ideally, an unbiased roughness measurement would be independent of these settings to a large degree.

Additionally, bias in the measurement of roughness degrades the quality and usefulness of the roughness measurements themselves. The results of roughness measurement can be used in many ways to make many types of decisions, for example, in an integrated circuit manufacturing process. A measurement of pattern structure roughness can be used to assess the quality of the device being fabricated, and to predict yield and performance of the devices being fabricated. If the predicted yield or performance is sufficiently poor, a decision could be made to stop further processing of those devices and scrap the specific devices, the integrated circuit in which the devices were found, the wafer or substrate on which the integrated circuit was found, or the manufacturing lot or batch in which the wafer was found.

A further use for the results of a measurement of pattern roughness is in the assessment of the quality of the manufacturing process or manufacturing tools that were used to make the measured patterns. Such an assessment could be used to affect changes in the manufacturing process or tool to improve pattern quality. For example, pattern roughness is sensitive to the focus setting of a lithography tool used to print the patterns. An increase in measured pattern roughness could be used to trigger a focus check and focus adjustment of the lithography tool, thus improving the quality of subsequently printed patterns. Degradation in the quality of the roughness measurements could result in degradation in the quality of the process decisions made using those measurements, such as making a focus change when none is needed, or not making a focus change when one is needed.

The use of unbiased measurements of roughness would improve the quality of the decisions made, for example, the decision to scrap a wafer or lot, or the decision to change a process or tool setting. Since the bias in a roughness measurement can change from measurement to measurement even if the true roughness of the pattern structure does not change, the use of biased roughness measurements for these and other decisions is problematic.

A further use for the results of a measurement of pattern roughness is in the assessment of the quality of the metrology used to make the measurements. If, for example, a change in the bias in the measurements were detected, adjustment to the measurement tool (for example, the SEM) could be made to improve the quality and reliability of the measurements.

2. The Frequency Dependence of Line-Edge Roughness (LER), Line-Width Roughness (LWR), and Pattern Placement Roughness (PPR)

Figure 2:
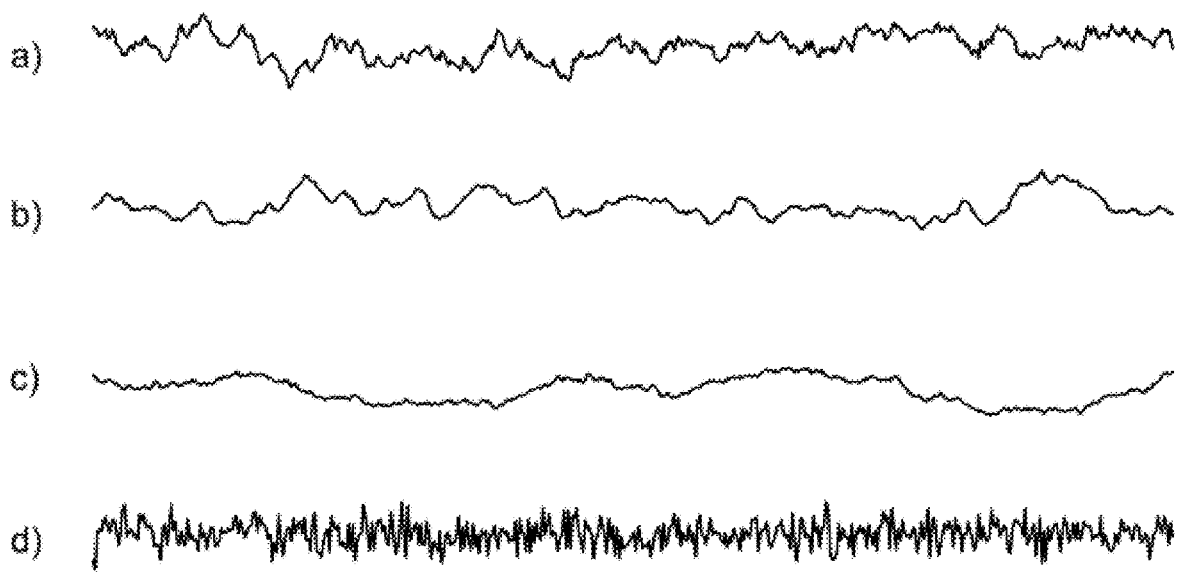
FIG. 2 shows four different rough edges, all with the same standard deviation.

Rough features are most commonly characterized by the standard deviation of the edge position (for LER), linewidth (for LWR), or feature centerline (for PPR). But describing the standard deviation is not enough to fully describe the roughness. FIG. 2 shows four different rough edges, all with the same standard deviation. The prominent differences visible in the edges make it clear that the standard deviation is not enough to fully characterize the roughness. Instead, a frequency analysis of the roughness is required. The four randomly rough edges depicted in FIG. 2 all have the same standard deviation of roughness, but differ in the frequency parameters of correlation length ($\xi$) and roughness exponent (H). More specifically, with respect to FIG. 2, in case a) $\xi=10$, H=0.5; in case b) $\xi=10$, H=1.0; in case c) $\xi=100$, H=0.5; and in case d) $\xi=0.1$, H=0.5.

The standard deviation of a rough edge describes its variation relative to and perpendicular to an ideal straight line. In FIG. 2, the standard deviation describes the vertical variation of the edge. But the variation can be spread out differently along the length of the line (in the horizontal direction in FIG. 2). This line-length dependence can be described using a correlation function such as the autocorrelation function or the height-height correlation function.

Figure 3:
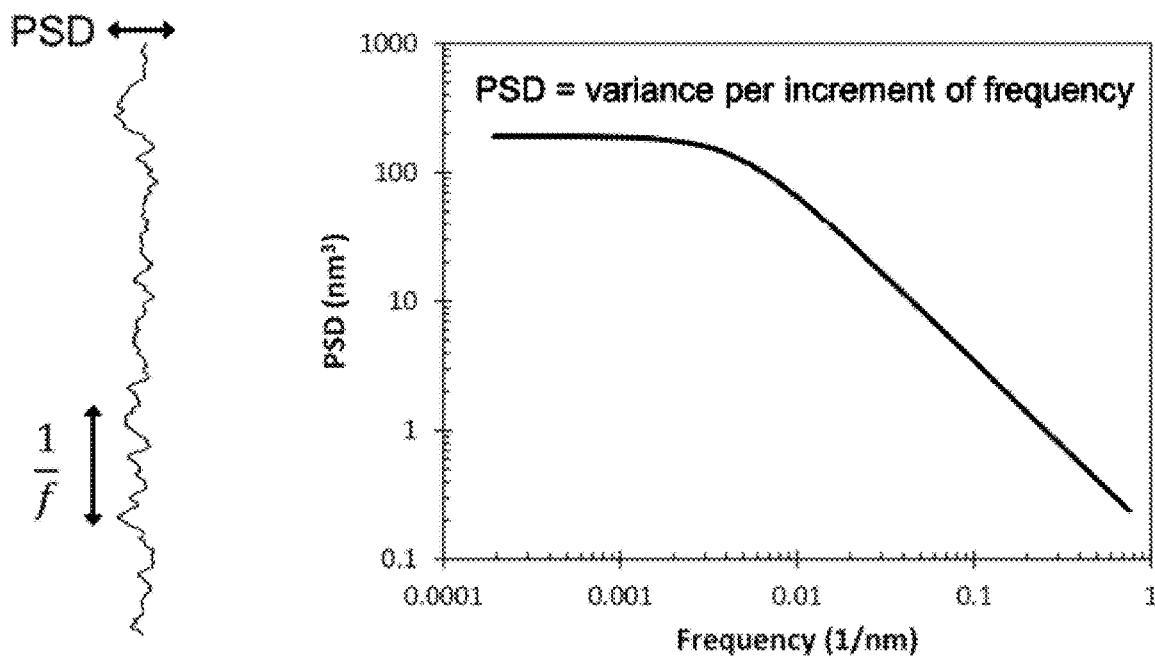
FIG. 3 is a representation of power spectral density (PSD) vs. frequency on a log-log scale.

Alternatively, the frequency f can be defined as one over a length along the line (FIG. 3). The dependency of the roughness on frequency can be characterized using the well-known power spectral density (PSD). The PSD is the variance of the edge per unit frequency (FIG. 3), and is calculated as the square of the coefficients of the Fourier transform of the edge deviation. The low-frequency region of the PSD curve describes edge deviations that occur over long length scales, whereas the high-frequency region describes edge deviations over short length scales. Commonly, PSDs are plotted on a log-log scale as used in FIG. 3.

The PSD of lithographically defined features generally has a shape similar to that shown in FIG. 3. The low-frequency region of the PSD is flat (so-called "white noise" behavior), and then above a certain frequency it falls off as a power of the frequency (a statistically fractal behavior). The difference in these two regions has to do with correlations along the length of the feature. Points along the edge that are far apart are uncorrelated with each other (statistically independent), and uncorrelated noise has a flat power spectral density. But at short length scales the edge deviations become correlated, reflecting a correlating mechanism in the generation of the roughness, such as acid reaction-diffusion for a chemically amplified resist. The transition between uncorrelated and correlated behavior occurs at a distance called the correlation length.

Figure 4:
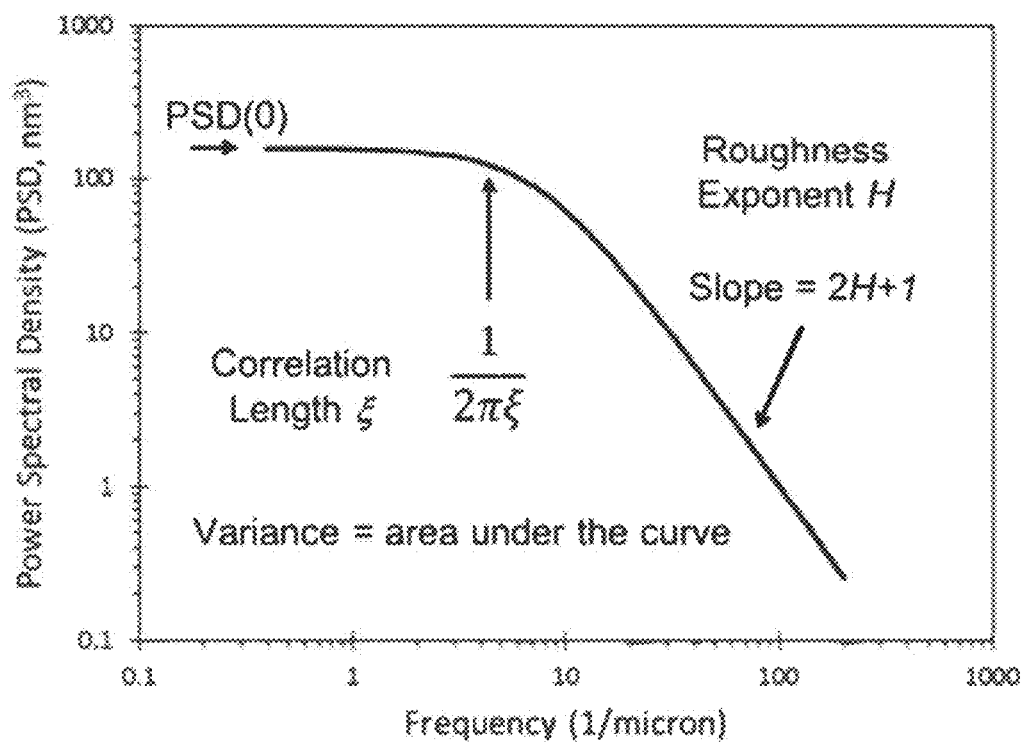
FIG. 4 is a graphic representation of power spectral density (PSD) plotted vs. frequency and depicting roughness parameters PSD(0), correlation length, and roughness exponent.

FIG. 4 shows that a typical PSD curve can be described with three parameters. PSD(0) is the zero-frequency value of the PSD. While this value of the PSD can never be directly measured (zero frequency corresponds to an infinitely long line), PSD(0) can be thought of as the value of the PSD in the flat low-frequency region. The PSD begins to fall near a frequency of $1/(2\pi\xi)$ where j is the correlation length. In the fractal region, we have what is sometimes called "1/f" noise and the PSD has a slope (on the log-log plot) corresponding to a power of 1/f. The slope is defined as 2H+1 where H is called the roughness exponent (or Hurst exponent). Typical values of H are between 0.5 and 1.0. For example, H=0.5 when a simple diffusion process causes the correlation. Each of the parameters of the PSD curve has important physical meaning for a lithographically defined feature as discussed in more detail below. The variance of the roughness is the area under the PSD curve and can be derived from the other three PSD parameters. The exact relationship between variance and the other three PSD parameters depends on the exact shape of the PSD curve in the mid-frequency region (defined by the correlation length), but an approximate relationship can be used to show the general trend, as per EQUATION 1 below:

$$\sigma^2 \approx \frac{PSD(0)}{(2H+1)\xi} \quad \text{EQUATION 1}$$

Figure 5:
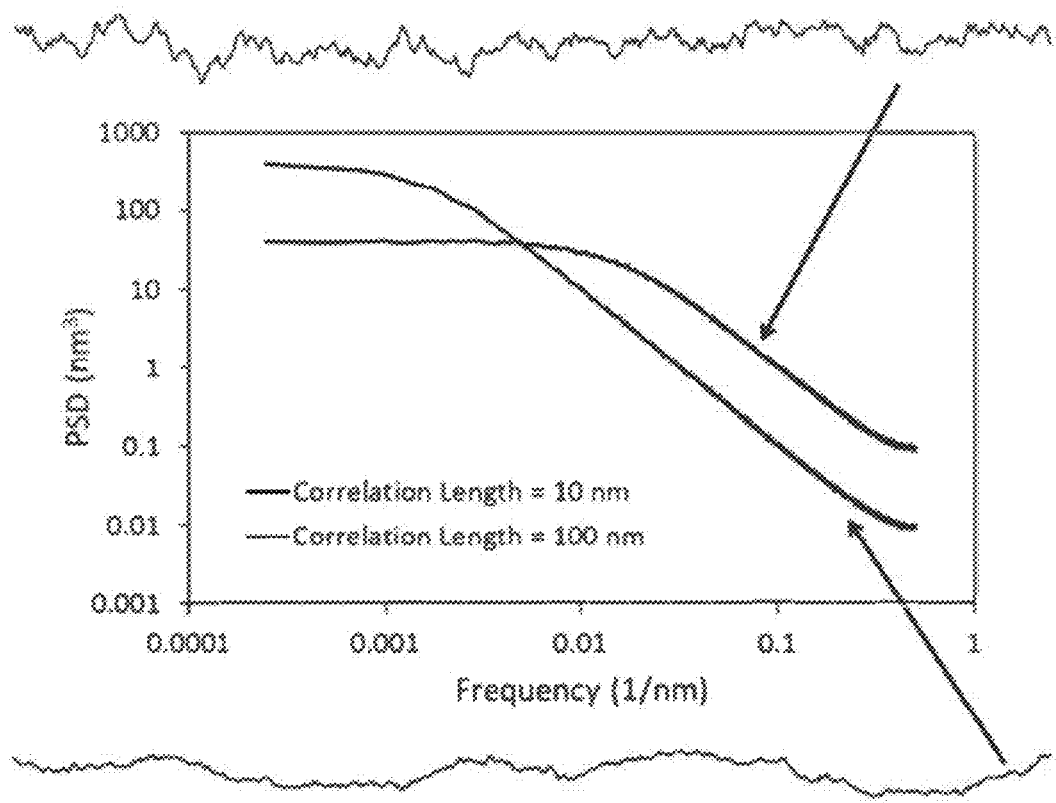
FIG. 5 shows two power spectral densities (PSDs) corresponding to respective edges of a feature on a pattern structure.

The differences observed in the respective four rough edges of FIG. 2 can now be easily seen as differences in the PSD behavior of the features. FIG. 5 shows two PSDs, corresponding to edge a) and edge c) from FIG. 2. While these two edges have the same variance (the same area under the PSD curve), they have different values of PSD(0) and correlation length (in this case the roughness exponent was kept constant). Although the standard deviations of the roughness of edge a) and edge c) are the same, these edges exhibit different PSD behaviors. As discussed below, the different PSD curves will result in different roughness behavior for lithographic features of finite length.

3. Impact of the Frequency Behavior of Roughness

The roughness of the lines and spaces of pattern structures is characterized by measuring very long lines and spaces, sufficiently long that the flat region of the PSD becomes apparent. For a sufficiently long feature the measured LWR (that is, the standard deviation 6 of the measured linewidths along the line) can be thought of as the LWR of an infinitely long feature, $\sigma_{LWR}(\infty)$. But pattern structures such as semiconductor devices are made from features that have a variety of lengths L. For these shorter features, stochastics will cause within-feature roughness, $\sigma_{LWR}(L)$, and feature-to-feature variation described by the standard deviation of the mean linewidths of the features, $\sigma_{CDU}(L)$. This feature-to-feature variation is called the local critical dimension uniformity, LCDU, since it represents CD (critical dimension) variation that is not caused by the well-known "global" sources of error (scanner aberrations, mask illumination non-uniformity, hotplate temperature variation, etc.).

For a line of length L, the within-feature variation and the feature-to-feature variation can be related to the LWR of an infinitely long line (of the same nominal CD and pitch) by the Conservation of Roughness principle given in EQUATION 2 below:

$$\sigma_{CDU}^2(L) + \sigma_{LWR}^2(L) = \sigma_{LWR}(\infty) \quad \text{EQUATION 2}$$

The Conservation of Roughness principle says that the variance of a very long line is partitioned for a shorter line into within-feature variation and feature-to-feature variation. How this partition occurs is determined by the correlation length, or more specifically by U. Using a basic model for the shape of the PSD as an example, it is seen that:

$$\sigma_{CDU}^2(L) = \frac{PSD(0)}{L}\left[1 - \frac{\xi}{L}(1 - e^{-L/\xi})\right] \quad \text{EQUATION 3}$$

Thus, EQUATIONS 1-3 show that a measurement of the PSD for a long line, and its description by the parameters PSD(0), $\xi$, and H, enables one to predict the stochastic influence on a line of any length L. It is noted that the LCDU does not depend on the roughness exponent, making H less important than PSD(0) and $\xi$. For this reason, it useful to describe the frequency dependence of roughness using an alternate triplet of parameters: $\sigma_{LWR}(\infty)$, PSD(0), and $\xi$. Note that these same relationships apply to LER and PPR as well.

It is also noted that, examining EQUATION 3, the correlation length is the length scale that determines whether a line of length L acts "long" or "short". For a long line, L>>$\xi$ and the local CDU behaves as per EQUATION 4 below:

$$\sigma_{CDU}(L) \approx \sqrt{\frac{PSD(0)}{L}} \quad \text{when } L \gg \xi \quad \text{EQUATION 4}$$

This long-line result provides a useful interpretation for PSD(0): It is the square of the LCDU for a given line times the length of that line. Reducing PSD(0) by a factor of 4 reduces the LCDU by a factor of 2, and the other PSD parameters have no impact (so long as L>>$\xi$). Typically, resists have yielded correlation lengths on the order of one quarter to one half of the minimum half-pitch of their lithographic generation. Thus, when features are longer than approximately five times the minimum half-pitch of the technology node, we are generally in this long line length regime. For shorter line lengths, the correlation length begins to matter as well.

Figure 6:
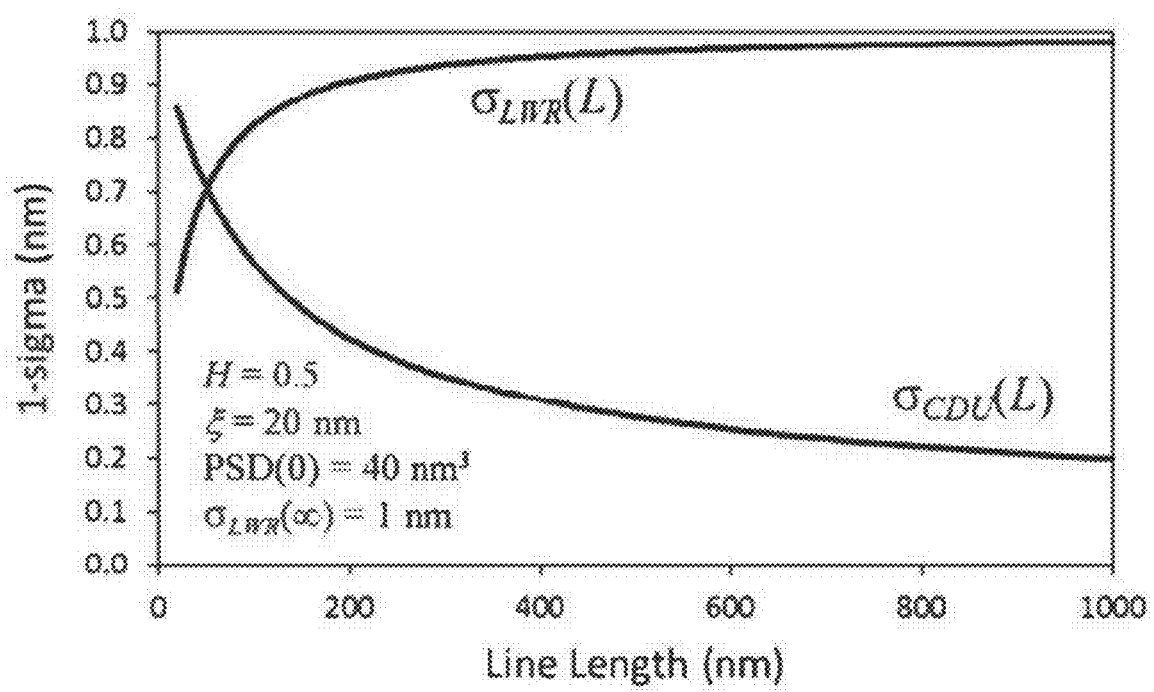
FIG. 6 is a graphic representation of the tradeoff of within-feature variation and feature-to-feature variation as a function of line length.

EQUATIONS 1-3 show a trade-off of within-feature variation and feature-to-feature variation as a function of line length. FIG. 6 shows an example of this relationship. For very long lines, LCDU is small and within-feature roughness approaches its maximum value. For very short lines the LCDU dominates. However, due to the quadratic nature of the Conservation of Roughness, $\sigma_{LWR}(L)$ rises very quickly as L increases, but LCDU falls very slowly as L increases. Thus, there is a wide range of line lengths where both feature roughness and LCDU are significant.

Since the Conservation of Roughness principle applies to PPR as well, short features suffer not only from local CDU problems but also from local pattern placement errors (LPPE) as well. For the case of uncorrelated left and right edges of a feature, the PSD(0) for LWR is typically twice the PSD(0) of the LER. Likewise, the PSD(0) of the LER is typically twice the PSD(0) of the PPR. Thus, in general, the LPPE is about half the LCDU. When left and right feature edges are significantly correlated, these simple relationships no longer hold.

The above equations allow a measurement of a very long pattern structure (where measurements are approaching the value one would obtain for an infinitely long feature) to predict the within-feature and feature-to-feature variation of shorter features of any length. For example, the feature length for such a prediction can be chosen to match the feature length of device features of interest. Predictions of the variations of this shorter feature could then be used to predict the yield and/or performance of a device that used such a feature using well-known models of device performance. Such models include, for example, TCAD models that predict the electrical behavior of a single transistor, or circuit timing models that predict the timing and skew of an entire circuit or sub-circuit.

4. Measurements of the Roughness of Pattern Structures with a Scanning Electron Microscope (SEM)

A common way to measure feature roughness for small features is the top-down critical dimension scanning electron microscope (CD-SEM). Typical light microscopes have magnifications up to 1000× and resolutions down to a few hundred nanometers. Scanning electron microscopes use electrons to create very small spots (near 1 nm in width) that can be used to create high-resolution images, with magnifications above 20,000×. CD-SEMs are SEMs that have been optimized for measuring the dimensions of a wide range of features found on semiconductor wafers. They can measure the mean critical dimension of a rough feature with high precision, but have also proven very useful for measuring LER, LWR, PPR, and their PSDs as well. However, there are errors in the SEM images that can have large impacts on the measured roughness and the roughness PSD while having little impact on the measurement of mean CD. For this reason, the metrology approach needed for PSD measurement may be quite different than the approach commonly used for mean CD measurement.

FIG. 7 shows a block diagram of one embodiment of the disclosed measurement system 700 that determines feature roughness. The pattern structure sample 800 and the electron imaging optics (710, 715, 720, 725) are situated in a vacuum chamber 703 that is evacuated by vacuum pump 702. Electrons are generated from a source such as an electron gun 705 to form an electron beam 707. Common electron beam sources include a heated tungsten filament, a lanthanum hexaboride (LaB6) crystal formed into a thermionic emission gun, or a sharp-tipped metal wire formed to make a field emission gun. The emitted electrons are accelerated and focused using electromagnetic condenser lenses 710, 715, and 720. The energy of the electrons striking the pattern structure sample 800 is generally in the 200 eV to 40 keV range in SEMs, but more typically 300 eV to 800 eV for CD-SEMs. Final condenser lens 720 employs scanning coils 725 to provide an electric field that deflects electron beam 707 toward pattern structure 800 as a focused spot. Scanning coils 725 scan the focused spot across the pattern structure 800 through final lens aperture 735 in a raster scan fashion to expose a specific field of view on the pattern structure 800. SEM 701 includes a backscatter electron detector 740 that detects backscatter electrons scattering back from pattern structure sample 800. SEM 700 also includes a secondary electron detector 745, as shown in FIG. 7. Prior to imaging pattern structure 800, the user places pattern structure 800 on a pattern structure receiver 732 that supports and positions pattern structure 800 within SEM 700. SEM 700 includes a controller (not shown) that controls the raster scanning of pattern structure 800 during imaging.

Referring now to FIGS. 8A and 8B, the electrons of electron beam 705 that strike pattern structure sample 800 undergo a number of processes that depend on the energy of the electron and the material properties of the sample. Electrons scatter off the atoms of the sample material, release energy, change direction, and often generate a cascade of secondary electrons by ionizing the sample atoms. Some of these secondary electrons may escape from the pattern structure (805) and others may remain inside the pattern structure. Pattern structure 800 includes a substrate 810, such as a semiconductor wafer. A feature 815 is disposed atop substrate 810, as shown in FIG. 8A. Feature 815 may be a metallic line, a semiconductor line, a photoresist line or other structures on substrate 810. Feature 815 may have other shapes such as a pillar or a hole, or more complicated shapes. Feature 815 may be repeating or isolated with respect to other features on the pattern structure. The space surrounding feature 815 may be empty (vacuum or air) or may be filled with a different material. Pattern structure 800 may be a liquid crystal or other flat panel display, or other pattern semiconductor or non-semiconductor device. Feature 815 includes edges 815-1 and 815-2. The region of feature 815 where electron beam 705 interacts with feature 815 is the interaction volume 820 that exhibits, for example, a tear-droplet-like shape as depicted in FIG. 8A.

Occasionally electrons ricochet backwards off the atom nucleus and exit out of the sample (called backscatter electrons). Some of the lower energy secondary electrons can also escape out of the sample 805 (frequently through the edges of a feature, see FIG. 8B). The way in which a SEM forms an image is by detecting the number of secondary electrons and/or backscatter electrons that escape the sample for each beam position.

As the electron beam is scanned across pattern structure sample 800 during one linescan, it "dwells" at a specific spot for a specific time. During that dwell time, the number of electrons detected by either the backscatter detector 725 or secondary electron detector 740, or both, is recorded. The spot is then moved to the next "pixel" location, and the process is repeated. The result is a two-dimensional array of pixels (locations along the surface of the sample) with detected electron counts digitally recorded for each pixel. The counts are typically then normalized and expressed as an 8-bit grayscale value between 0 and 255. This allows the detected electron counts to be plotted as a grayscale "image", such as those images shown in FIG. 1. While the image coming from a SEM reminds a viewer of an optical image as perceived through the eye, it is important to note that these grayscale images are actually just convenient plots of the collected data.

Figure 9:
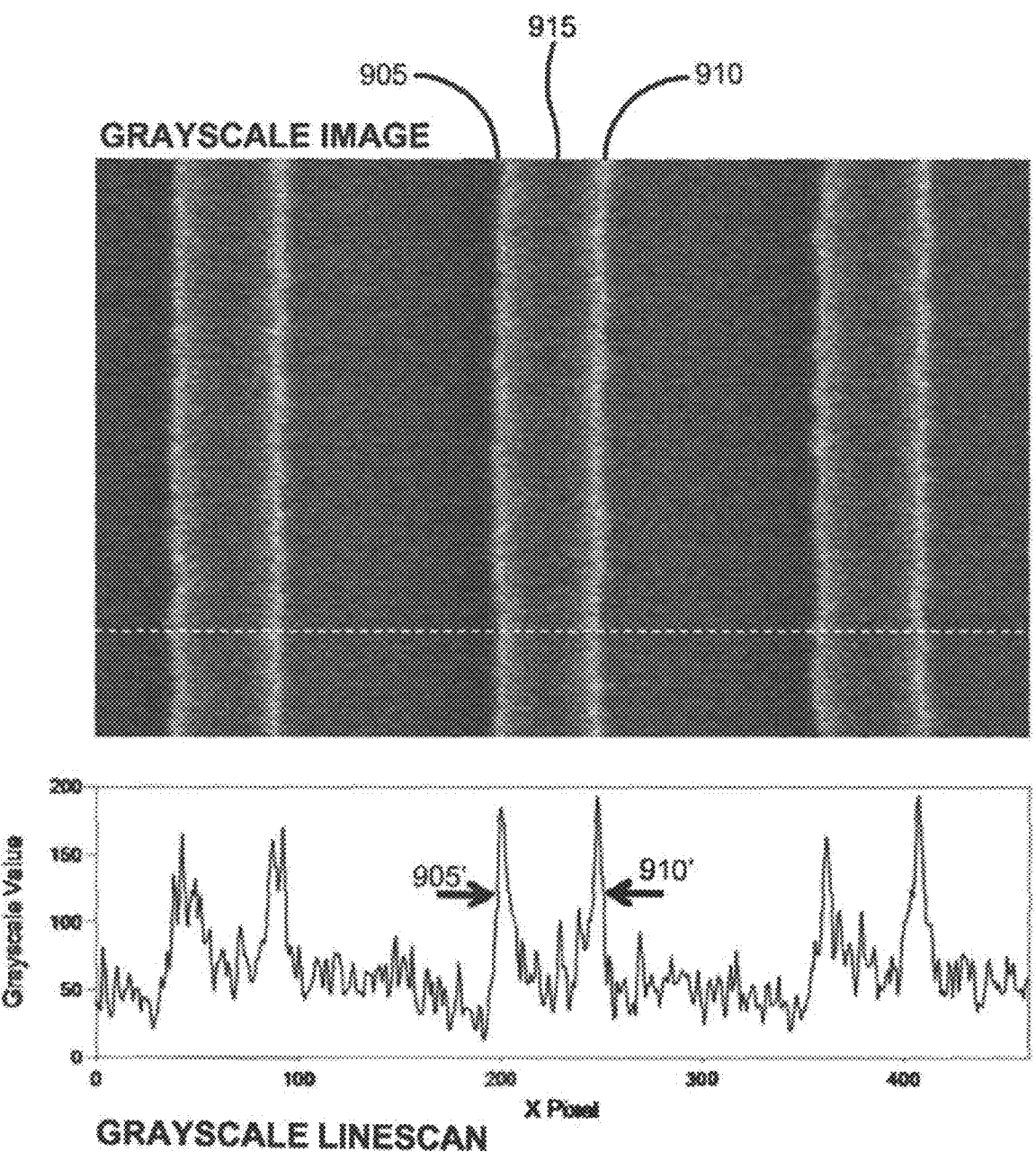
FIG. 9 shows a gray scale image representation on top with a corresponding grayscale linescan along one horizontal cut being graphically plotted immediately below.

A CD-SEM measures the width of a feature using the SEM image. The first step in measuring feature width is to detect the edges of the features. For pixels near an edge of a feature, higher numbers of secondary electrons escape through the feature edge, producing bright pixels called "edge bloom" (see FIG. 8B and FIG. 9). It is this bright edge bloom that allows the feature edge to be detected. For example, in the grayscale image representation in the upper portion of FIG. 9, such edge blooms are observed at edges 905 and 910 of feature 915. A linescan is essentially a horizontal cut through a 2D SEM image that provides a grayscale value as a function of horizontal pixel position on the feature, as in the graph shown in the bottom half of FIG. 9.

The data from a single horizontal row of pixels across the sample is called a "linescan". Note that the term linescan is used here broadly enough to include cases where an image is formed without the use of scanning. The positions of the edges of a feature can be detected from a single linescan, or from a collection of linescans representing the entire image, such as shown in the upper portion of FIG. 9. These same edges appear as peaks 905' and 910' in the grayscale value vs. pixel position graph in the lower portion of FIG. 9. Once the edges of a particular feature have been determined, the width of the particular feature is the difference between the positions of these two edges.

5. Linescan Models

Images are created through a physical process based on the microscope or other imaging tool used to acquire the image of a structure. Often these images are two-dimensional arrays of data, where the image can be thought of as a data set derived from the structure. A single one-dimensional cut through the image is called a linescan. A model of the imaging tool can predict the image for a given structure being imaged. For example, a model that describes a scanning electron microscope can predict the image that would be obtained by a SEM when imaging a given structure.

A CD-SEM converts a measured linescan or a series of measured linescans into a single dimension number, the measured CD. To better understand how the linescan relates to the actual dimensions of the feature being measured, it is important to understand how the systematic response of the SEM measurement tool to pattern structures impacts the shape of the resulting linescan. Rigorous 3D Monte Carlo simulations of SEM linescans can be extremely valuable for this purpose, but they are often too computationally expensive for day-to-day use. Thus, one approach is to develop a simplified analytical linescan model (ALM) that is more computationally appropriate to the task of quickly predicting linescans. The ALM employs the physics of electron scattering and secondary electron generation, and each term in the model has physical significance. This analytical linescan expression can be fit to rigorous Monte Carlo simulations to both validate and calibrate its use.

The general application for the ALM has been the typical forward modeling problem: Given material properties (for the feature and the substrate) and a geometric description of the feature (width, pitch, sidewall angle, top corner rounding, footing, etc.), the ALM predicts the linescan that would result. The mathematical details of the ALM are found in the publications: Chris A. Mack and Benjamin D. Bunday, "Analytical Linescan Model for SEM Metrology", *Metrology, Inspection, and Process Control for Microlithography XXIX, Proc.*, SPIE Vol. 9424, 94240F (2015), and Chris A. Mack and Benjamin D. Bunday, "Improvements to the Analytical Linescan Model for SEM Metrology", *Metrology, Inspection, and Process Control for Microlithography XXX*, Proc., SPIE Vol. 9778, 97780A (2016), the disclosures of both publications being incorporated herein by reference in their entireties. Other models with similar inputs and outputs can also be used.

The analytical linescan model (ALM) is briefly reviewed below. The mathematical modeling begins by assuming the interaction of the electron beam with a flat sample of a given substance produces an energy deposition profile that takes the form of a double Gaussian, with a forward scattering width and a fraction of the energy forward scattered, and a backscatter width and a fraction of the energy deposited by those backscattered electrons. The model also assumes that the number of secondary electrons that is generated within the material is in direct proportion to the energy deposited per unit volume, and the number of secondary electrons that escape the wafer (and so are detected by the SEM) are in direct proportion to the number of secondary electrons near the very top of the wafer.

The secondary electrons that reach the detector will emerge some distance r away from the position of the incident beam. From the assumptions above, the number of secondary electrons detected will be a function as given in EQUATION 5.

$$f(r) = ae^{-r^2/2\sigma_f^2} + be^{-r^2/2\sigma_b^2} \quad \text{EQUATION 5}$$

where $\sigma_f$ and $\sigma_b$ are the forward and backscatter ranges, respectively, and a and b are the amounts of forward scattering and backscattering, respectively.

Figure 10:
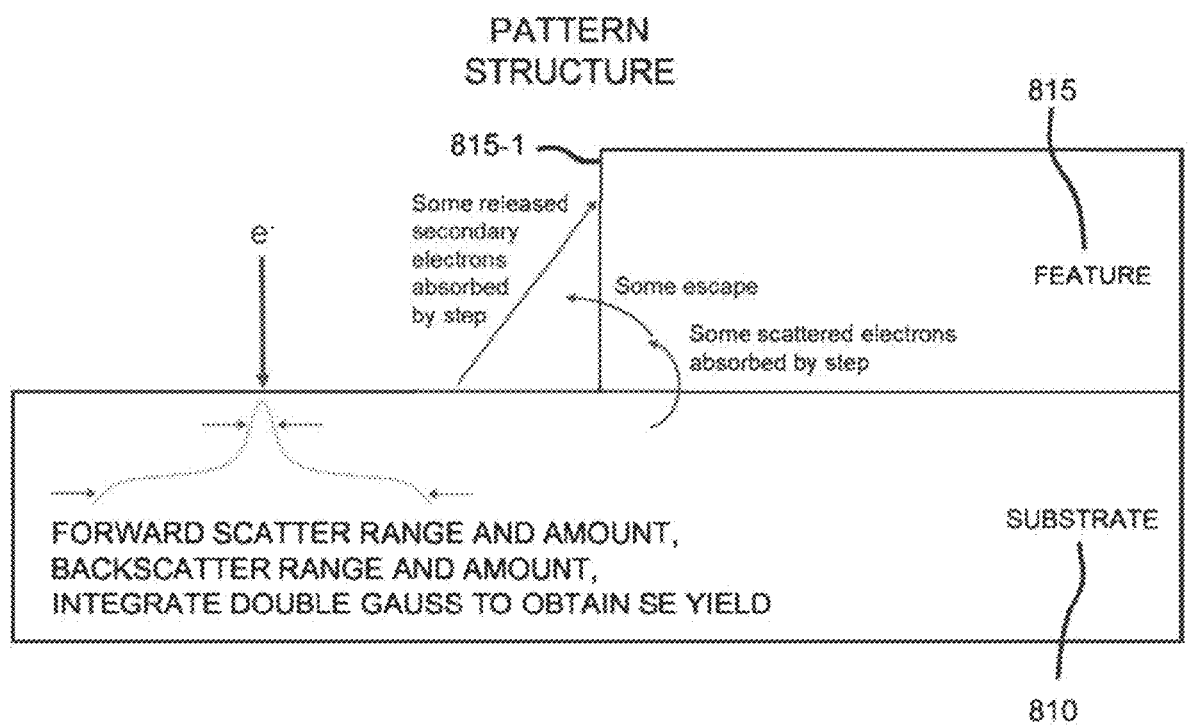
FIG. 10 shows an example of a pattern structure including a feature situated atop a substrate with varying numbers of electrons escaping from the pattern structure depending on where the electron beam impinges on the pattern structure.

SEMs detect topography because of the different number of secondary electrons that escape when the beam is in the space between features compared to when the beam is on top of the feature. FIG. 10 shows that secondary electrons have trouble escaping from a space (especially if it is small), making spaces appear relatively dark. When an electron beam is focused to a spot in a space between lines, scattered electrons interact with feature 815 which absorbs some of the escaping secondary electrons. The detected secondary electron signal is reduced as the beam approaches the feature edge within the space.

The absorption by the step (i.e. feature 815) can be modeled to produce a prediction of the shape of the linescan in the space region. If a large feature has a left edge 815-1 at x=0, with the feature 815 to the right (positive x), the detected secondary electron signal as a function of position (SE(x)) will be given by EQUATION 6 below:

$$\text{For } x < 0, \; \frac{SE(x)}{SE(-\infty)} = 1 - \alpha_f e^{x/\sigma_f} - \alpha_b e^{x/\sigma_b} \quad \text{EQUATION 6}$$

where $\alpha_f$ is the fraction of forward scatter secondary electrons absorbed by the step and $\alpha_b$ is the fraction of backscatter secondary electrons absorbed by the step.

However, when the beam is on top of feature 815, the interaction of the scattered electrons with the feature is very different, as accounted for in EQUATION 7 below. As illustrated in FIG. 8, two phenomena occur as when the beam is closer to the edge compared to further away. First, secondary electrons from both forward and backscattered electrons can more easily escape out of the edge 815-1. This causes the edge bloom already discussed above. To account for this effect, a positive term is added to account for the enhanced escape of forward-scattered secondary electrons where $\sigma_e$ is very similar to the forward scatter range of the step material. Additionally, the interaction volume itself decreases when the beam is near the edge 815-1, so that there are fewer secondary electrons being generated. Thus, the term where $\sigma_v < \sigma_e$ is subtracted to give EQUATION 7 below which is the linescan expression for the top of the large feature 815:

$$\text{For } x > 0, \frac{SE(x)}{SE(\infty)} = 1 + \alpha_e e^{-x/\sigma_e} - \alpha_v e^{-x/\sigma_v} \quad \text{EQUATION 7}$$

Figure 11:
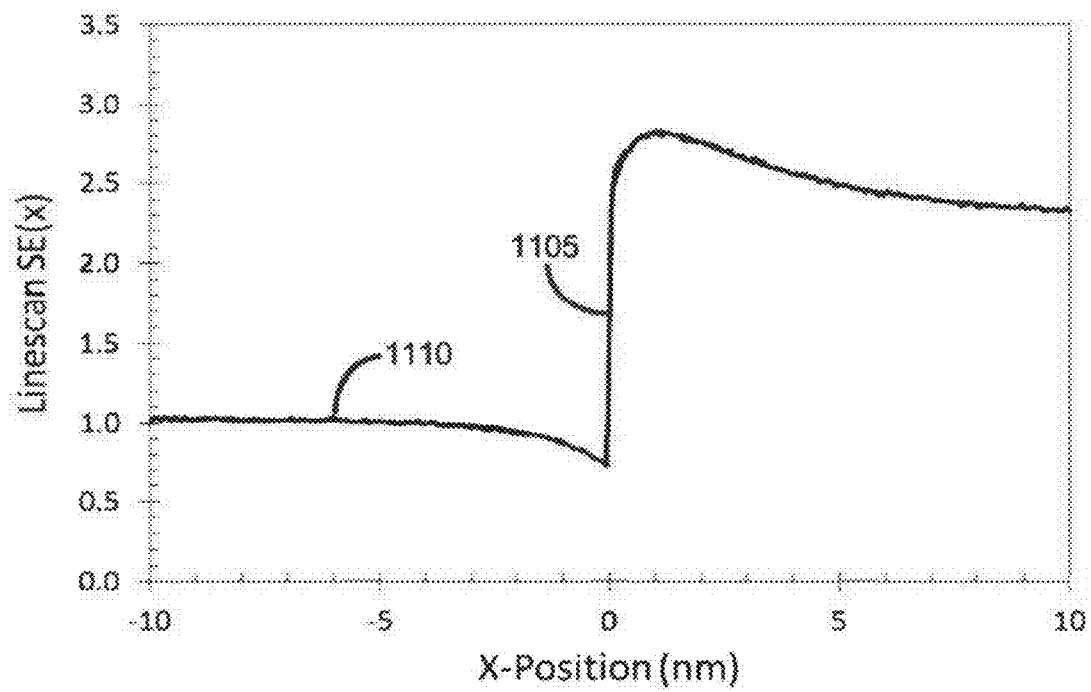
FIG. 11 shows a predicted linescan of a resist step on a pattern structure such as a silicon wafer.

FIG. 11 shows an example of the result for this model. More specifically, FIG. 11 shows a predicted linescan of a left-facing resist step 815 (large feature with left edge 815-1 at x=0) on a substrate such as a silicon wafer. The calibrated model 1105 is superimposed on the rigorous Monte Carlo simulation results 1110. The calibrated model 1105 agrees so closely with the Monte Carlo simulation results 1110 that the two curves appear together almost as one line.

The above discussion involves modelling an isolated left-facing edge 815-1. Adapting the model to include a right-facing edge involves translating and reversing the edge and adding the resulting secondaries (i.e., secondary electrons). Some complications arise if the two edges are close enough to interact, resulting in additional terms. Additionally, the impact of non-vertical sidewalls and rounded corners at the top and bottom of the feature edge may be included in the model (FIG. 12).

Figure 12:
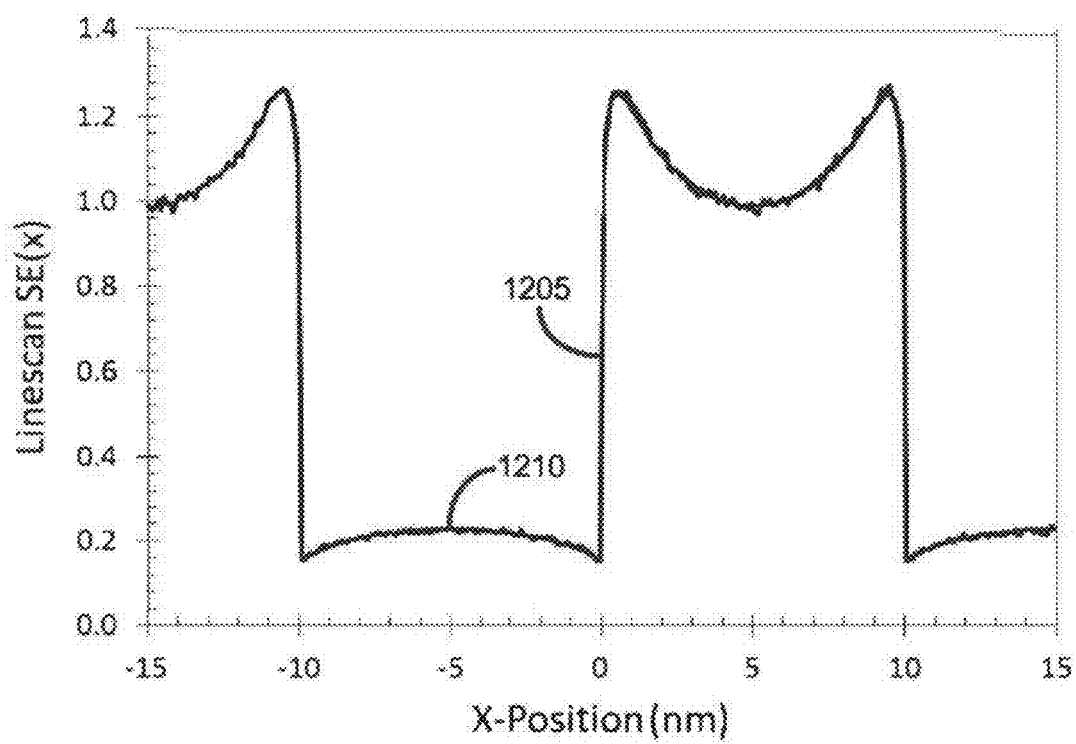
FIG. 12 shows another representative predicted linescan of a pattern of resist lines and spaces on a silicon wafer.

FIG. 12 shows a representative predicted linescan of a pattern of resist lines and spaces on a silicon wafer. The calibrated model 1205 is superimposed on the rigorous Monte Carlo simulation results 1210. Again, the calibrated model 1205 agrees so closely with the Monte Carlo simulation results 1110 that the two curves appear together almost as one line. A final model (ALM) includes 15 parameters that depend on the properties of the materials of the wafer and feature, and the beam voltage. To validate the model and to calibrate these parameters, rigorous first principle Monte Carlo simulations can be used to generate linescans for different materials and feature geometries. The ALM can then be fit to the Monte Carlo results, producing best-fit values of the 15 unknown parameters.

6. Inverse Linescan Model

Linescan or image models, such as the analytical linescan model (ALM) discussed above, predict an image or the shape of an image linescan for a particular pattern structure (such as a feature on a wafer). The ALM solves a forward modelling problem wherein the model receives geometry information for the particular feature as input, and provides the predicted shape of a respective SEM linescan of the particular feature as output.

In contrast to ALM, the disclosed edge detection system 700 includes a reverse model that receives as input "measured linescan information" from SEM 701 that describes a particular feature on the wafer. In response to the measured linescan information describing the particular feature, edge detection system 700 employs its reverse model to generate as output "feature geometry information" that describes the feature geometry that would produce the measured linescan. Advantageously, edge detection system 700 has been found to be effective even when the measured linescan information from SEM 701 includes a significant amount of image noise. In one embodiment, the outputted feature geometry information includes at least feature width. In another embodiment, the outputted feature information includes feature width and/or other geometry descriptors relative to the geometry of the particular feature, such as sidewall angle, feature thickness, top corner rounding, or bottom footing. It is noted that a feature disposed on a semiconductor wafer is an example of one particular type of pattern structure to which the disclosed technology applies.

Like many models of imaging systems, the ALM is inherently nonlinear. To address the nonlinear nature of the ALM, edge detection system 700 numerically inverts the ALM or a similar forward model and fits the resulting inverse linescan model to a measured linescan to detect feature edges (e.g. to estimate the feature geometry on the wafer). The disclosed edge detection/system apparatus and edge detection process include the ability to detect and measure feature roughness. The disclosed apparatus and methodology may apply as well to other applications in general CD metrology of 1D or 2D features, such as the precise measurement of feature width (CD) and edge position or placement.

It is first noted that the ALM (and similar models as well) has two types of input parameters, namely material-dependent parameters and geometry parameters. Material-dependent parameters include parameters such as forward and backscatter distances, while geometry parameters include parameters such as feature width and pitch. In one embodiment, for a repeated edge detection application, the material parameters will be fixed and only the geometry parameters will vary. In the simplest case (that is, for simple edge detection), it is assumed that only the edge positions for the feature are changing, such that sidewall angle, corner rounding, etc., are assumed to be constant. Thus, the use of a linescan model for edge detection in edge detection system 700 involves two steps: 1) calibrating the parameters that are assumed to be constant across the entire image, and then 2) finding the feature edge positions that provide a best fit of the measured linescan to the linescan model for each measurement.

In one embodiment, in the first step, calibration is accomplished by comparing the linescan model to rigorous Monte Carlo simulations. The goal in this step is to find material parameters over the needed range of applications, and to ensure the fitting is adequate for the needed range of feature geometries. When finished, this calibrated linescan model can serve as the starting point for the generation of an inverse linescan model. The Inverse Linescan Model (ILM) should be calibrated to the specific SEM images that are to be measured. Since image grayscale values are only proportional to secondary electron signals, at the very least a mapping to grayscale values is required. In real-world applications, material properties in the experimental measurement will not be identical to those assumed in the Monte Carlo simulations such that some calibration of those parameters will also be required.

7. Calibration of the Inverse Linescan Model

Before using the ILM for edge detection, the ILM is first calibrated. Some parameters of the model (such as material-dependent parameters) are assumed to be constant for the entire image. However, geometry parameters, such as the positions of the edges, feature width and pitch, are assumed to vary for every linescan. The goal of ILM calibration is to determine the parameters that are constant for the whole image, regardless of the exact positions of the feature edges. It is a further goal of ILM calibration to accurately determine these parameters in the presence of image noise. These goals are accomplished by averaging along an axis of symmetry for the feature being measured, thus averaging out both the image noise and the actual feature roughness.

By averaging the linescan along an axis of symmetry (such as the direction parallel to a long line or space feature), information about the actual edge positions is lost, but information about the material parameters of the linescan model remain. Further, noise in the image is mostly averaged out in this way. Calibrating the ILM to the average linescan produces a set of material parameters (or any parameters assumed constant throughout the image) specific to this image.

Many features to be measured exhibit an axis of symmetry appropriate for ILM calibration. For example, a vertical edge has a vertical axis of symmetry. Averaging all pixels in a vertical column of pixels from the image will average away all vertical variation, leaving only horizontal information, in a direction perpendicular to the edge of the feature. The result of this averaging is a one-dimensional linescan called the average linescan. Likewise, a nominally circular contact hole or pillar is ideally radially symmetric. Averaging through polar angle about the center of the feature will produce an average linescan that removes noise and roughness from the image. An elliptical hole shape can also be so averaged by compressing or expanding the pixel size in one direction in proportion to the ratio of major to minor axes of the ellipse. Other axes of symmetry exist for other features as well.

One measured image (for example, one SEM image) may contain one or more features in the image. For example, FIG. 1A shows multiple vertical line features and multiple vertical space features. FIG. 1B shows multiple contact holes. For such a case, each feature can be separately averaged along an axis of symmetry to form an average linescan for that feature. For the example of FIG. 1A, the SEM image can be partitioned into vertical stripes, each stripe containing only one line feature, where the stripe extends horizontally from approximately the center of one space to approximately the center of the next space. For the example of FIG. 1B, the image can be partitioned into separate rectangular regions, each containing exactly one contact hole with the center of the contact hole approximately coinciding with the center of the rectangular region. The averaged linescan for that contact hole is then determined from that rectangular region of the image. Alternately, each of the averaged linescans from each feature in an image can themselves be averaged together to form a single averaged linescan applicable to the entire image.

For a repeated edge detection application (such as the detection of all the edges on a single SEM image), the material parameters will be fixed and only the geometry parameters will vary. In the simplest case (that is, for simple edge detection), one can assume that only the edge positions for the feature are changing, so that feature thickness, sidewall angle, corner rounding, etc., are assumed constant. Thus, the use of the ILM for edge detection will involve two steps: calibrating one time for the parameters that are assumed to be constant (i.e., material and fixed geometry properties) using the average linescan, and then finding the feature edge positions that provide a best fit of the measured linescan to the linescan model for each linescan. Optionally, calibration is first accomplished by comparison of the linescan model to rigorous Monte Carlo simulations, as has been previously described. The goal of this initial step is to find material parameters over the needed range of applications, and to ensure the model is adequate for the needed range of feature geometries. When finished, this partially calibrated linescan model must still be fully calibrated to the specific SEM images that are to be measured using the average linescan.

Figure 13A:
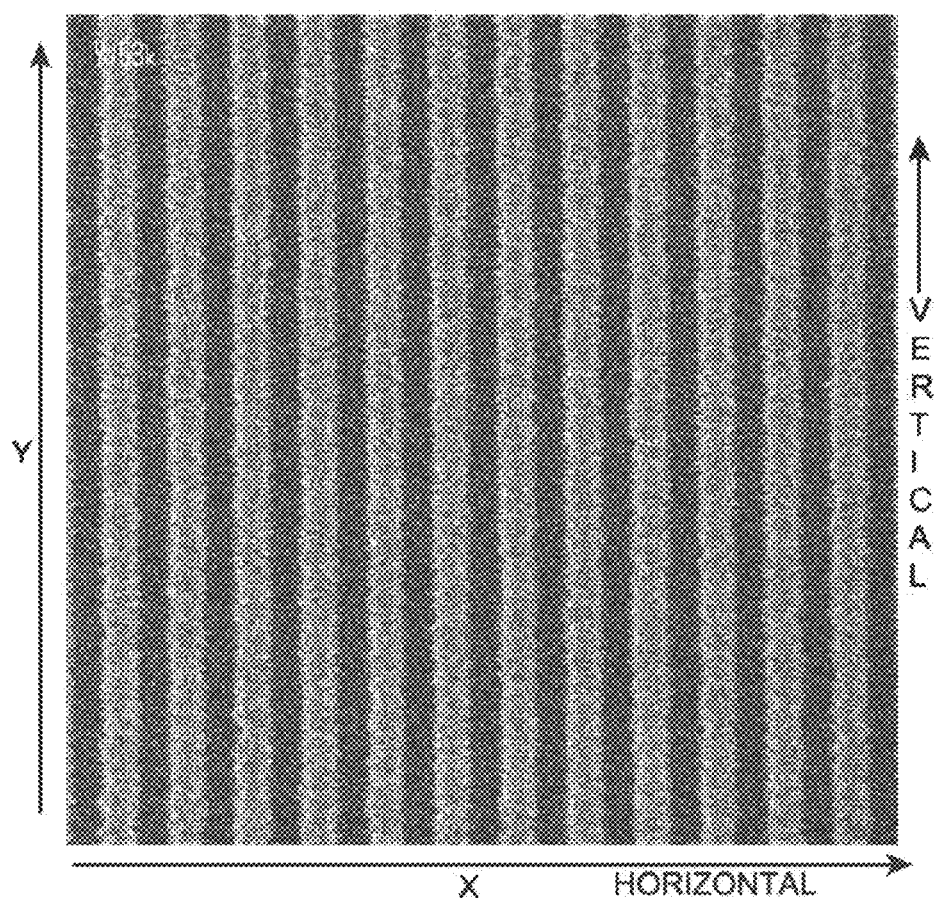
FIG. 13A is an original SEM image of a pattern structure without using the disclosed edge detection apparatus and method.
Figure 13B:
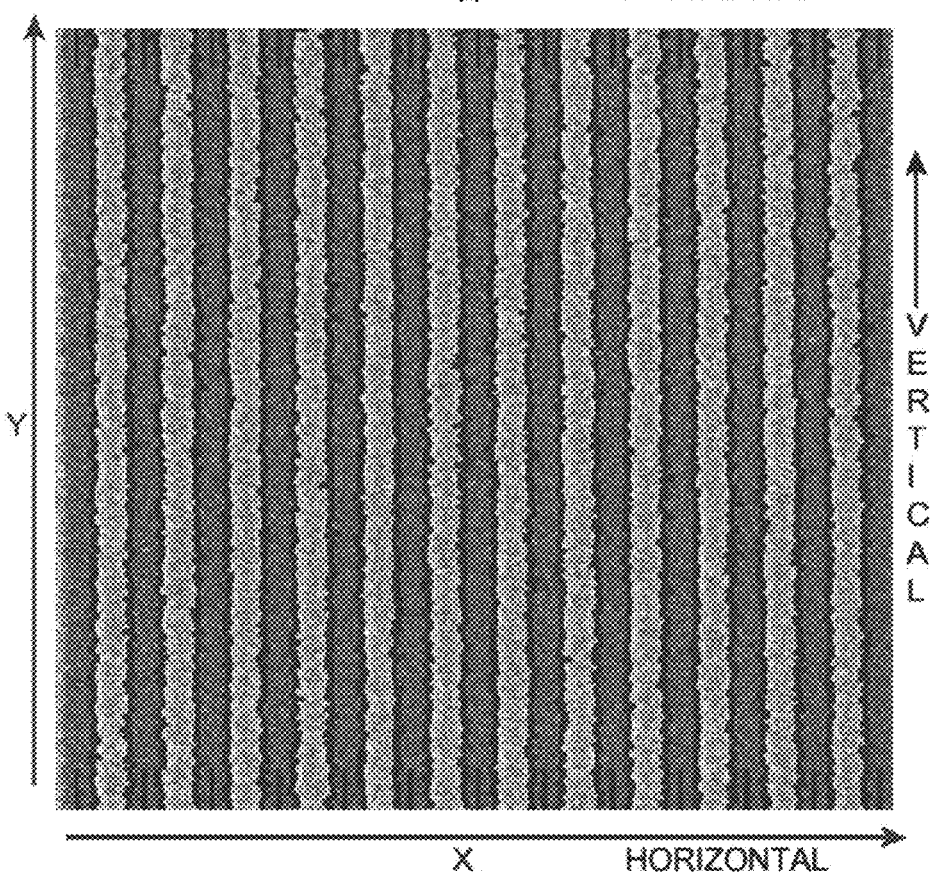
FIG. 13B is the same SEM image as FIG. 13A except using the disclosed edge detection apparatus and method.

Once the ILM has been calibrated to the given SEM image or sets of images, it is then used to detect edges. Due to the non-linear nature of linescan models such as the ALM model, numerical inversion is needed, for example using non-linear least-square regression to find the values of the left and right edge positions that best fit the model to the data. For simpler linescan models, a linear least-squares fit may be possible. Other means of "best fit" are also known in the art. The ILM as an edge detector allows the detection of edges in a high noise environment without the use of filters. FIGS. 13A and 13B demonstrate the reliable detection of edges for a very noisy image without the use of any filtering or image smoothing. More particularly, FIG. 13A is an original SEM image of a pattern structure that exhibits 18 nm lines and spaces before edge detection with an ILM. FIG. 13B is the same image after edge detection using an ILM.

Gaussian filters are common image smoothing filters designed to reduce noise in an image. Other filters such as box filters and median filters are also commonly used for this purpose. To illustrate the impact of image filtering on roughness measurement, TABLE 1 below shows the measured 3σ linewidth roughness (LWR) as a function of Gaussian filter x- and y-width (in pixels). For each case, the ILM edge detection method was used, so that the difference in the resulting LWR is only a function of the image filter parameters. The range is almost a factor of two, showing that many different roughness measurements can be obtained based on the arbitrary choice of filter parameters. In all cases, the ILM edge detection was used. If a conventional threshold edge detection method is used, the range of resulting 3σ roughness values is much greater (TABLE 2). Similar results are obtained if other filter types (box or median, for example) are used.

TABLE 1

The raw (biased) 3σ LWR (nm) as a function of Gaussian filter x- and y-width (in pixels), using ILM edge detection.

|  | y-width = 1 | y-width = 2 | y-width = 3 | y-width = 4 |
|---|---|---|---|---|
| x-width = 1 | 4.99 | 4.67 | 4.03 | 3.82 |
| x-width = 3 | 4.92 | 4.02 | 3.48 | 3.28 |
| x-width = 5 | 4.85 | 3.82 | 3.28 | 3.00 |
| x-width = 7 | 4.79 | 3.69 | 3.13 | 2.84 |
| x-width = 9 | 4.73 | 3.59 | 3.08 | 2.80 |
| x-width = 11 | 4.68 | 3.54 | 3.07 | 2.80 |

TABLE 2

The raw (biased) 3σ LWR (nm) as a function of Gaussian filter x- and y-width (in pixels), using conventional threshold edge detection.

|  | y-width = 1 | y-width = 2 | y-width = 3 | y-width = 4 |
|---|---|---|---|---|
| x-width = 1 |  | 11.17 | 8.52 | 7.28 |
| x-width = 3 | 9.58 | 5.22 | 4.02 | 3.72 |

TABLE 2-continued

The raw (biased) 3σ LWR (nm) as a function of Gaussian filter x- and y-width (in pixels), using conventional threshold edge detection.

|  | y-width = 1 | y-width = 2 | y-width = 3 | y-width = 4 |
| --- | --- | --- | --- | --- |
| x-width = 5 | 8.12 | 4.62 | 3.83 | 3.49 |
| x-width = 7 | 7.44 | 4.50 | 3.78 | 3.42 |
| x-width = 9 | 7.03 | 4.45 | 3.77 | 3.41 |
| x-width = 11 | 6.77 | 4.44 | 3.77 | 3.41 |

Figure 14:
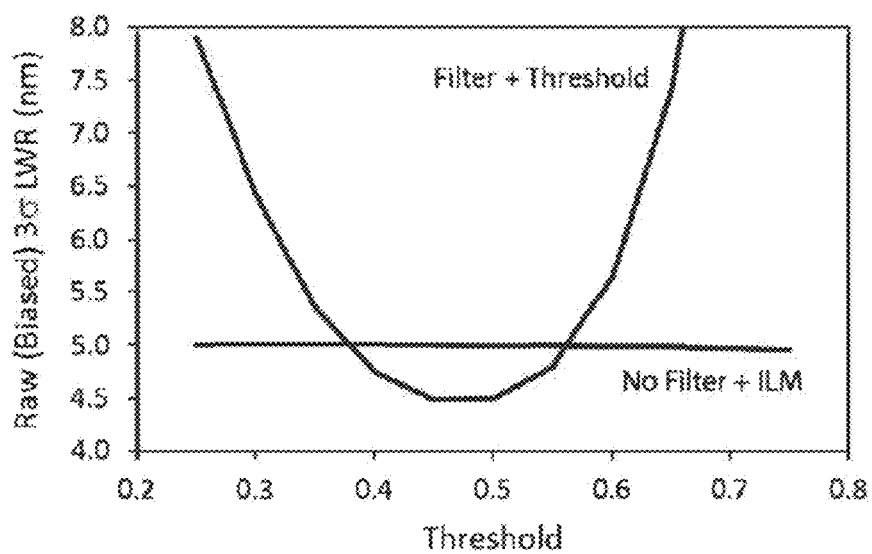
FIG. 14 is a Raw (Biased) linewidth roughness plot vs. threshold settings showing both a prior art result (using a filter with conventional threshold edge detection), and a result using no filter and an inverse linescan model (ILM).

While the arbitrary choice of image filter parameters has a large impact on the measurement of roughness of the pattern structure, the impact of threshold value depends on the specific edge detection method used. For the case of a simple threshold edge detection after image filtering, there is one threshold value that minimizes the 3σ roughness measured, with other values changing the roughness quite dramatically (see FIG. 14). For the case of the ILM, the choice of threshold has almost no impact on the measured LWR (in FIG. 14, the LWR varies from 5.00 nm to 4.95 nm as the threshold is changed from 0.25 to 0.75). Thus, for the conventional prior art method of detecting edges the arbitrary choice of threshold value can cause a large variation in the measured roughness. For the ILM, there are essentially no arbitrary choices that affect the measurement of roughness.

While the disclosed ILM system achieves accurate detection of edges in the presence of high levels of noise, the noise still adds to the measured roughness. For a linescan of a given edge slope, uncertainty in the grayscale values near the line edge translates directly into uncertainty in the edge position. A major difference, though, is that the impact of noise can be measured for the case without filtering. The noise floor of an unfiltered image can be subtracted out from the PSD (power spectral density), producing an unbiased estimate of the PSD (and thus the roughness). For the case of a filtered image, the noise floor is mostly smeared away, so that it cannot be detected, measured, or removed.

Figure 15A:
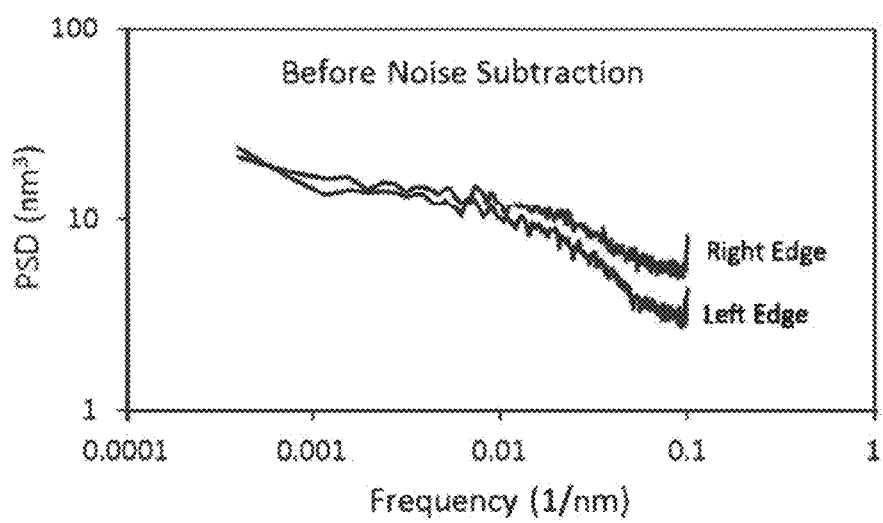
FIG. 15A is a power spectral density (PSD) vs. frequency plot of the right and left edges of a feature shown before noise subtraction.
Figure 15B:
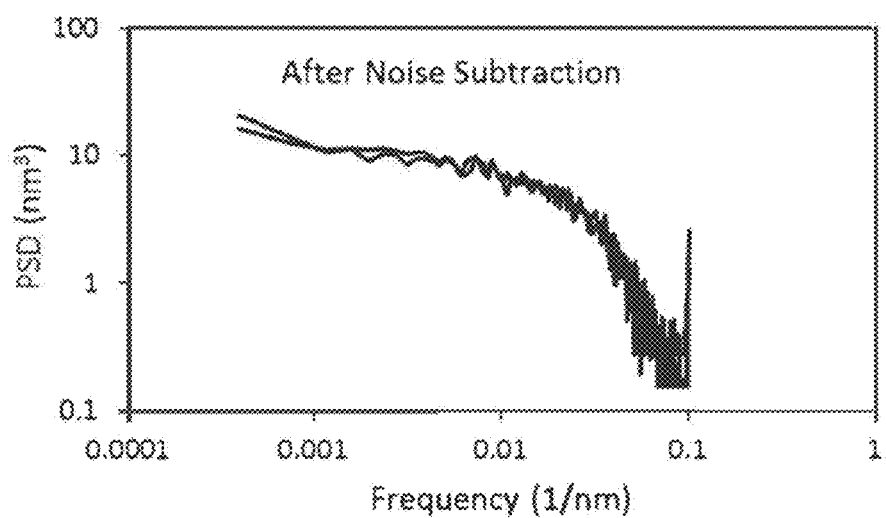
FIG. 15B is a power spectral density (PSD) vs. frequency plot of the right and left edges of a feature shown after noise subtraction.

FIGS. 15A and 15B show LER power spectral densities from many rough features with right and left edges combined separately. More specifically, FIG. 15A shows raw PSDs after edge detection using the disclosed ILM technology, while FIG. 15B shows PSDs after noise subtraction.

Consider the results shown in FIG. 15A, where the line-edge roughness (LER) for the left and right edges of a feature on a pattern structure are compared. The raw PSDs indicate that the two edges behave differently. However, these differences are an artifact of the SEM, caused by a scan-direction asymmetry (such as charging) that makes the right linescan slope lower than the left linescan slope. In fact, there is no difference between right and left edge on the wafer for this sample. By measuring the noise floor for each edge separately, subtracting the noise produces a common left/right LER (FIG. 15B) that is an unbiased estimate of the true PSD.

Once the noise has been subtracted, reliable analysis of the PSD can lead to reliable estimates of the important roughness parameters, such as the zero-frequency PSD(0), the correlation length 4, and the roughness exponent H. The unbiased 3σ roughness can also be obtained. Without removing the noise, extraction of these parameters from the empirical PSD is problematic and prone to systematic errors.

8. Unbiased Measurement of PSD

The biggest impediment to accurate roughness measurement is noise in the CD-SEM image. Among other noise sources, SEM images suffer from shot noise, where the number of electrons detected for a given pixel varies randomly. For the expected Poisson distribution, the variance in the number of electrons detected for a given pixel of the image is equal to the expected number of electrons detected for that pixel. Since the number of detected electrons is proportional to the number of electrons that impinge on the sample location represented by that pixel, relative amount of noise can be reduced by increasing the electron dose that the sample is subjected to. For some types of samples, electron dose can be increased with few consequences. But for other types of samples (such as photoresist), high electron dose leads to sample damage (resist line slimming, for example). Other types of samples, such as biological specimens, can also suffer from electron damage. Thus, to prevent sample damage electron dose is kept as low as possible, where the lowest dose possible is limited by the noise in the resulting image.

FIG. 16 shows portions of three SEM images of nominally the same lithographic features taken at different electron doses. More specifically, FIG. 16 shows portions of SEM images of nominally identical resist features with 2, 8, and 32 frames of integration (respectively, from left to right). Doubling the frames of integration doubles the electron dose per pixel. Since the dose is increased by a factor of 4 in each case, the noise goes down by a factor of 2.

SEM image noise adds to the actual roughness of the patterns on the wafer to produce a measured roughness that is biased higher. Typically, we obtain a biased roughness as given by EQUATION 8A.

$$\sigma_{biased}^2 = \sigma_{unbiased}^2 + \sigma_{noise}^2 \qquad \text{EQUATION 8A}$$

where $\sigma_{biased}$ is the roughness measured directly from the SEM image, $\sigma_{unbiased}$ is the unbiased roughness (that is, the true roughness of the wafer features), and $\sigma_{noise}$ is the random error in detected edge position (or linewidth) due to noise in the SEM imaging and edge detection. EQUATION 8A assumes that the noise is statistically independent of the roughness on the feature being measured. If this is not the case, more complicated noise models can be used, as further described below. Since an unbiased estimate of the feature roughness is desired, the measured roughness can be corrected by subtracting an estimate of the noise term.

Figure 17A:
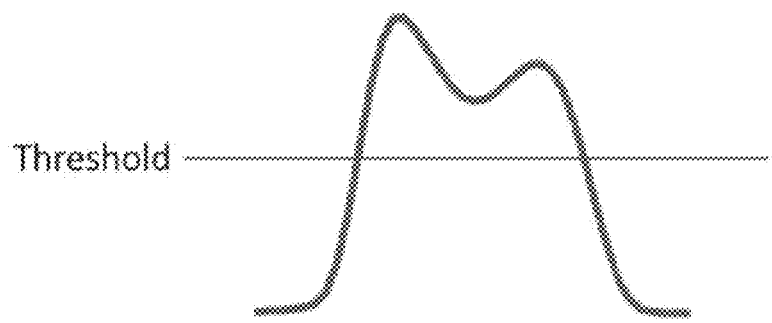
FIG. 17A shows a typical linescan for a line feature on a wafer for a case when there is an extremely large number of electrons so that the pixel noise is negligible.

Pixel noise in the SEM creates edge detection noise depending on the shape of the expected linescan for the feature. For example, FIG. 17A shows a typical linescan (grayscale value versus horizontal position, g(x)) for a line feature on a wafer when there is an extremely large number of electrons so that the pixel noise is negligible. The result is the "expected" linescan, that is, the expectation value of the linescan signal from a statistical perspective. By defining a threshold grayscale level, the edge position can be determined. But noise in the grayscale values results in noise in the detected edge position. For a given grayscale noise $\sigma_{gray}$, the edge position uncertainty $\sigma_{noise}$ will depend on the slope of the linescan at the edge dg/dx. For small levels of noise, $$\sigma_{noise} \sim \frac{\sigma_{gray}}{dg/dx} \qquad (8B)$$

Thus, the level of edge detection noise is a function of the pixel grayscale noise and the slope of the linescan at the feature edge.

Figure 17B:
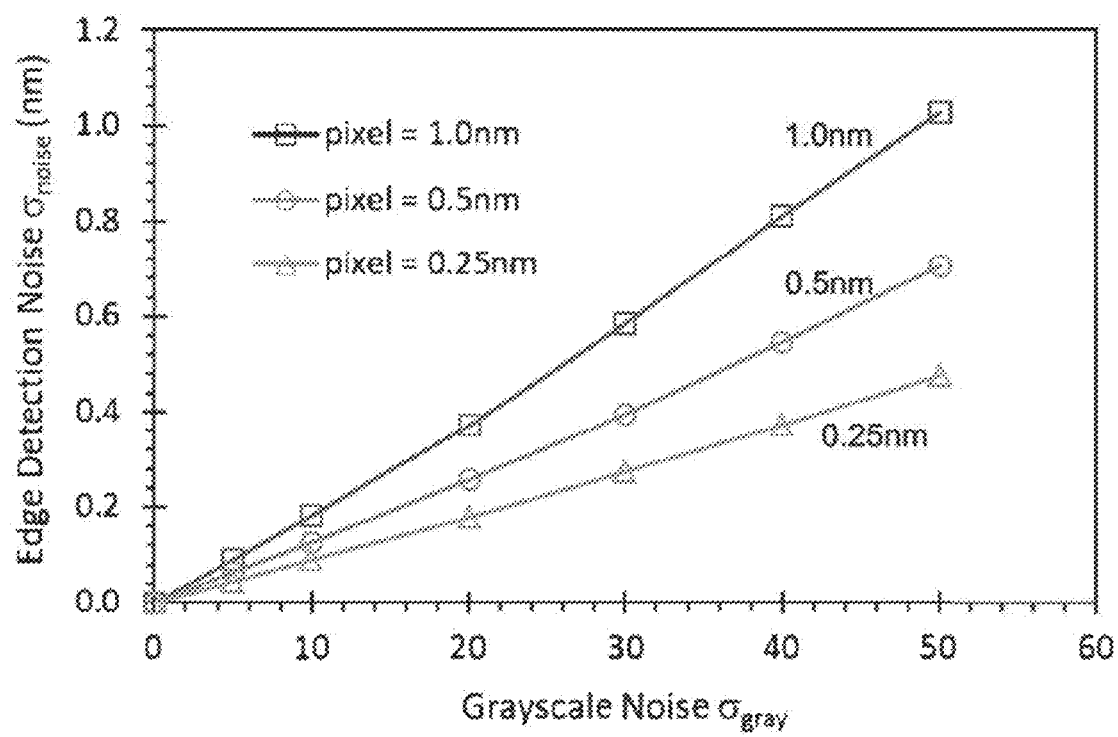
FIG. 17B shows the 1-sigma uncertainty in edge detection position for perfectly smooth features in the presence of grayscale noise, for three different X pixel sizes.

This equation 8B is strictly only valid for small levels of noise and an infinitely small pixel size. To explore the impact of greater amounts of noise and a non-zero pixel size, simulation of SEM images was employed. Perfectly smooth lines and spaces (25 nm width, 50 nm pitch) were used as inputs to the Analytical Linescan Model in order to create synthetic SEM images. Then the resulting grayscale values (which range from 0 to 255) of each pixel were treated as the mean of a normal distribution with a given standard deviation ($\sigma_{gray}$) and a random grayscale number was assigned to each pixel drawn from this normal distribution. These SEM images were then treated as experimental SEM images and measured using an inverse linescan model to detect the edge positions of each feature. The 1-sigma LER measured from these images is the detected edge position uncertainty due to the grayscale pixel noise. FIG. 17B shows the 1-sigma uncertainty in edge detection position for these perfectly smooth features in the presence of grayscale noise. In this graph, the edge detection noise, for three different X pixel sizes, is plotted as a function of grayscale noise for simulated synthetic SEM images (average of 100 images, each with 20 dense lines/space features of width 25 nm and pitch 50 nm). The edge detection used an inverse linescan model and the resulting line-edge roughness of the features was considered to be the edge detection noise. The result is somewhat nonlinear, with higher levels of pixel noise producing ever greater edge detection noise. Further, smaller X pixel sizes produce lower levels of edge detection noise. In fact, the edge detection variance a $\sigma_{noise}^2$ is directly proportional to the X pixel size for low levels of grayscale noise.

Pixel noise is not the only source of edge detection noise. During operation the electron beam is scanned from left to right using beam steering electronics. Errors in the beam steering can place the beam at an incorrect position, which produces an edge error. Charging of the sample during electron exposure will deflect the beam to an incorrect position. While some of the charging effects will be systematic, there will also be random or pseudo-random components that will appear as random variation in the detected edge position.

While several approaches for estimating the SEM edge position noise and subtracting it out have been proposed in the prior art, these approaches have not proven successful for today's small feature sizes and high levels of SEM image noise. The problem is the lack of edge detection robustness in the presence of high image noise. More particularly, when noise levels are high, edge detection algorithms often fail to find the edge. The solution to this problem is typically to filter the image, smoothing out the high frequency noise. For example, if a Gaussian 7×3 filter is applied to the image, then for each rectangular region of the image 7 pixels wide and 3 pixels tall, the grayscale values for each pixel are multiplied by a Gaussian weight and then averaged together. The result is assigned to the center pixel of the rectangle. Box (mean) filters and median filters can also be used and produce similar results. This smoothing makes edge detection significantly more robust when image noise is high. FIG. 17C shows an example of using a simple threshold edge detection algorithm with image filtering in the right image and without image filtering in the left image. Without image filtering, the edge detection algorithm is mostly detecting the noise in the image and does not reliably find the edge.

Figure 18:
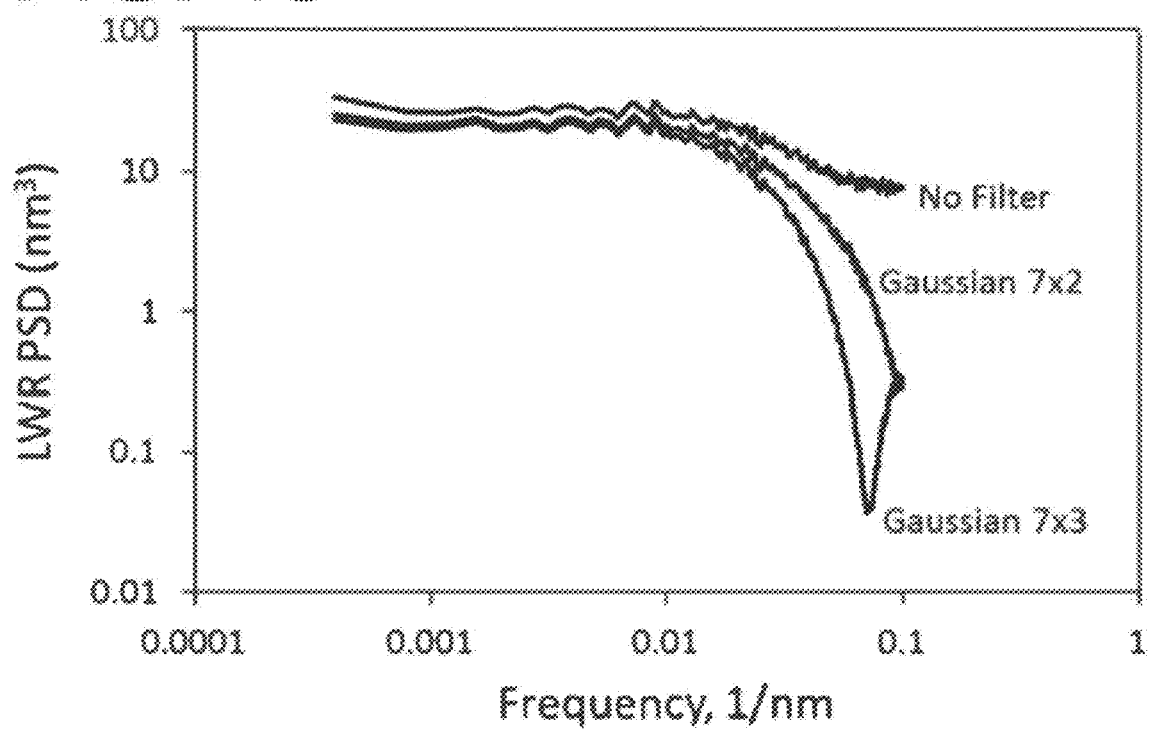
FIG. 18 is a plot of linewidth roughness (LWR) PSD vs. frequency that shows the impact of two different image filters on a collection of 30 images.

The use of image filtering can have a large effect on the resulting PSD and measured roughness. FIG. 18 shows the impact of two different image filters on the PSD obtained from a collection of 30 images, each containing 12 features. All images were measured using an inverse linescan model for edge detection. The power spectral densities were averaged from these 360 rough features with images prepro-cessed using a 7×2 or 7×3 Gaussian filter, or not filtered at all, as labelled in the drawing. As can be appreciated, the high-frequency region is greatly affected by filtering. But even the low frequency region of the PSD shows a noticeable change when using a smoothing filter. Filtering in the y-direction smoothes out high-frequency roughness. Filtering in the x-direction lowers the slope of the linescan, which can affect measured low-frequency roughness. As will be described next, the use of image filtering makes measurement and subtraction of image noise impossible.

Figure 19:
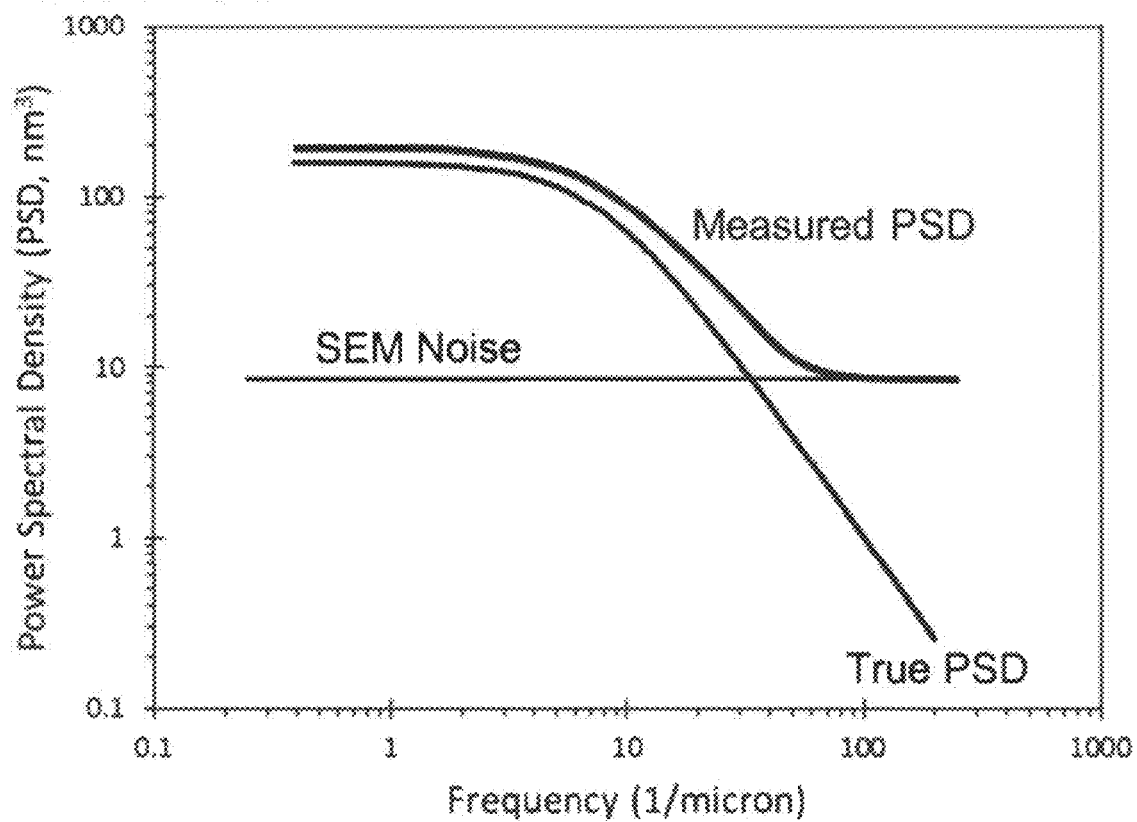
FIG. 19 is a power spectral density plot vs. frequency that shows the noise subtraction process of the disclosed edge detection apparatus and method.

If edge detection without image filtering can be accomplished, noise measurement and subtraction can be achieved by contrasting the PSD behavior of the noise with the PSD behavior of the actual wafer features. We expect resist features (as well as after-etch features) to have a PSD behavior as shown in FIG. 19 as the "True PSD" (and also shown earlier in FIG. 4). Correlations along the length of the feature edge reduce high-frequency roughness so that the roughness becomes very small over very short length scales. SEM image noise, on the other hand, can often be assumed to be white noise, so that the noise PSD is flat over all frequencies. Other models of the SEM image noise are also possible, for example using linescan-to-linescan correlation to describe the noise, as further described below. Thus, at a high enough frequency the measured PSD will be dominated by image noise and not actual feature roughness (the so-called "noise floor"). Given the grid size along the length of the line (Δy), SEM edge detection white noise affects the PSD according to EQUATION 9 below:

$$PSD_{biased}(f) = PSD_{ubiased}(f) + \sigma_{noise}^2 \Delta y \qquad \text{EQUATION 9}$$

Thus, measurement of the high-frequency PSD (in the absence of any image filtering) provides a measurement of the SEM edge detection noise. FIG. 19 illustrates this approach for the case of a white SEM noise model. Clearly, this approach to noise subtraction cannot be used on PSDs coming from images that have been filtered, because such filtering removes the high-frequency noise floor (see FIG. 18).

EQUATION 9 assumes a white noise model, where the noise found in any pixel of the image is independent of the noise found in any other pixel. This may not always be the case. For example, the noise in each pixel may be correlated somewhat with its nearest neighbors, affecting $\sigma_{gray}$ in equation 8B. Alternately, the grayscale slope in equation 8B may be correlated from one row of pixels to the next, possibly caused by the interaction volume of the electrons as shown in FIG. 8. If a correlation model is assumed or measured, a suitable noise expression for the PSD can be used to replace EQUATION 9, as further described below.

FIG. 19 shows one embodiment of the noise subtraction process of the disclosed edge detection apparatus and method. In the disclosed edge detection method, the method first detects the positions of the edges using the ILM without the use of any image filtering (for example, using an inverse linescan method). From these detected edges a biased PSD is obtained, which is the sum of the actual wafer roughness PSD and the SEM noise PSD. Using a model for the SEM image noise (such as a constant white noise PSD), the amount of noise is determined by measuring the noise floor in the high-frequency portion of the measured PSD. The true (unbiased) PSD is obtained by subtracting the noise level from the as-measured (biased) PSD. The key to using the above approach of noise subtraction for obtaining an unbiased PSD (and thus unbiased estimates of the parameters $\sigma_{LWR}(\infty)$, PSD(0), $\xi$) and is to robustly detect edges without the use of image filtering. This can be accomplished using an inverse linescan model. An inverse linescan model was used to generate the no-filter PSD data shown in FIG. 18.

An example method for subtracting white noise will now be described. First, edges are detected from a SEM image without using any image filtering (for example, using an inverse linescan model). The power spectral densities of one or more edges are calculated in the usual way. Since the PSD of a single edge is quite noisy, it is extremely valuable to measure many edges and average the PSDs. Often hundreds or thousands of edges are measured and their PSDs averaged. This averaged PSD is called the biased PSD. From the average biased PSD, the highest frequencies are inspected to determine if a flat noise floor is observed. Such a noise floor is observed whenever the y pixel size is sufficiently smaller than the correlation length of the true roughness. Typically, a y-pixel size that is 20% of the correlation length or smaller is adequate. If a noise floor is observed, the average PSD value in the flat region is calculated. This is the noise floor. This number is then subtracted from the biased PSD at every frequency to produce the unbiased PSD. The biased PSD is our best estimate of the true PSD of the roughness on the wafer.

Other SEM errors can influence the measurement of roughness PSD as well. For example, SEM field distortion can artificially increase the low-frequency PSD for LER and PPR, though it has little impact on LWR. Background intensity variation in the SEM can also cause an increase in the measured low-frequency PSD, including LWR as well as LER and PPR. If these variations can be measured, they can potentially be subtracted out, producing the best possible unbiased estimate of the PSD and its parameters. By averaging the results of many SEM images where the only common aspect of the measurements is the SEM used, determination of SEM image distortion and background intensity variation can be made.

Further, the SEM noise itself can vary across the SEM image field. Thus, unbiasing of the roughness measurement can also include the detection of noise that varies across the SEM image field and unbiasing different points in the SEM image field according to its measured noise bias at those points in the SEM image field.

9. Sensitivity to Metrology Tool Settings

Not all noise in measured PSDs is white noise. White noise occurs when the measurement noise of the edge position from each linescan is completely independent of all other linescans (and in particular, its nearest neighbors). White noise occurs in the absence of correlations that connect the errors in one linescan to the errors in the neighboring linescans. Any small correlations in edge errors along the length of the line would cause "pink noise", a noise signature that is not perfectly flat over the entire frequency region.

The settings of the SEM metrology tool can impact the measured roughness of a feature in a pattern structure. These settings include the magnification and pixel size of SEM 701. These two parameters can be changed independently by changing the number of pixels in the image (from 512×512 to 2048×2048, for example). Additionally, the number of frames of integration (the electron dose) when capturing an SEM image can be adjusted. To study the impact of this setting, the number of frames of integration can be varied from 2 to 32, representing a 16× variation in electron dose, for example.

Figure 20:
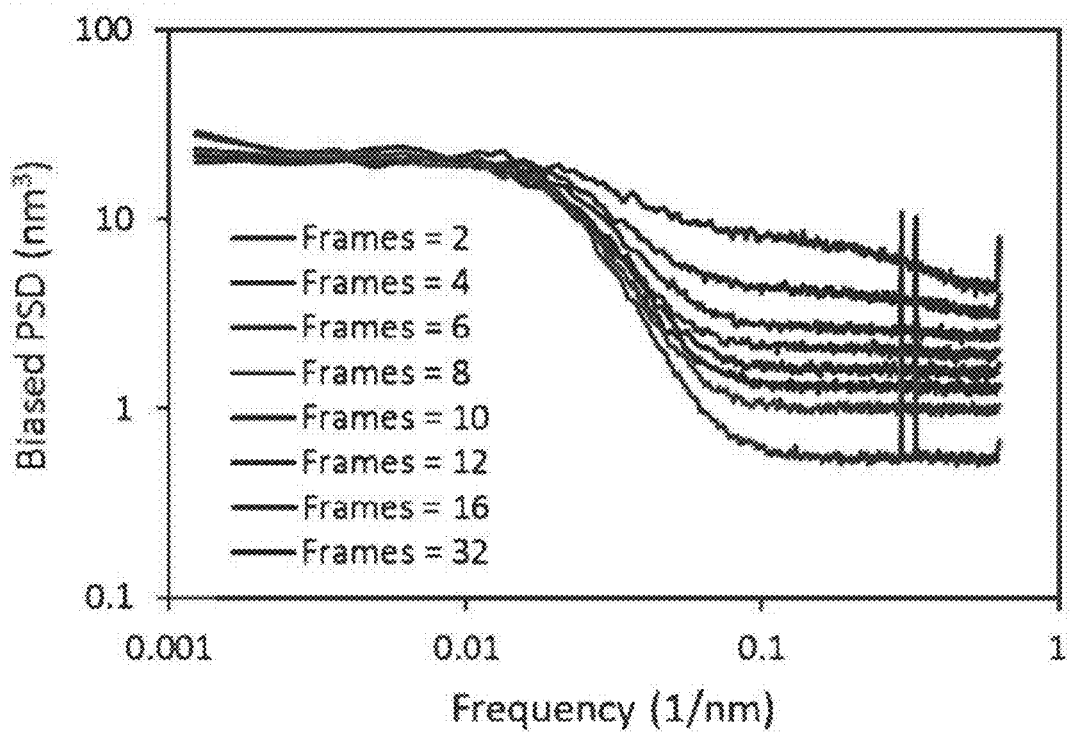
FIG. 20 shows PSDs of a particular resist feature type on a given wafer, measured with different frames of integration in the SEM.

Total electron dose is directly proportional to the number of frames of integration. Thus, shot noise and its impact on edge detection noise is expected to be proportional to the square root of the number of frames of integration. FIG. 20 shows PSDs of a particular resist feature type on a given wafer, measured with different numbers of frames of integration. In this case, the PSDs correspond to 18 nm resist lines and spaces where only the number of frames of integration was varied. SEM conditions used were 500 eV, 49 images per condition, 21 features per image, pixel size=0.8 nm square, and image size=1024×1024 pixels. The cases of 8 or more frames of integration produce PSDs that exhibit a fairly flat high-frequency noise region. For 2 and 4 frames of integration the noise region is noticeably sloped. Thus, the assumption of white SEM noise is only approximately true, and becomes a more accurate assumption as the number of frames of integration increases and noise level decreases. This observation has been borne out in other circumstances: High noise cases are more likely to exhibit non-flat noise floors.

Figure 21:
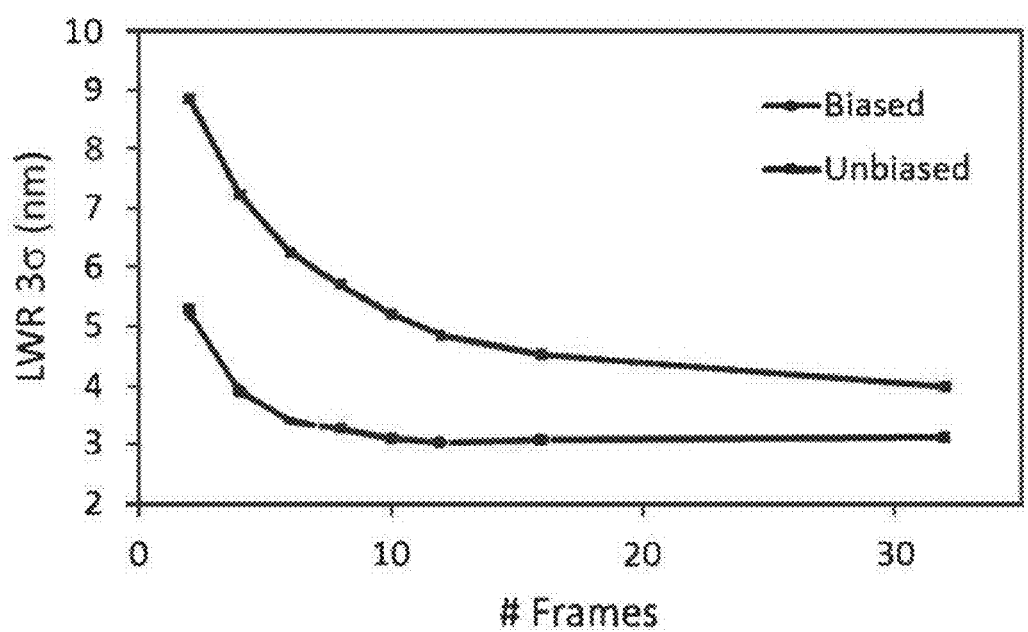
FIG. 21 shows the biased and unbiased values of the $3\sigma$ linewidth roughness (LWR) measured as a function of the number of frames of integration in the SEM.

FIG. 21 shows the biased and unbiased values of the 3σ linewidth roughness measured as a function of the number of frames of integration. All conditions were the same as described in FIG. 20, and error bars represent 95% confidence interval estimates. The biased roughness varies from 8.83 nm at two frames of integration to 5.68 nm at 8 frames and 3.98 nm at 32 frames. The unbiased roughness, on the other hand, is fairly stable after 6 frames of integration, varying from 5.25 nm at two frames of integration to 3.25 nm at 8 frames and 3.11 nm at 32 frames. While the biased roughness is 43% higher at 8 frames compared to 32, the unbiased roughness is only 4% higher at 8 frames compared to 32. Since the assumption of white SEM noise is not very accurate at 2 and 4 frames of integration, the noise subtraction of the unbiased measurement using a white noise model is not completely successful at these very low frames of integration. A correlated noise model can produce better noise subtraction especially for the low frames of integration, as is more fully described below. While the results shown are for LWR, similar results are obtained for the measurement of line edge roughness (LER) and pattern placement roughness (PPR).

One possible cause of correlations in edge noise would be correlations in the pixel noise. To test this possibility, isolated edges were measured in the CD-SEM. The edge allows the SEM to perform its imaging functions in a typical way, but at a distance left or right from the edge the field is flat and featureless. In this region the only variation in pixel grayscale values comes from image noise. The correlation coefficient between neighboring pixels can then be calculated. Performing these calculations, the average correlation between neighboring pixels in the x-direction was 0.12, but the average correlation in the y-direction was only 0.01, essentially zero. These correlations coefficients were determined for edges measured at 2 to 32 frames of integration. There was little variation in the pixel-to-pixel correlation as a function of the number of frames of integration. Thus, correlated pixel noise is not responsible for the pink noise observed at low frames of integration. However, it is possible that the linescan slope in equation 8B is responsible for the noise correlations.

A possible cause of noise correlations in the linescan slope comes from the interaction of the beam with the sample. Electrons striking the sample undergo a number of processes that depend on the energy of the electron and the material properties of the sample. Electrons scatter off the atoms of the sample material, release energy, change direction, and often generate a cascade of secondary electrons by ionizing the sample atoms. Occasionally electrons ricochet backwards off the atom nucleus and exit out of the sample (called backscatter electrons). Some of the lower energy secondary electrons can also escape out of the sample (frequently through the edges of a feature, see FIGS. 8A and 8B). The way in which a SEM forms an image is by detecting the number of secondary electrons and/or backscatter electrons that escape the sample for each beam position.

When forming an image using an SEM, a small spot of electrons dwells at a specific point on the sample (i.e., a pixel) while the number of escaping secondary electrons is counted by the secondary electron detector. When the spot is a long way from a feature edge, as in FIG. 8A, the number of detected secondary electrons 805 is small (and the pixel is dark). When the spot is near a feature edge, as in FIG. 8B, secondary electrons 805 from the interaction volume readily escape from the feature edge producing a bright pixel.

The interaction volume of the electrons can be one to a few tens of nanometers in diameter, depending on the beam voltage and the sample material properties. This interaction volume means that electrons impinging on one spot on the sample are influenced by the sample shape over a range determined by the interaction volume. Thus, the slope of the linescan at one row of pixels will not be independent of the slope of the linescan at neighboring pixels whenever the interaction volume radius is greater than the y pixel size. This dependency can be the cause of correlations in the noise, with a noise correlation length affected by the electron beam interaction volume.

10. Detecting and Removing Spikes from a Power Spectral Density

Figure 25A:
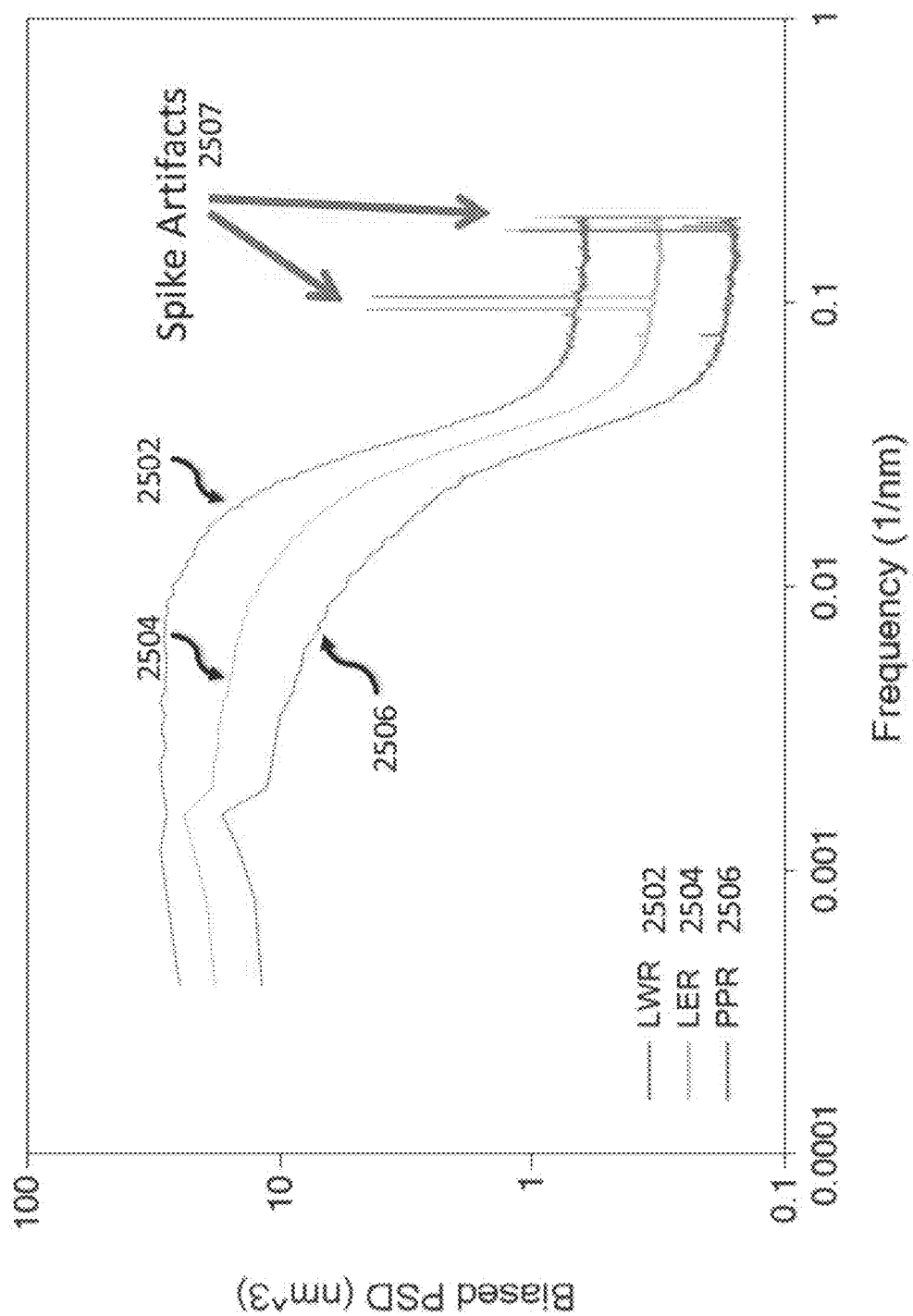
FIG. 25A shows a PSD that includes high-frequency spike artifacts.

In addition to noise interfering with the signal in typical images of rough features, other errors can be present in the images that have a very different frequency behavior as compared to white noise or pink noise, and as compared to the roughness being measured. Some such errors produce large but narrow spikes in a PSD. FIG. 25A shows one example of high frequency "spikes" that intermittently are found in datasets. One cause for such spikes can be electrical interference in the scanning electronics of the imaging tool. If the interference is at a frequency in a range that allows one or more interfering events within a full scan of the image, this interference can result in a slight but regular "jitter" of the scanning beam position. For highly precise scanning, even a sub-nanometer jitter can result in one or more large spikes in the measured PSD. Depending on the mechanism, such interference spikes may be present in the line-edge roughness (LER) and pattern placement roughness (PPR) but not the linewidth roughness (LWR) PSD. Alternately, the interference may cause spikes at the same frequencies in all three PSDs.

For example, electrical interference at a frequency of 50 Hz or 60 Hz can cause noticeable spikes in a measured PSD when the measurement tool captures images at a standard "TV" scan rate or small multiples of this rate. Additionally, electrical interference at normal audio frequencies can cause spikes that are visible at higher PSD frequencies in typical measurement tool images.

The presence of spikes in the PSD can be undesirable for a number of reasons depending on their quantity, their amplitude, and their frequency. For the case of high-frequency spikes as seen in FIG. 25A, the spikes can affect the noise removal process described above, resulting in an overestimation of the amount of white or pink noise in the image.

Figure 26:
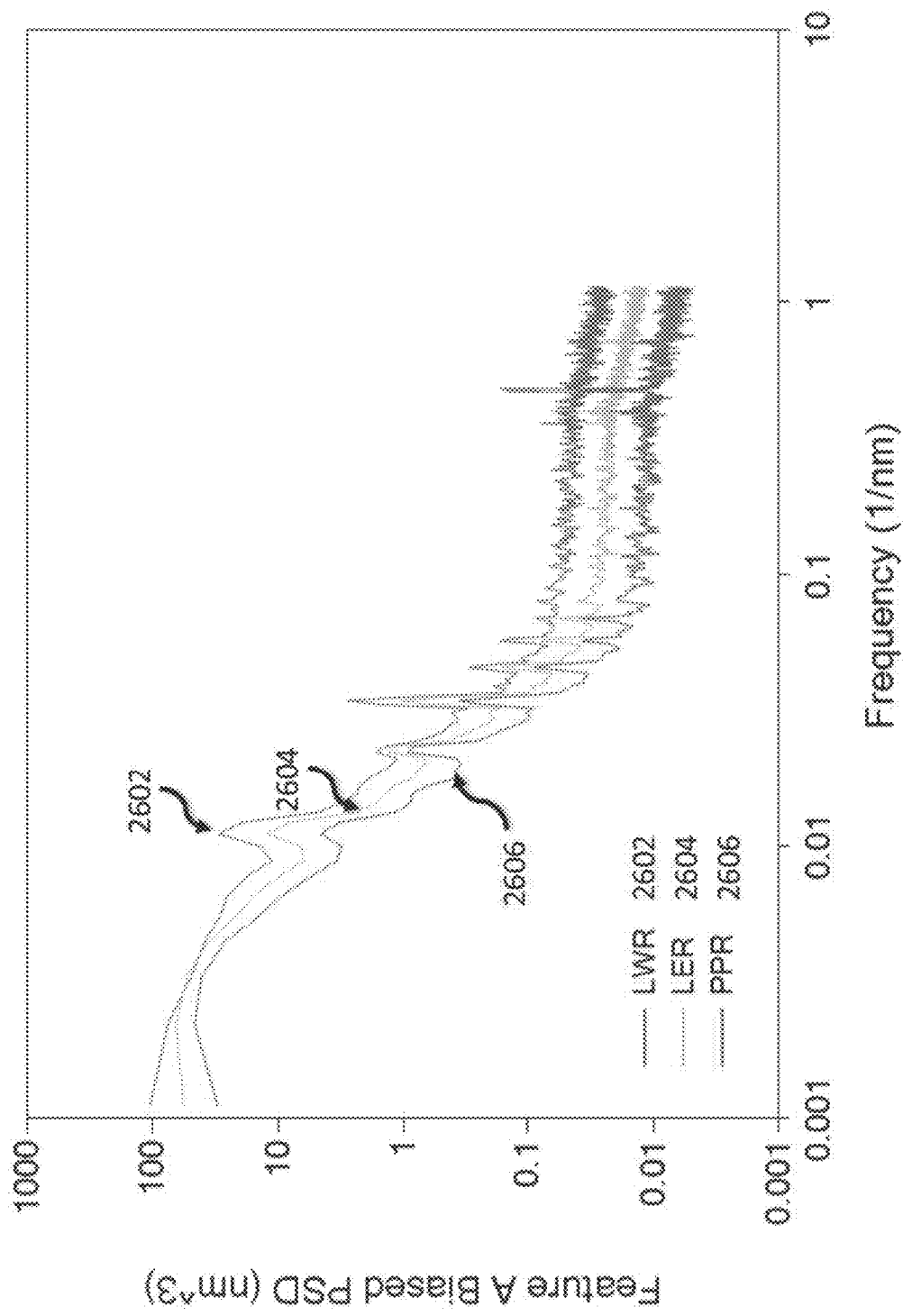
FIG. 26 shows a PSD that includes mid-frequency spike artifacts and harmonics.

PSD spikes can be caused by phenomenon other than electrical interference within the imaging tool. The object being measured may include periodic or semi-periodic structures other than the rough features that are to be measured. For example, a set of vertically oriented rough features of the object may be on top of a periodic set of horizontal features resulting in topography below the rough features that are slightly visible in the image. Such underlying topography can result in a mid-frequency spike to the PSD (with higher-frequency harmonics possible as well). FIG. 26 shows an example of this phenomenon.

Another phenomenon that can give rise to spikes in the PSD would be the presence of grains of a small size range within the material of the features on the object to be measured. Grains of similar size packed tightly together can produce a nearly periodic appearance that results in a spike in the measured PSD.

Roughness measurements can also be performed on images taken of photomask features, where said photomasks are used in a lithography process. Photomasks are typically fabricated using a direct-write lithography tool with limitations such as a non-zero address grid and rectangular shots to make up the image. For some features, such as a line oriented at 45 degrees to the direction of the writing grid of the tool used to print the photomask, the result will be small, regularly spaced jogs along the edge of the photomask feature. These jogs will produce a spike (or a main spike plus harmonic spikes) in the PSD of the measured photomask roughness.

Figure 27B:
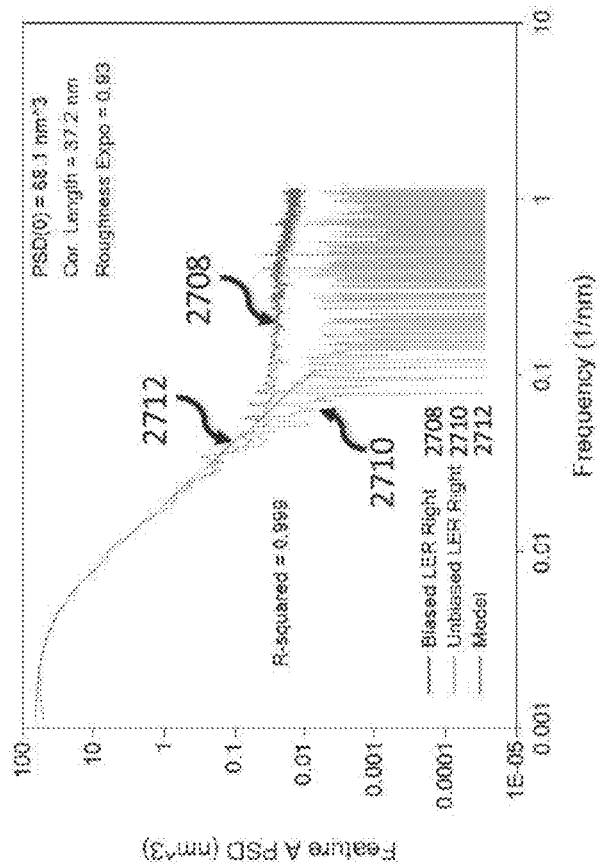
FIG. 27B shows the impact of removing mid-frequency spike artifacts on the modeling and interpreting of the PSD.
Figure 27A:
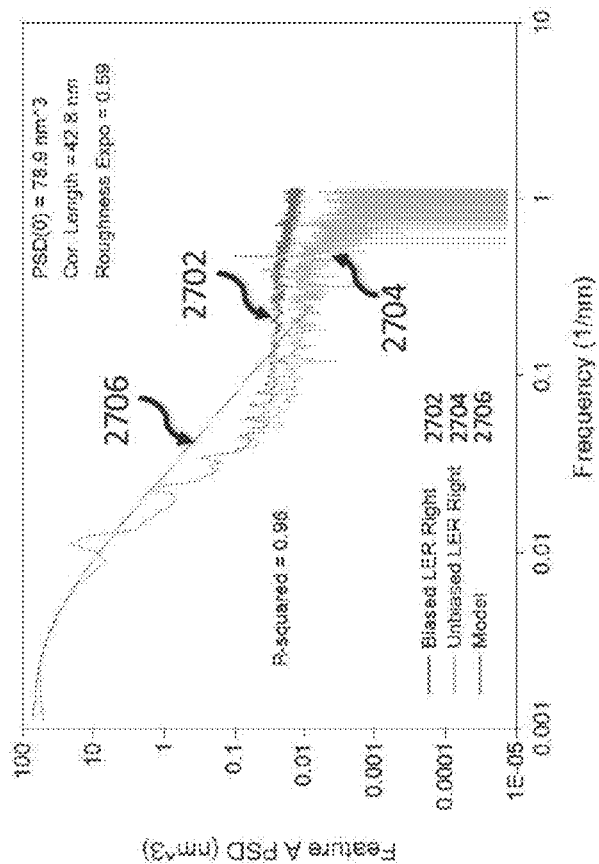
FIG. 27A shows the impact of mid-frequency spike artifacts on the modeling and interpreting of the PSD.

Spikes such as those found in FIG. 26 can be very disadvantageous to the measurement of roughness parameters from the biased or unbiased PSD. FIG. 27A shows how a PSD with spikes can alter the model that is fit to the unbiased PSD, including modeling parameters such as PSD (0), correlation length, and roughness exponent. In contrast, FIG. 27B shows how a PSD with spikes removed can affect the model that is fit to the unbiased PSD, including modeling parameters such as PSD (0), correlation length, and roughness exponent.

For these and other reasons, it is desirable to remove spikes in the PSD when the cause of those spikes is thought to be from a mechanism different from the mechanisms that give rise to the roughness of the features being measured. In other words, it is desirable to separate the PSD artifacts caused by one mechanism (such as spikes caused by electrical interference) from the PSD artifacts caused by other mechanisms (such as the stochastic effects that give rise to roughness). This can be done much like the noise removal described above, by recognizing the different frequency signatures of the different mechanisms.

As mentioned above, white noise (or pink noise) can be separated from the true (unbiased) roughness PSD since the noise frequency signature (flat or near flat at high frequencies) is very different from the frequency signature of the true roughness (a power-law decreasing at high frequencies). Likewise these so-called spikes in the PSD have frequency signatures that are very different from the frequency signature of the feature roughness itself. In particular, a so-called spike has a high amplitude over a very narrow frequency range.

A procedure for detecting and removing spikes will now be described. First, the definition of a "spike" can be established as being a frequency response that rises and falls over a frequency range smaller than a threshold (the "threshold range") and has a height great than a threshold (the "threshold height").

Next, a baseline can be established as being the best estimate of the PSD without the spike. For example, the threshold range for spike detection can be set to three frequency increments in the PSD data (which typically is sampled at a constant frequency increment). Other threshold ranges are also possible. A baseline can be determined by smoothly connecting PSD values separated by the threshold range plus one increment (using a straight line on a linear or logarithmic scale, for example, or by using a model for the expected PSD behavior). This baseline is then subtracted from the actual PSD data within this threshold range to arrive at an estimate of the non-baseline PSD behavior within this frequency range. If the non-baseline PSD behavior rises to a value greater than the threshold height (expressed either in absolute terms or as a multiple of the baseline PSD value), then a spike has been identified. To remove the spike, the calculated baseline behavior can be used to replace the actual PSD values within the threshold range. A search for spikes can cover the entire PSD frequency range if desired.

The threshold range can be chosen in such a way as to only detect (and possibly remove) spikes that occur due to specific types of mechanisms. For example, interference at exactly a single frequency will most likely cause a spike in the PSD that is up to two frequency increments wide (since the spike is unlikely to be at a frequency that exactly coincides with the sampled frequencies of the PSD). A threshold range of two to three frequency increments wide will be effective in detecting such "single frequency" interference events. A wider threshold range will detect other, broader-band interference events.

The threshold height can also be adjusted based on the mechanisms that are desired to be detected. But the minimum threshold height is also a function of the overall noise in the PSD. Since a PSD measures, by definition, the randomness in a random rough sample, PSD measurement is inherently noisey. It is well known that the PSD of a single measured feature has a statistical uncertain of 100% (1-sigma). That is, the statistical uncertainty in any given PSD value at any given frequency is 100% for the measurement of a single feature. For that reason, many features are typically measured and averaged together so that the uncertainty in the PSD can be reduced by one over the square root of the number of features being measured.

But for any given number of features measured and averaged, the PSD will have a statistical uncertainty that is inherent in the sample size. The threshold height for spike detection should be chosen to be significantly higher than the inherent noise level of the PSD. Otherwise, the detection of spikes would be frequently triggered not by physical spikes but rather by noise in the PSD data. Alternately, the threshold height can be chosen to be a multiple of the measured or calculated PSD noise (for example, 5×).

Figure 25B:
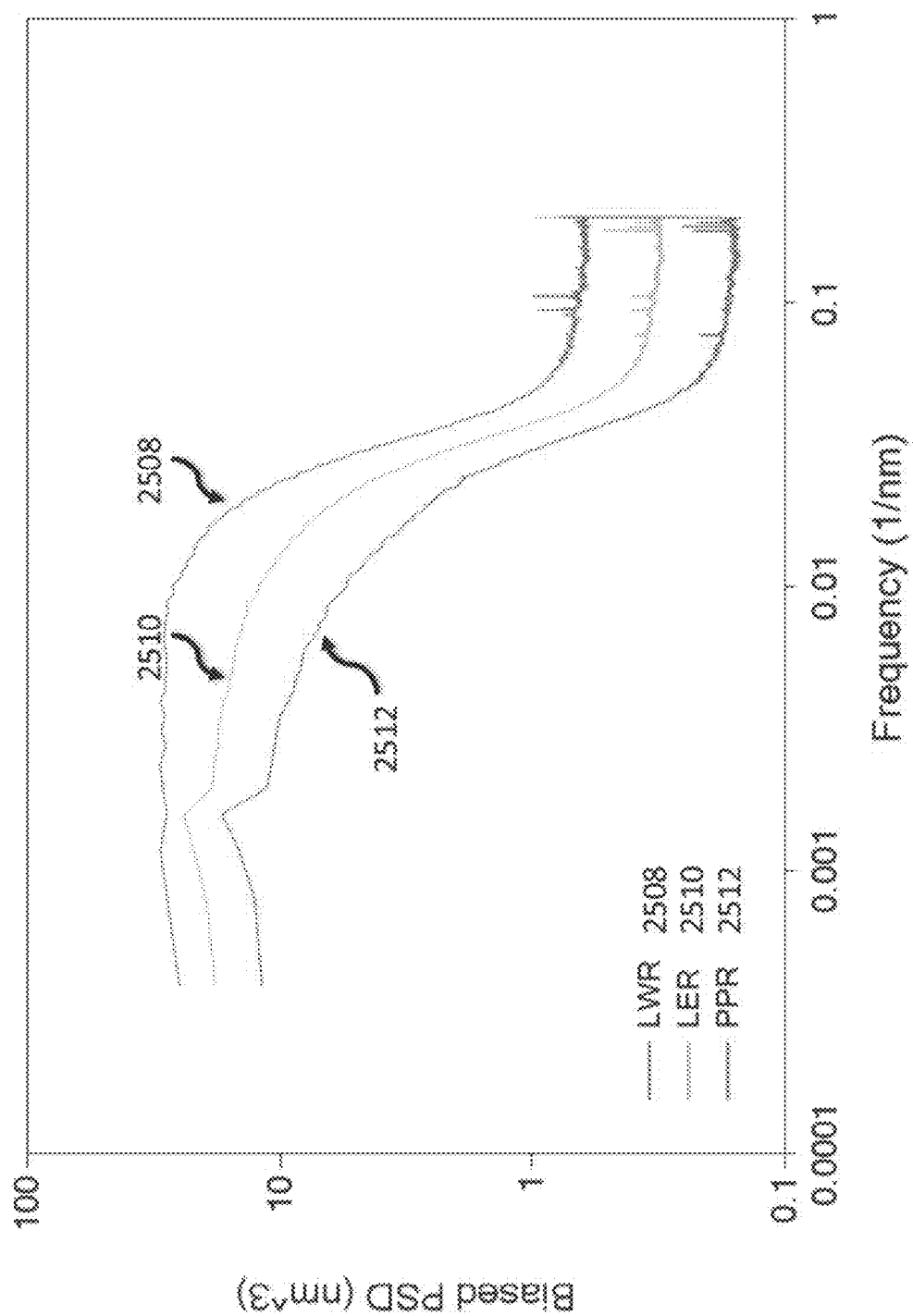
FIG. 25B shows the PSD with spike artifacts removed.

FIG. 25A shows several PSDs (linewidth roughness (LWR PSD 2502), line-edge roughness (LER PSD 2504), and pattern placement roughness PPR PSD 2506) which exhibit several high-frequency spikes (spike artifacts 2507). FIG. 25B shows the same PSDs (e.g., LWR PSD 2502 as LWR PSD 2508, LER PSD 2504 as LER PSD 2510, and PPR PSD 2506 as PPR PSD 2512) with the spikes removed using the procedure outlined in the previous paragraphs. For this removal, the threshold range was set to three frequency increments, and the threshold height was set to be three times the baseline PSD value. Effective removal of the spikes was accomplished using these settings.

FIGS. 27A and 27B show another case of spike removal, this time for mid-frequency spikes. The left-hand graph FIG. 27A shows the PSDs (biased and unbiased) before spike removal. The presence of the spikes has a deleterious effect on the modeling the PSD and the extraction of PSD measured values. The right-hand graph, FIG. 27B shows the same PSDs with the spikes removed using the procedure outlined in the previous paragraph. For this removal, the threshold range was set to three frequency increments, and the threshold height was set to be three times the baseline PSD value. Effective removal of the spikes was accomplished using these settings. The resulting PSD modeling and PSD measurement more accurately reflects the feature roughness PSD behavior excluding the mechanism that gave rise to the spikes.

An alternate procedure of removing spikes will now be described. Spikes can be removed from a PSD by passing the PSD through a low-pass filter. Using well-known techniques, the PSD can be Fourier transformed, multiplied by a low-pass frequency filter, then inverse Fourier transformed. The cut-off frequency of the low-pass filter can be set to only filter away spikes narrower than a set limit. Other approaches to low-pass filtering known in the field can also be applied.

Other methods for detecting and removing spikes based on the different frequency characteristics of a spike compared to the more slowly varying true roughness PSD will be known to those skilled in the art.

Referring to FIG. 7, the Information Handling System 750 can be modified to include the detection and/or removal of spikes using one of the exemplary methods described here. Information about each detected spike, such as its center frequency, amplitude, area, and/or width, can be recorded and output to Output Device 770. This information can be useful for identifying the root cause of the spike formation and thus can assist in the process of reducing or eliminating such root cause mechanism.

11. Detection and Measurement of PSD Bumps

Figures 28A, 28B:
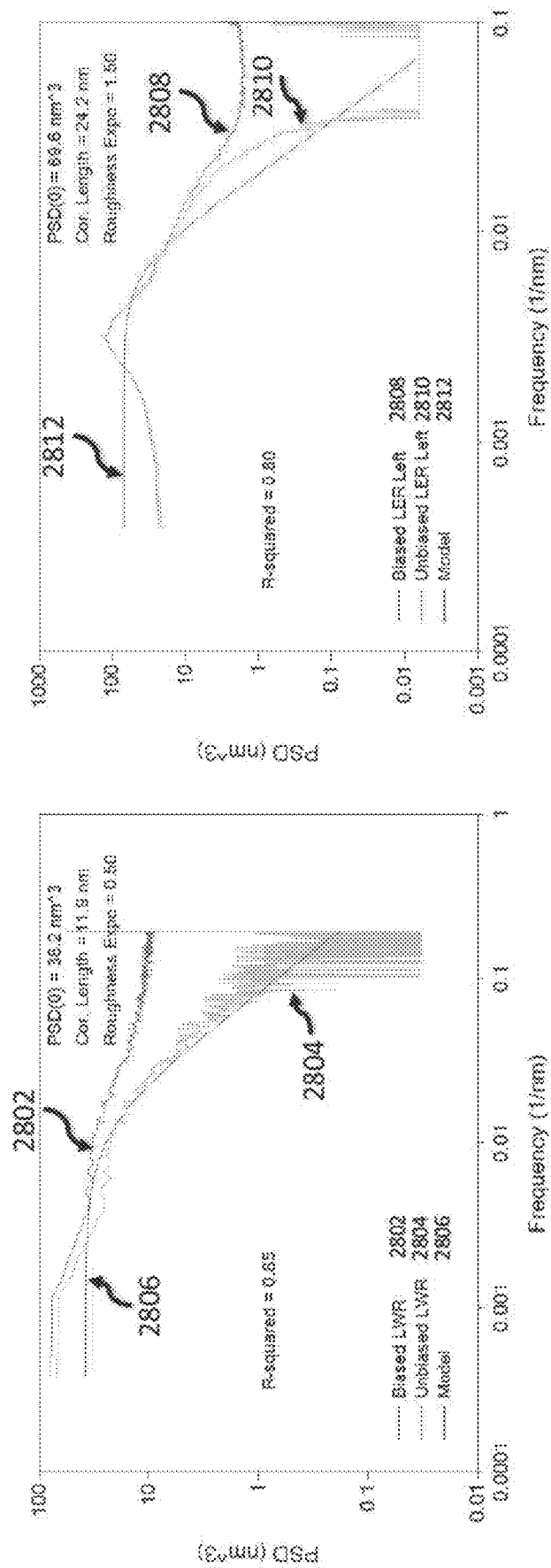
FIG. 28A shows a PSD dataset that exhibits a type of bump behavior.
FIG. 28B shows an additional PSD dataset that exhibits a type of bump behavior.
Figure 29A:
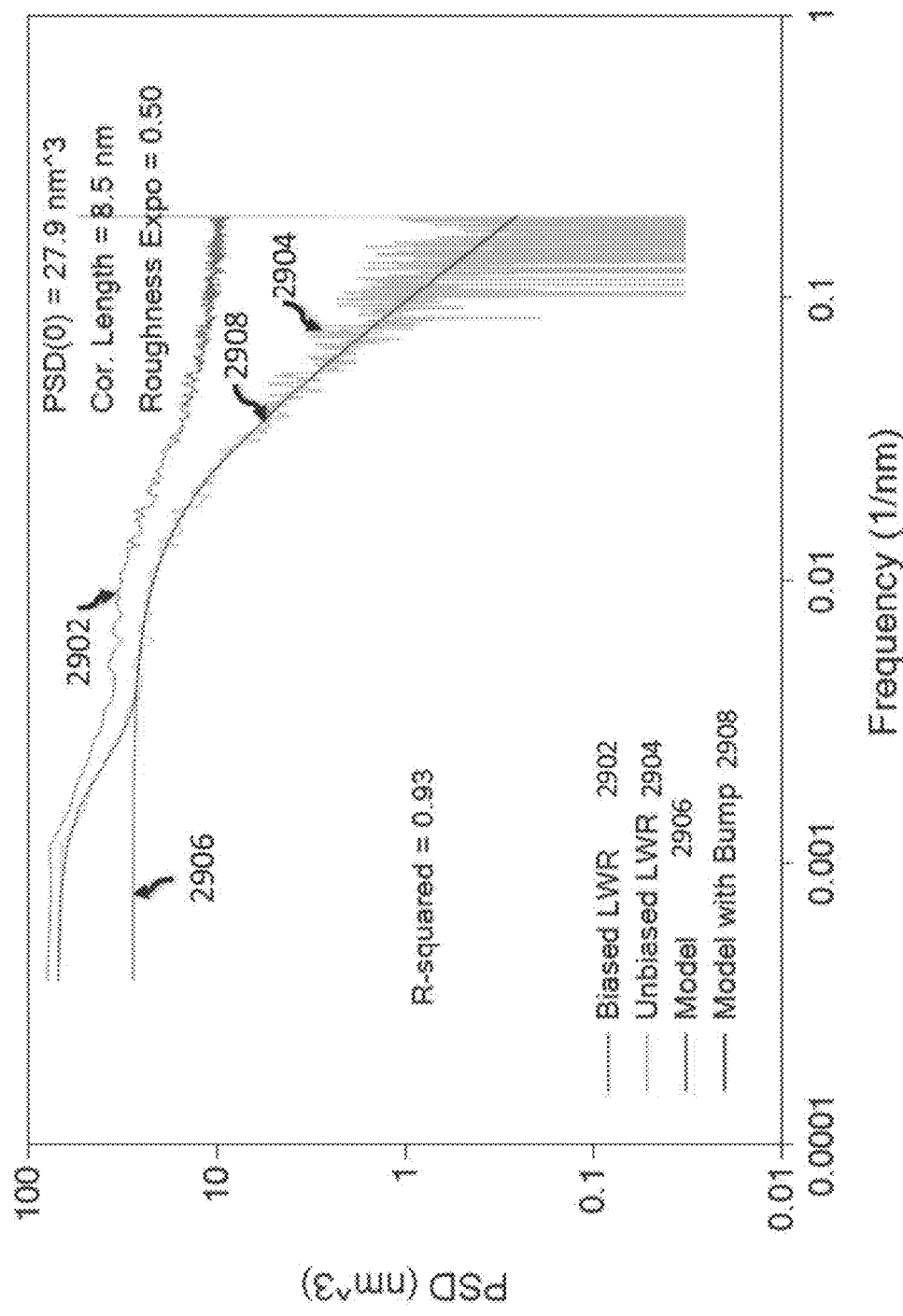
FIG. 29A shows the modeling and analysis of a low frequency bump of type I.
Figure 29B:
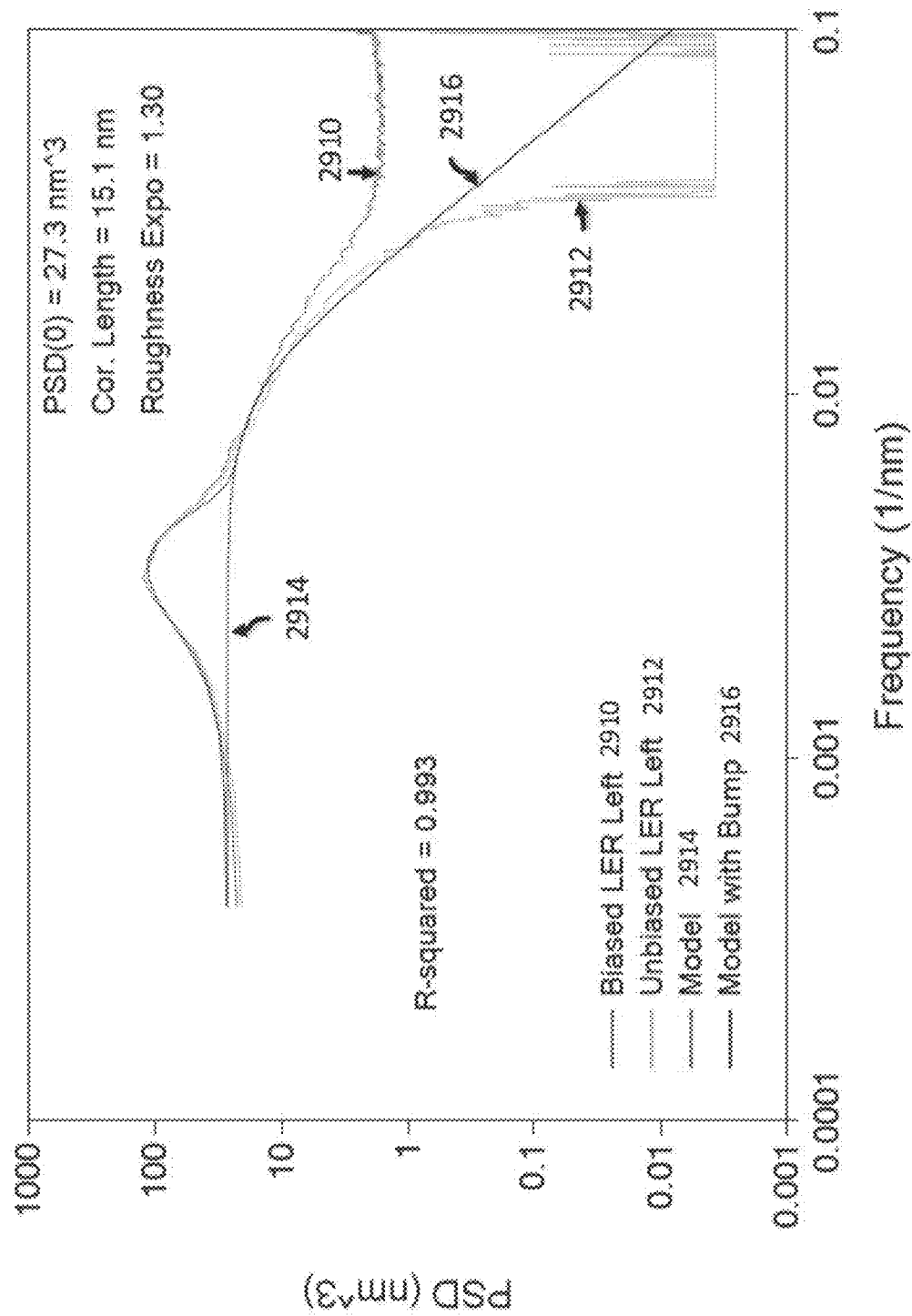
FIG. 29B shows the modeling and analysis of a low frequency bump of type II.

Other phenomenon can give rise to PSD behavior that appears as a "bump" in the PSD that otherwise has the typical shape shown in FIG. 3. Such bumps generally occur at relative low frequencies. These bumps are distinguished from spikes by covering a relative wide range of frequencies, as opposed to the narrow frequency confines of a spike. FIGS. 28A and 28B show two examples of this so-called bump behavior in PSD, labeled as Bump Type I and Bump Type II.

Bump Type I (FIG. 28A) is a large rise in the low-frequency PSD behavior above what would normally be considered the flat low-frequency regime characterized by PSD(0). Several mechanisms can give rise to this bump, such as the presence of photomask roughness that is then transferred to the wafer during a photolithography step. Uncompensated field distortions in the imaging tool used to capture the images being measured can also give rise to this kind of bump. Other mechanisms are possible as well.

Bump Type II (FIG. 28B) occurs at low-to-mid frequencies such that the PSD behavior at frequencies higher and lower than the bump follows the expected behavior (as seen, for example, in FIG. 3). When this type of PSD bump is found in the line-edge roughness PSD but not in the linewidth roughness PSD, the effect is sometimes called "wiggle" since it can be noticeable as a wiggle in the feature of the image. Such wiggle can be caused, for example, from stress or tension in the films used to make the features. Photolithography and subtractive etching of the film to form the features can relieve stress and allow the relaxed remaining film to wiggle. Other mechanism for causing wiggle are also possible.

Like white noise and spikes, bumps in the PSD are thought to arise through mechanisms separate from the stochastic mechanism that gave rise to the rest of the PSD. Thus, it is desirable to separate out the effects of the bump from the rest of the PSD. It is possible to use a procedure similar to spike detection and removal for bump detection and removal. However, this approach becomes problematic when the width of the bump is large due to the difficulty in defining a baseline PSD behavior over a large frequency range. While the larger frequency range of the bump means it is possible to distinguish bumps from spikes, it also means that different procedures for detecting and measuring bumps are likely required.

A separate technique of bump detection, measurement, and removal involves the use of a model for the bump. Like white noise and pink noise, the bump model adds directly to the typical PSD of the feature roughness. Thus, the bump model can be fit to the PSD simultaneously with the typical PSD model that does not include bump behavior.

A useful form for a bump model is given in Equation 10 below:

$$PSD_{bump}(f) = Ae^{-(f-f_c)^2/2\sigma_w^2} \quad (10)$$

where A is the amplitude of the bump, $f_c$ is the center frequency of the bump, and $\sigma_w$ is the width of the bump. For a Type I bump (FIG. 28A), the center frequency can be zero. Other models may also be used. Alternate parameterizations of the model can also be used, such as the area and center frequency of the bump.

The area of the bump above the baseline PSD, as determined for example from the best fit model, is a useful measure of the magnitude of the phenomenon that gave rise to the bump. For example, for the case of wiggle (a Bump Type II example, FIG. 28B), the area represents the variance of the wiggle that adds to the variance caused by stochastic roughness. In other words, this approach for bump detection and measurement allows the total variance of the feature to be separated into a wiggle variance plus a stochastic roughness variance.

Referring to FIG. 7, the Information Handling System 750 can be modified to include the detection and/or removal of bumps using one of the exemplary methods described here. Information about each detected bump, such as its center frequency, amplitude, area, and/or width, can be recorded and output to Output Device 770. This information can be useful for identifying the root cause of the bump formation and thus can assist in the process of reducing or eliminating such root cause mechanism. By subtracting the bump behavior from the total PSD, the remaining PSD can be characterized (using, for example, parameters such as PSD(0), correlation length, and roughness exponent) so that this remaining PSD reflects more accurately the mechanisms that gave rise to the PSD exclusive of the bump mechanism.

Figure 30:
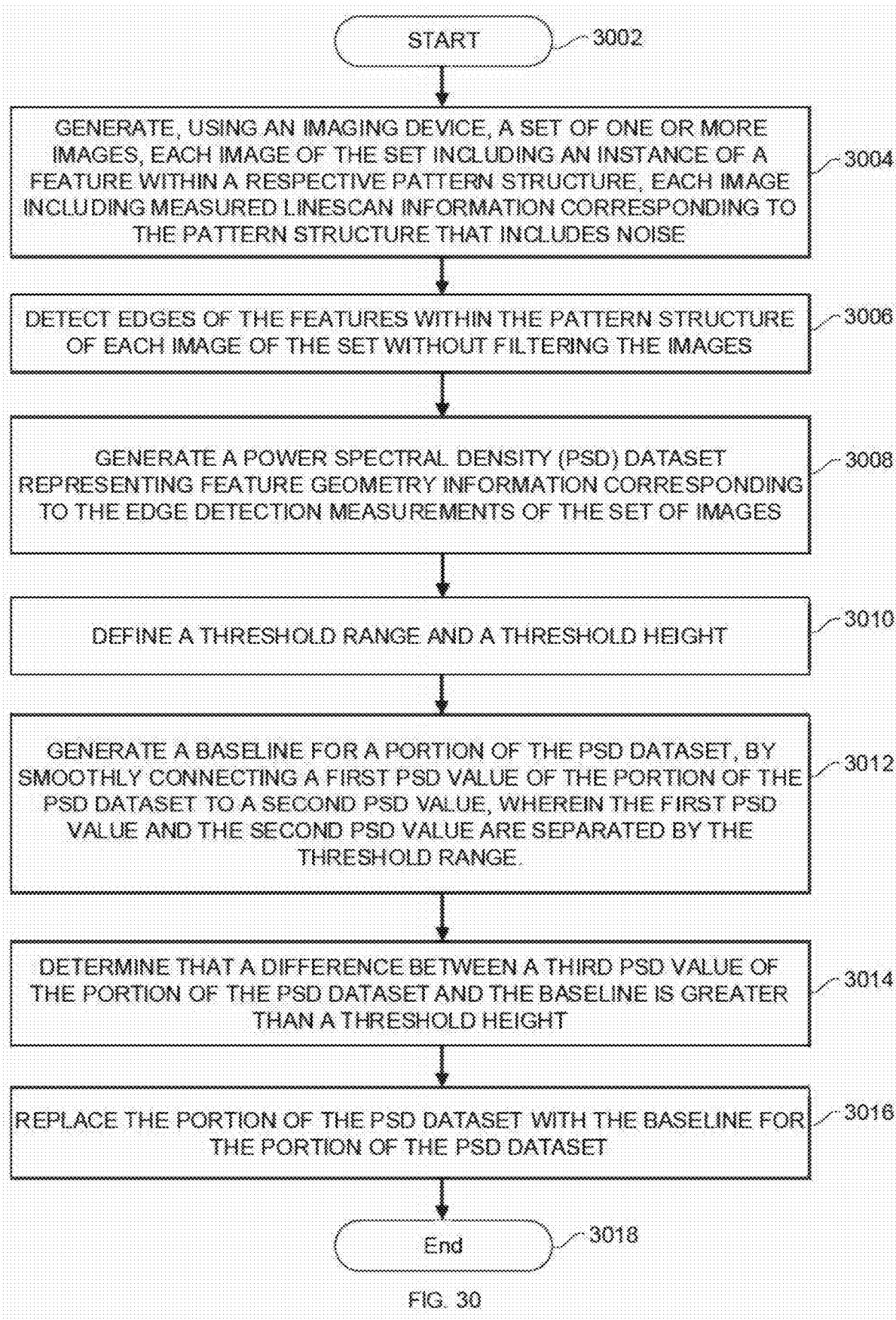
FIG. 30 is a flowchart that depicts a representative process flow to detect undesired spikes in a PSD dataset, and to remove the spikes from the PSD dataset and obtain roughness parameters for a feature.

Referring now to FIG. 30, an example method 3000 to detect undesired spikes in a PSD dataset, and for removing spikes in a PSD dataset is illustrated. The method 3000 starts (block 3002) and generates, using an imaging device, a set of one or more images, each image of the set including an instance of a feature within a respective pattern structure, each image including measured linescan information corresponding to the pattern structure that includes noise (block 3004). Next the method proceeds to detect edges of the features within the pattern structure of each image of the set without filtering the images (block 3006) and generates a power spectral density (PSD) dataset representing feature geometry information corresponding to the edge detection measurements of the set of images (block 3008). If desired, an unbiased PSD data set can be generated from the biased PSD data set by subtracting SEM noise. Next, the method defines a threshold range and a threshold height (block 3010) and generates a baseline for a portion of the PSD dataset, by smoothly connecting a first PSD value of the portion of the PSD dataset to a second PSD value, wherein the first PSD value and the second PSD value are separated by the threshold range (block 3012), determines that a difference between a third PSD value of the portion of the PSD dataset and the baseline is greater than a threshold height (block 3014), and replaces the portion of the PSD dataset with the baseline for the portion of the PSD dataset (block 3016). Thereafter, the method ends (block 3018).

Figure 31:
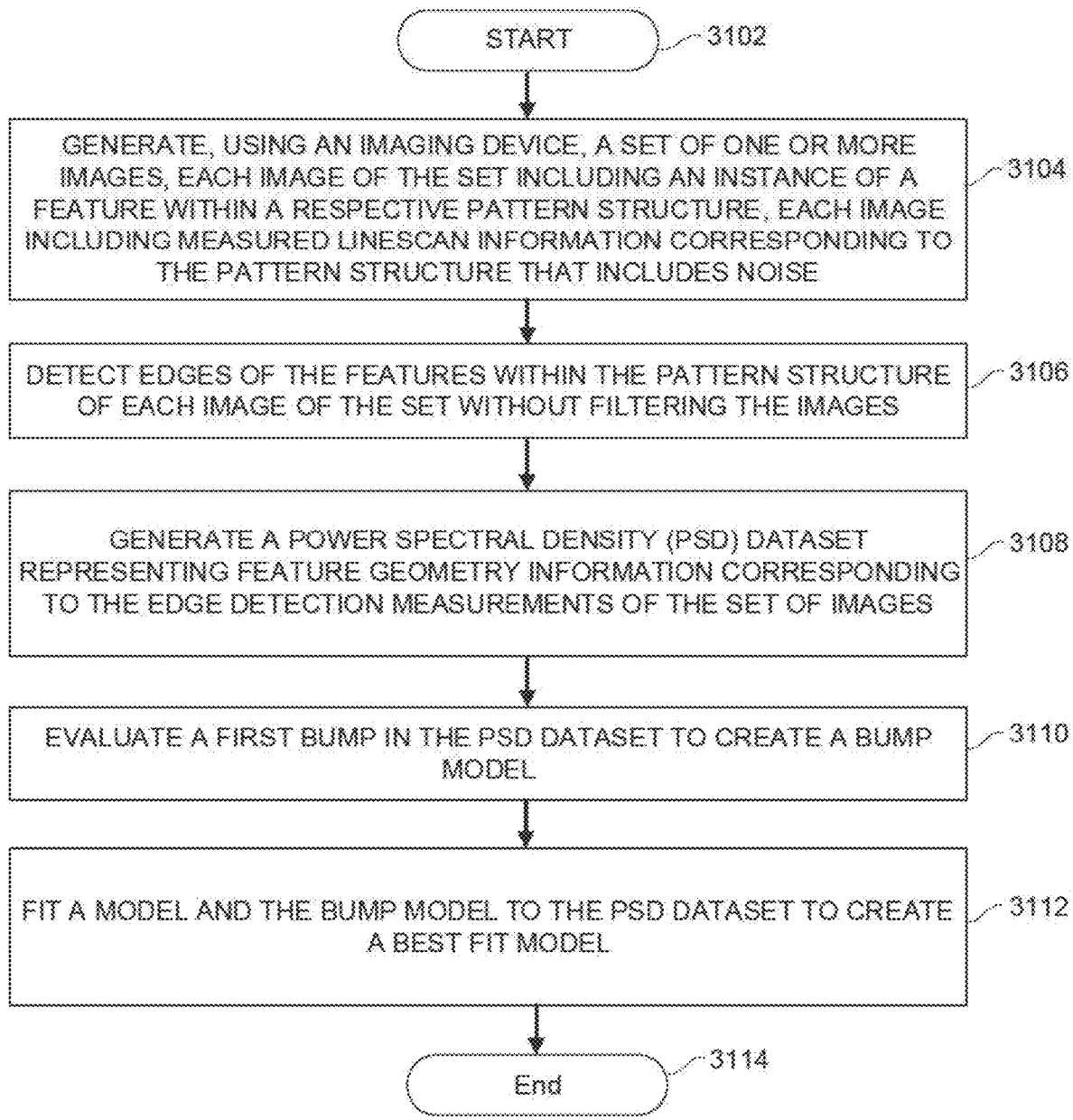
FIG. 31 is a flowchart that depicts another representative process flow to model bumps in a PSD dataset, and to obtain unbiased roughness parameters for a feature.

Referring now to FIG. 31, an example method 3100 to model bumps in a PSD dataset is illustrated. The method 3100 starts (block 3102) and generates, using an imaging device, a set of one or more images, each image of the set including an instance of a feature within a respective pattern structure, each image including measured linescan information corresponding to the pattern structure that includes noise (block 3104). Next the method proceeds to detect edges of the features within the pattern structure of each image of the set without filtering the images (block 3106) and generate a biased power spectral density (PSD) dataset representing feature geometry information corresponding to the edge detection measurements of the set of images (block 3108). If desired, an unbiased PSD data set can be generated from the biased PSD data set by subtracting SEM noise. A first bump is evaluated in the PSD dataset to create a bump model (block 3110); and fits a typical PSD model and the bump model to the PSD dataset to create a best fit model (block 3112). Thereafter, the method ends (block 3114).

The flowcharts of FIG. 30 and FIG. 31 include the steps that can be performed using the system 700 depicted in FIG. 7, including certain steps that can be carried out by the SEM 701 and certain other steps that can be carried out by the information handling system (IHS) 750 and its included processor 755 and storage 760, both as described in detail herein. Instructions can be stored in storage 760 that, when executed by the processor, cause the processor to perform the methods disclosed herein and described by the flowcharts of FIG. 30 and FIG. 31, in analogous fashion as other instructions stored in storage 760 that implement the inverse linescan model metrology tool 765 described herein.

12. Influence of Pixel Size and Magnification

Figure 22A:
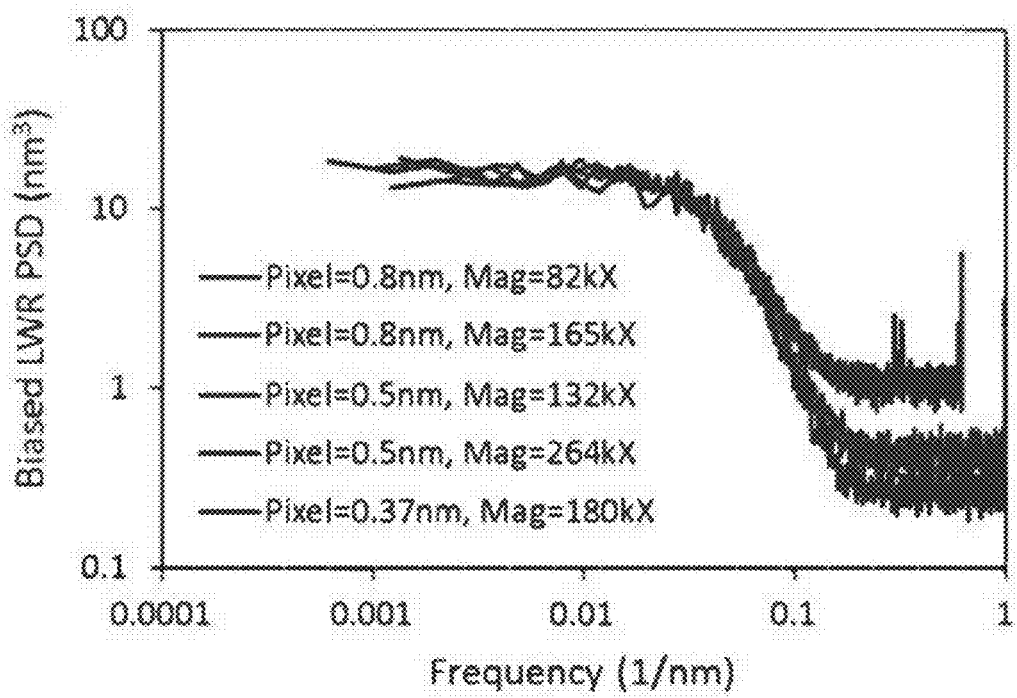
FIG. 22A shows biased linewidth roughness (LWR) power spectral densities (PSDs) as a function of different pixel sizes and magnifications employed by the SEM.
Figure 22B:
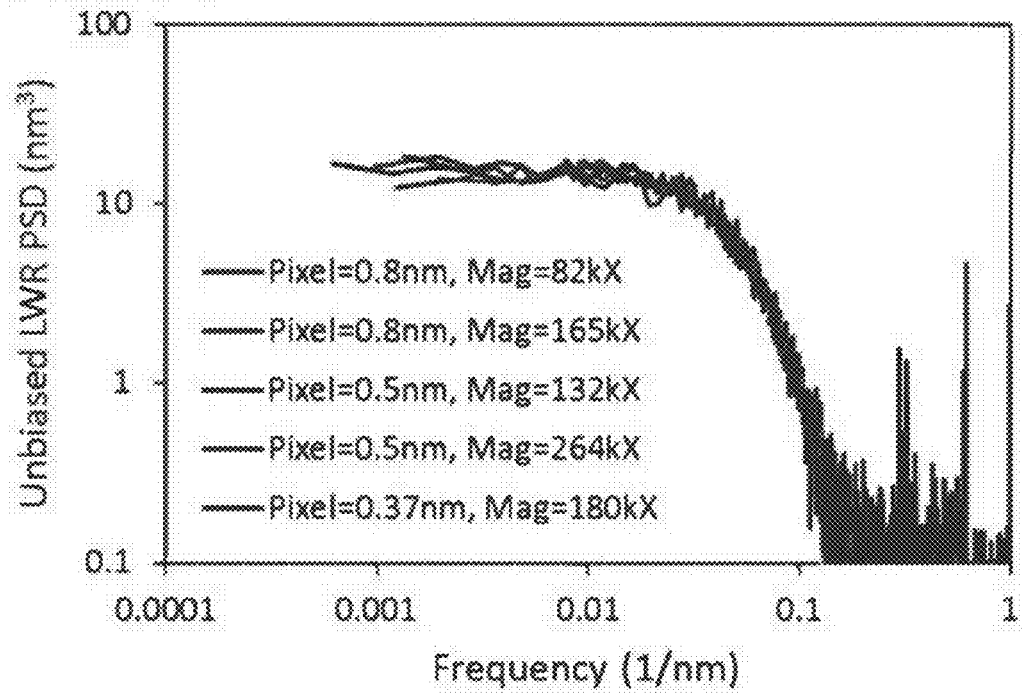
FIG. 22B shows unbiased linewidth roughness (LWR) power spectral densities (PSDs) as a function of different pixel sizes and magnifications employed by the SEM.

With respect to the pixel size and magnification employed by SEM 701, FIGS. 22A and 22B show the biased and unbiased power spectral densities (PSDs), respectively, for a pattern of 16 nm lines and spaces for different magnifications and pixel sizes, assuming a white noise model. For a given number of frames of integration, changing the pixel size changes the electron dose per unit wafer area and the noise in the SEM image. Table 3 shows the measured 3σ linewidth roughness (LWR), as well as the other PSD parameters, for these different pixel size and magnification conditions. Under this range of conditions, the biased LWR varied by 0.63 nm (14%), while the unbiased LWR varied by only 0.07 nm (2%). The unbiased LWR is essentially unaffected by these metrology tool settings. Similar results are obtained for the measurement of LER and PPR.

FIGS. 22A and 22B show power spectral densities as a function of pixel size and magnification. More particularly, FIG. 22A shows the biased LWR PSD and FIG. 22B shows the unbiased LWR PSD after noise has been measured and subtracted off. The SEM conditions for these results used a landing energy of 500 eV, 3 images per condition, and 16 nm resist lines and spaces.

TABLE 4 below shows the measured PSD parameters for the PSDs shown in FIGS. 22A and 22B.

TABLE 4

Biased and unbiased 3σ LWR (nm) measurements as a function of pixel size and magnification.

|  | Pixel 0.8 nm 82kX | Pixel 0.8 nm 164kX | Pixel 0.5 nm 130kX | Pixel 0.5 nm 264kX | Pixel 0.37 nm 180kX |
|---|---|---|---|---|---|
| Biased LWR (3-sigma, nm) | 5.10 | 4.99 | 4.67 | 4.61 | 4.47 |
| Unbiased LWR (3-sigma, nm) | 3.66 | 3.65 | 3.70 | 3.67 | 3.63 |
| Unbiased LWR PSD(0) (nm³) | 15.95 | 16.18 | 17.2 | 16.25 | 16.35 |
| LWR Correlation Length (nm) | 5.08 | 5.05 | 5.31 | 5.11 | 5.38 |

It has been found that the difference between biased and unbiased LWR is not constant, but varies with metrology tool settings, feature size, and process. Likewise, the ratio between biased and unbiased LWR varies with metrology tool settings, feature size, and process. TABLE 5 below shows the difference and ratio of biased to unbiased LWR for a variety of conditions. For these conditions, the ratio of biased to unbiased LWR varies from 1.09 to 1.66. The difference between biased and unbiased LWR varies from 0.32 nm to 2.19 nm in this particular example.

TABLE 5

The relationship between biased and unbiased LWR for a variety of processes.

| Process | 3σ LWR: Biased/Unbiased | 3σ LWR (nm): Biased − Unbiased |
|---|---|---|
| 193i litho, 84 nm pitch, 500 V, 512 rect pixels | 1.20 | 0.76 |
| 193i etch, 84 nm pitch, 800 V, 512 rect pixels | 1.14 | 0.43 |
| EUV litho, 32 nm pitch, 500 V, 2048 0.8 nm pixels | 1.39 | 1.44 |
| EUV litho, 32 nm pitch, 500 V, 1024 0.8 nm pixels | 1.37 | 1.34 |
| EUV litho, 32 nm pitch, 500 V, 2048 0.5 nm pixels | 1.26 | 0.97 |
| EUV litho, 32 nm pitch, 500 V, 1024 0.5 nm pixels | 1.26 | 0.94 |
| EUV litho, 32 nm pitch, 500 V, 1024 0.37 nm pixels | 1.23 | 0.84 |
| EUV litho, 36nm pitch, 500 V, 1024 0.8 nm pixels | 1.52 | 1.86 |
| EUV litho, 32 nm pitch, 500 V, 1024 rect pixels | 1.66 | 2.19 |
| EUV etch, 32 nm pitch, 800 V, 1024 rect pixels | 1.09 | 0.32 |

13. Edge Detection Embodiments

Figure 23:
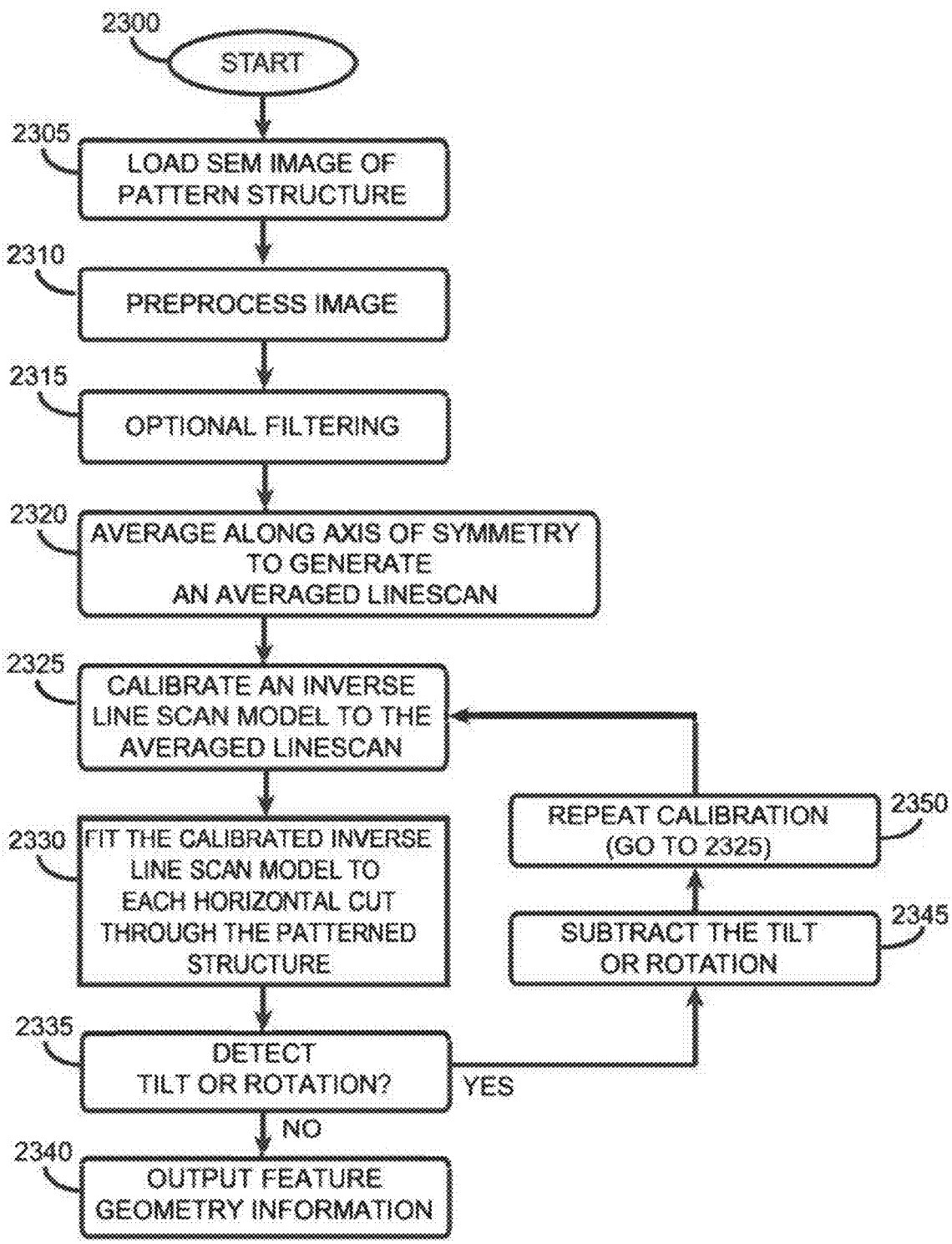
FIG. 23 is a flowchart that depicts a representative overall process flow that the disclosed SEM edge detection system employs to detect edges of a pattern structure.

FIG. 23 is a flowchart that depicts a representative overall process flow that the disclosed SEM edge detection system employs to detect edges of a pattern structure. For discussion purposes, the process described in the flowchart of FIG. 23 is applied to sample 2400 of FIG. 24A. Sample 2400 is a pattern structure that may also be referred to as pattern structure 2400. The flowchart of FIG. 23 includes the steps carried out by inverse linescan model metrology tool 765 to determine the edges of the pattern structure.

Process flow commences at start block 2300 of FIG. 23. As seen in FIG. 7, an information handling system (IHS) 750 is coupled to SEM 701 to receive SEM linescan image information from SEM 701. IHS 750 includes a processor 755 and storage 760 coupled thereto. Storage 760 may include volatile system memory and non-volatile permanent memory such as hard drives, solid state storage devices (SSDs) and the like that permanently store applications and other information. Storage 760 stores the inverse linescan model (ILM) metrology tool 765 disclosed herein and described by the flowchart of FIG. 23. SEM 701 includes a controller (not shown) that IHS 760 instructs to perform image acquisition on pattern structure 800 and that provides linescan information from SEM 701 to IHS 750.

As per block 2305, SEM 701 sends an SEM image of pattern structure 800 to IHS 750, and in response, IHS 750 loads this SEM image into system memory within storage 760. IHS 750 preprocesses the pattern structure image from the SEM 701, as per block 2310. For example, this preprocessing of the loaded SEM image may include adjusting grayscale values and subtracting out background tilts of intensity levels. Optionally, as per block 2315, IHS 750 may perform filtering of the loaded image, although this is generally not preferred.

Figure 24A:
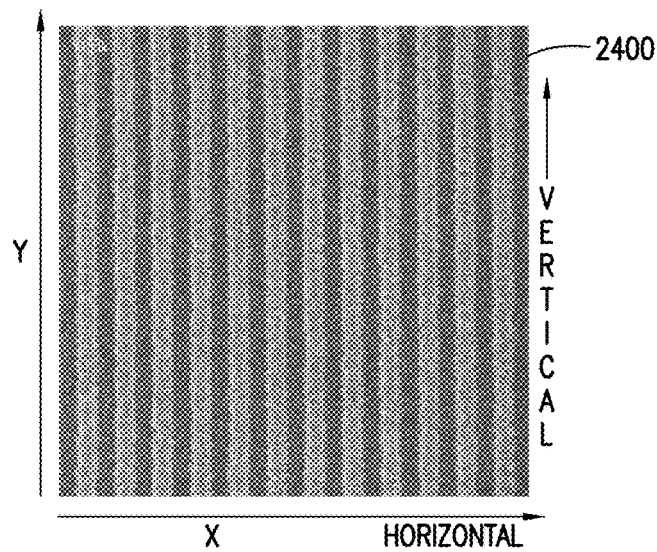
FIG. 24A is a grayscale representation of a pattern structure of vertical lines and spaces that the disclosed metrology tool analyzes.
Figure 24B:
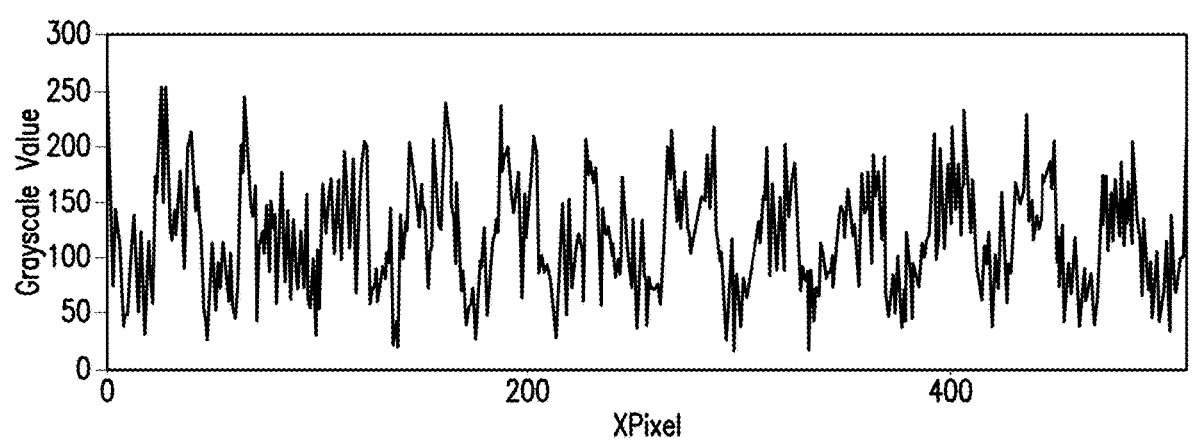
FIG. 24B shows a single linescan at one Y-pixel position.
Figure 24C:
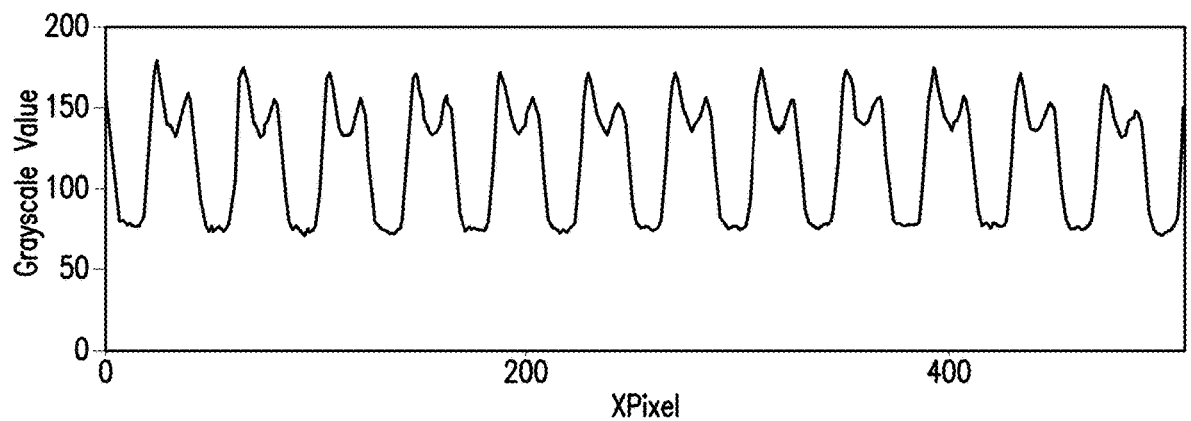
FIG. 24C shows the averaged linescan that is generated by averaging over all Y-pixels.

In the case of a pattern structure such as the vertical lines and spaces seen in the pattern structure 2400 of FIG. 24A, the inverse linescan metrology tool 765 averages vertically over the axis of symmetry to generate an average linescan, as per block 2320. An average linescan may be a grayscale value as a function of horizontal position wherein all of the vertical pixels have been averaged together. This averages out much of the SEM noise contained in the SEM image and produces a linescan that is more representative of the physical processes that generate a linescan without noise. FIG. 24B shows a single linescan at one Y-pixel position. FIG. 24C shows the averaged linescan that is generated by averaging over all Y-pixels.

While the example shown here is for vertical lines and spaces, any pattern with an axis of symmetry can be so processed to produce an average linescan. For example, long lines, long spaces, or long isolated edges can be so processed whenever the length of the line is sufficient to allow adequate averaging. Contact holes or pillars, with circular or elliptical symmetry, can also be averaged in a radial direction to produce an average linescan.

As per block 2325, tool 765 calibrates the inverse linescan model to the averaged linescan that was obtained in the manner described above. It is noted that the linescan model includes two kinds of parameters, namely 1) parameters that depend upon the materials and the properties of the SEM, and 2) parameters that depend on the geometry of the feature on the sample. Tool 765 can calibrate all of these parameters. Tool 765 finds the best fit of the model to the average linescan of FIG. 24C, as per block 2325. The values of the best fit parameters of the model are then the calibrated values.

That calibrated model is applied to a single linescan as shown in FIG. 24B. The best fit of the model to the single linescan of FIG. 24B is found, however, in this case tool 765 fixes all of the parameters that relate to the materials and SEM imaging tool. In this scenario, tool 765 varies only the parameters related to the geometry of the feature of the pattern structure in order to find the best fit of the calibrated model to a single linescan.

In a simplified scenario, the only parameters varied in block 2330 would be the positions of the edges of the feature. In one embodiment, it is assumed that the vertical dimension of the feature exhibits a predetermined thickness and that only the edge positions of the feature are varying. Next, the calibrated inverse linescan model is fit to every single horizontal cut through the 2D image of the feature, as per block 2330. We take the top horizontal row of pixels, and then the next row of pixels that are one pixel down, and then the next horizontal row of pixels down, and so forth. An example of one such single linescan is shown in FIG. 24B. The resulting best fit edge positions are the detected edges.

After the edges of the feature are detected in the manner described above, tool 765 may detect that the sample was rotated slightly during image acquisition, resulting in parallel tilted lines (that is, lines that are not perfectly vertical). Such tilting or rotation may contribute to inaccuracy of the detected edges by changing the average linescan and thus the calibrated ILM. Image rotation can be detected by fitting all the edges in the image to a set of parallel lines and determining their slope compared to vertical. If the slope is sufficiently different from the vertical case, the rotation should be removed. One possible criterion would be to compare the pixel position of the best fit line at the top of the image to the pixel position of the best fit line at the bottom of the image. If these pixel positions differ by some threshold, such as two pixels, then the image rotation is considered to be sufficiently large that its removal is required.

If such tilting/rotation is detected, as per block 2335, then the prior calibration is considered to be a first pass calibration and calibration is repeated. More particularly, if such tiling/rotation is detected, the rotation is subtracted out by shifting some rows of pixels to bring the edges into vertical alignment, as per block 2345, and calculating a new average linescan. Calibration of the model is then repeated as per block 2350 and 2325. Another fitting is performed as well, as per block 2330. Ultimately, tool 765 outputs geometry feature information (such as edge positions) describing the geometry of the feature that corresponds to the linescan image information provided to tool 765.

Like image rotation, the roughness of the features themselves contributes inaccuracies to the calibration of the ILM. Optionally, after a first pass edge detection, each row of pixels can be shifted to not only subtract out image rotation, but to subtract out the feature roughness as well. The final result after the shifting of each row of pixels is a vertical edge where the edge position varies by less than one pixel from a perfect vertical line. These shifted rows of pixels can then be averaged vertically to produce a more accurate average linescan for use in ILM calibration.

In actual practice, information handling system 760 may include an interface 757 coupled between processor 755 and an output device 770 such as a display, printer, or other device so that the user may observe the feature edges determined by metrology tool 765. Interface 757 may be a graphics interface, a printer interface, network interface, or other hardware interface appropriate for the particular type of output device 770.

14. Assessing the Quality of Devices Using Unbiased Roughness Measurements

The measurement of roughness of various pattern structures can be used to assess the quality of the devices being fabricated. For example, the yield and/or performance of a device might depend on the magnitude of the roughness of one or more patterns that make up that device, as well as the frequency content of the roughness of those patterns.

The use of roughness measurements to assess device quality can be as simple as defining a "specification" for the roughness: the measured roughness of a specific target pattern must not exceed a specified value. The specification is set based on its relationship to device yield and/or performance. When devices "meet" the specification (have roughness that is at or below the specification for the target patterns being measured), it is known or assumed that the device will have acceptable yield and performance.

Alternately, the measurement of roughness can serve as an input into a model that predicts device yield and/or performance. Such models could be run in real time, or results could be precomputed and placed in a table for look-up as needed.

For example, stochastic effects that give rise to edge roughness of a pattern structure also give rise to catastrophic defects such as the merging of two edges that should remain separate. For a pattern of lines and spaces, two neighboring lines can bridge the space between them creating a merger across the space. If those two lines are current-carrying wires, the result is a short circuit. If the two edges of a single line merge the result is a break in the line. If that line is current-carrying wire, the result is an open circuit. Defects such as these are labeled "catastrophic" since the occurrence of just one could render the device inoperable. Thus, a yield model for roughness could take the output of a roughness measurement of a pattern structure and predict the probability of catastrophic defect, and thus predict a stochastic-limited yield.

For the case of contact hole or pillar features, catastrophic defects take the form of missing or merged features. A "missing" feature can be a feature that is completely missing, or one that has a critical dimension below a minimum allowable value. For example, if a contact hole is too small (below the minimum allowed value), its use as an electrical contact between electrically conducting wires can become compromised due to excessively high contact resistance caused by its small size. Thus, a contact with too high of a resistance can be classified electrically as a missing contact (with completely missing being an extreme case of effectively infinite contact resistance).

Likewise, two hole or pillar features, intended to be separate features, can become merged. Merged features are often the equivalent of a short circuit between conducting paths that are intended to be separate. When two hole or pillar features are too close to each other (with a distance of separation below a minimum allowable amount) those two features can be classified as merged.

Merged or missing hole and/or pillar features are usually considered catastrophic defects. Depending on the design of the circuit being built, even one missing or merged hole or pillar can cause an entire circuit device to fail. Thus, the rate at which contact holes or pillars are missing or merged is an important factor affecting the yield of the devices being made. This rate can be described as a defect density (average number missing or number merged per unit area or per device) or as a defect probability (average fraction of holes/pillars that are missing or merged).

Other feature types or patterns can exhibit defect mechanisms as well. For example, two line ends facing each other (sometime called a tip-to-tip spacing) can become merged, with consequences that can be similar to merged contact holes or pillars. Many other pattern types can suffer from similar defects.

When an important contributor to defectivity is stochastic variations, the measurement and control of that defectivity has added challenges compared to other more traditional causes of defectivity during lithography and patterning. Like with the measurement of roughness, noise in the measurement system can appear to be stochastic variations in the features themselves, thus biasing the measured variations and biasing the measured frequency of defect occurrence.

The use of biased roughness measurements to assess the quality of a device is problematic since the biased measurement can overestimate or underestimate the true roughness of the pattern structures that were measured. This in turn could lead to underestimation or overestimation of the device impact of that roughness.

Further, the bias in the roughness measurements is not necessarily fixed. The bias in the measurements can vary from measurement to measurement due to variations in the measurement tool, or due to variations in the pattern structure that do not affect the true roughness of the pattern.

For these reasons, it is preferred that the assessment of device quality be based on unbiased roughness measurements, where random and/or systematic errors in the measurement of roughness are removed.

Further, some aspects of device quality are sensitive to the frequency content of the roughness. Low frequency roughness behaves like an error in the mean feature width, edge position, or center-line position of the feature. Mid-frequency roughness can produce, for example, scattering of electrons flowing through a metal wire, increasing its resistance. For an optical waveguide, the roughness frequency that matter most depends on the wavelength of the light passing through the waveguide. For some devices, roughness at frequencies higher than a certain cut-off may not have any affect at all on the performance of the device.

Thus, it is desirable to produce an unbiased estimation of the true PSD behavior of the roughness as well. Integrating the unbiased PSD over a certain frequency range will provide an estimate of the magnitude of the roughness only over that frequency range, ignoring other frequencies of the roughness. This roughness over a set frequency range can then be used as a specification, or as an input to a device quality model.

Note that the measured pattern structure or structures need not duplicate exactly the form of the pattern structure or structures that make up the device of interest. The only requirement is that the pattern structures that are measured produce roughness measures that are predictive of device quality.

15. Assessing the Quality of a Process or Material or Tool Using Unbiased Roughness Measurements Roughness measurements of a pattern structure or structures can be used to assess the quality of the processes and/or process materials and/or process tools used to fabricate that pattern structure. For example, repeated measurements of roughness can be used to determine temporal variations in roughness or spatial variations in roughness using standard assessment techniques.

The assessment of temporal variations in a process parameter is commonly accomplished through either time-series analysis or statistical process control (SPC). Both techniques can identify behavior that deviates from historical trends, thus indicating a process variation that might need attention or an action such as a process adjustment. A drift or an abrupt change in the magnitude of the roughness or in its frequency components could indicate a problem with the process, a problem with a material, or a problem with a tool used in the fabrication of the measure pattern structure.

Spatial analysis of roughness can be used to indicate a systematic spatial signature present in the fabrication process. For example, a variation across the substrate (such as a wafer) might indicate a problem with the uniformity of the etch process even though other metrics (such as a measurement of the average dimensions of the pattern structures) do not show a similar spatial signature or uniformity problem. A variation across the exposure field of a lithography tool might indicate a problem that is similarly unnoticed by other measurements.

Changes in a process material, such as a photoresist used in a lithography process, can result in a change in the measured pattern roughness, including its frequency behavior as exhibited by the power spectral density or other equivalent measure.

The use of roughness measurements to assess the quality of a process, process material, or process tool can be significantly degraded when the roughness measurements are biased by noise and/or systematic errors in the measurement to produce a biased roughness measurement.

Temporal and spatial variations in roughness include variations in the frequency components of the roughness. For example, a spatial variation in the correlation length (determined, for example, by measurement and analysis of the PSD) might indicate a variation in a temperature dependent process such as diffusion, which in turn might indicate a temperature uniformity problem during a baking step of the fabrication process.

Biased measurement can be higher or lower than the true value, depending on the source of bias and whether image filtering was used before edge detection, for example. Further, the bias in the roughness measurements in not necessarily fixed. The bias in the measurements can vary from measurement to measurement due to variations in the measurement tool, or due to variations in the pattern structure that do not affect the true roughness of the pattern.

As a result, the use of unbiased measurements for the assessment of the quality of a process, process material, or process tool is highly desirable.

Note that the measured pattern structure or structures need not duplicate exactly the form of the pattern structure or structures that make up the device or devices being fabricated by the process of interest. The only requirement is that the pattern structures that are measured produce roughness measures that are predictive of process, process material, or process tool quality.

16. Assessing the Quality of a Metrology Tool and Process Using Unbiased Roughness Measurements The unbiased measurement of roughness necessarily entails the determination of the measurement bias, whether that bias is caused by random errors such as image noise and edge detection noise, or systematic errors such as distortion. As a result, the measurement bias is an output of an unbiased measurement of roughness. The determination of measurement bias can be used to assess the quality of the tool and process used to measure roughness.

For a given measurement tool, measurement process, and pattern structure to be measured, the roughness measurement bias should be a fixed quantity. Further, the edge detection metrology noise as well as the systematic errors such as measurement distortion should individually be constant. Thus, changes in these quantities could be an indication of a change in the ability to measure these quantities. By tracking the detected roughness measurement errors over time it is possible to assess changes in the measurement and to assess the quality of the measurement process and/or the measurement tool.

17. Controlling a Fabrication Process Using Unbiased Roughness Measurements

The above sections describe how unbiased measurements of roughness of a pattern structure can be used to assess the quality of the device that incorporates the pattern structure. Further, the above sections describe how unbiased measurements of roughness of a pattern structure can be used to assess the quality of the process, process materials, and process tools used to make the pattern structure. Further, the above sections describe how unbiased measurements of roughness of a pattern structure can be used to assess the quality of the of the metrology used to measure said roughness.

Once the quality of the devices, processes, materials, process tools, and measurement tools have been assessed, that assessment can be used to control the fabrication of the devices. Process control is a well-known application of measurement results including feedback control, feed-forward control, and advanced process control (APC) such as run-to-run control.

Feedback control uses a measurement result (or many measurement results) to determine a change in the fabrication process (such as a change in a setting, a change in a material, or a change in a tool) that would have produced a better result had those changes been implemented prior to the fabrication of the measured pattern structure. These changes are then implemented for the fabrication of future pattern structures under the assumption that they will affect the desire correction for the future results.

Feedforward control uses a measurement result (or many measurement results) to determine a change in a subsequent process step that could compensate for the errors measured in the current process step.

Advanced process control (PAC) or run-to-run control uses feedforward or feedback loops very quickly so that changes (either forward or backward) can be implemented with very little delay, reducing the amount of product that is fabricated with the process exhibiting the measured error.

Unbiased roughness measurements enhance the efficacy of each of these control approaches. While the uses of biased roughness in feedforward, feedback, and PAC control loops is possible, the results are often less than desired (and sometimes worse than no control at all) due to the biases in the measurements. Further, since the bias in the measurements can change, it is possible that a feedback loop, for example, could cause process changes in response to a change in measurement noise rather than a change in the actual pattern structure, thus making the process more unstable rather than more stable.

18. Predicting Catastrophic Defect Densities and Device Yield

Stochastic variations in the edge positions of features can lead to unwanted changes in the electrical properties of the devices being fabricated. Excessive stochastic variations in the edge positions of features can, in extreme cases, lead to catastrophic device failures such as electrical opens and/or electrical shorts. Even if the probability of a feature or a region of a feature developing a catastrophic defect is very low, the number of such features or regions on a semiconductor device can be in the billions or trillions. Thus, even a very small probability of one feature or one region being defective can be problematic when multiplied by a large number of features or regions per device.

For example, consider a circuit device with one kilometer of metal wires on a given layer of metallization. Next, consider a 10 nanometer region along the length of those metal wires that can become defective independent of the other regions along that one kilometer of wires. This means there are 1E11 (100 billion) independent regions of wires that could become defective (one kilometer divided by 10 nanometers).

Suppose further that only a 1% yield loss due to electrical failures at this particular metal layer could be tolerated due to economic constraints of cost and profitability in manufacturing. This would mean that the probability of a catastrophic defect at any point along the line must be less than about one out of ten trillion (100 billion independent regions divided by the maximum 1% yield loss) in order to meet the yield loss target.

Similar ideas apply to hole and pillar features. At a given wiring layer in the device there may be on the order of 100 billion contact holes making electrical contacts to the various wires at that layer. If a maximum yield loss of 1% is allowed for the manufacture of those 100 billion contacts, the maximum allowed probability of a missing or merged contact (also known as the maximum allowed defectivity rate) is about one out of ten trillion.

While the numerical values used in the preceding paragraphs are for the purposes of example only, it is extremely common in many areas of semiconductor manufacturing to require defectivity rates for individual features that are extremely small. Other types of device manufacturing, such as flat panel displays, microelectromechanical systems, microfluidic systems, optical waveguides, photonic devices, and other electronic, optical, or mechanical devices, can also require extremely small defectivity rates.

Manufacturers of semiconductor and similar devices assess the likelihood of success in producing working devices in a number of ways. In the simplest way, they may try to produce a device and then measure the final yield (the fraction of manufactured devices that actually work and meet required specifications). However, the cycle time (the time from when a device begins production until it is sent for testing after the fabrication process is complete) for a complex semiconductor device can be several months. Thus, it is extremely risky to spend many months and large amounts of money to build devices that may, in fact, never work.

Accordingly, for the issues discussed above, it is desirable for to enable manufacturers to predict device yield before completing the manufacture of the device. As a part of such a prediction, it is desirable to predict the yield of a specific step or steps in the manufacturing process. For example, they may wish to predict the fraction of contact holes at a particular device layer that may become missing due to stochastic variations. For line/space patterns (such as metal wires) they may wish to predict the incidence of bridges or breaks in those lines and spaces.

Since the maximum allowable probability of a catastrophic defect can be on the order of one out of 10 trillion (as mentioned above) or a similar magnitude, it is often impractical to assess the probability of catastrophic defects by printing test patterns and measuring the actual occurrence of said defects. Thus, there is a need to predict the probability of the occurrence of defects as low as one out of 10 trillion by making measurements on merely hundreds to tens of thousands (or possibly millions) of features.

Predicting the behavior of trillions of features based on the measurement of thousands of features is an act of extrapolation. Extrapolating by many orders of magnitude requires a very good model of the stochastic behavior of the feature being described. A good (meaning predictive) model in turn requires both the proper form of the model (for example, the right equation or equations, such as a probability density function), and the proper calibration of that model to the measurements made on those thousands of features.

A model predicting the probability of a stochastic defect should be calibrated using stochastic data. For example, a model to predict the probability of a bridge or a break in a pattern of lines and spaces manufactured in a specific way could be calibrated by measuring the stochastic behavior of a sampling of lines and spaces so manufactured. The measured stochastic behavior could be characterized by the standard deviation of the edge position or linewidth (the LER or LWR as described above), by the power spectral density of the measured deviations, by the local critical dimension uniformity of short line segments as a function of the length of those line segments, or by other metrics described above or known in the art.

For contact holes or pillars, a stochastic model to predict the probability that a given hole/pillar feature would be missing could be calibrated by measuring the distribution of contact hole/pillar sizes (critical dimension, feature area, or other measure of size and/or shape) on a sample of thousands (or even millions) of features. Even if a million features were measured, that number represents a very small fraction of the trillions features that might be required to properly assess the probability of a missing feature. A similar process would apply to merged features.

As described above, measurements of stochastic variations are often contaminated with measurement noise, biasing the measurement results. Calibrating a defect or yield model with biased data will often produce unacceptable results since the bias can be of the same order of magnitude as the true stochastic variation. Thus, defect and yield models should be calibrated with unbiased measurements.

An example of a model used to predict the incidence of missing contact holes is a model for the stochastic variation of critical dimensions of holes that nominally should be the same size. One type of such a model takes the form of a probability density function: the probability that any given contact hole will have a critical dimension between CD and CD+dCD, where CD is the critical dimension value and dCD is an infinitesimal change in that critical dimension.

A probability density function model can be a known analytical model (that is, an analytical equation), such as a Gaussian probability distribution, or it could be an empirical model that is approximated over a range of critical dimensions with an equation.

The Gaussian probability distribution is a model that may be extrapolated to predict the occurrence of low-probability events. This model may utilize two parameters: a mean and a standard deviation. A method of moments approach may be used to fit such a model to experimental data. In this method, the mean and standard deviation of the experimental data (the CDs of thousands to millions of contact holes, for example) are calculated, and then these values are used as the parameters of the probability density model. In some embodiments, other methods may include a maximum likelihood method and a regression method.

In some instances, a Gaussian probability model may not adequately extrapolate over many orders of magnitude. Experimental data may exhibit skewness and excess kurtosis that results in a higher probability of the incidence of a defect compared to the Gaussian prediction. For such cases other probability density functions may be used, such as a Gamma distribution, Lognormal distribution, or Weibull distribution, as well as others.

In addition to probability density models, other types of models can be used to extrapolate measured behavior in order to predict a low-probability defect. Lithography models that can predict the impact of exposure dose on critical dimension can be combined with a photon shot noise or other dose variation model to predict the occurrence of defects.

For whatever model is chosen to make predictions of the occurrence of low-probability defects, that model must be calibrated to a specific lithography and/or patterning process. If the data used to calibrate this model is biased by measurement noise, prediction accuracy will suffer. Thus, unbiased data is preferred for the task of model calibration.

Predictions of defectivity can have many uses. For example, different processes, materials, or processing tools can be evaluated, compared, controlled, or improved based on achieving the minimum predicted defectivity rate. If measurements are made as a function of exposure dose and focus of a lithography tool, the best focus and dose settings can be chosen taking predicted defectivity into account. Additionally, the focus-exposure process window can be determined taking predicted defectivity into account. Many other processing variables can be applied to a process window in the same way as focus and exposure dose. A process window may refer to a window in parameter space, where the parameters are selected in the window based on whether they result in a desired output to the process. In some embodiments, the process window may include a range of suitable values of parameters that result in the desired output and values of parameters outside of the range may not be selected because they result in an undesired output. The parameters may be any suitable parameter as described herein, including without being limited to, exposure dose, focus, etc.

One of the advantages of an accurate and predictive model of defectivity, calibrated with accurately measured data, is the ability to evaluate, compare, control, monitor, or improve processes, materials, and equipment with the use of far fewer measurements than traditional approaches. A defectivity rate of one bad feature out of a billion requires billions of features to be measured in order to experimentally arrive at the defectivity rate. A predictive model, on the other hand, can be used to compare two different processes to find the lowest defectivity by calibrating the model with tens of thousands of measurements, rather than billions.

While the above embodiments describe the use of unbiased roughness measurements of a pattern structure or structures to assess and improve the quality of a fabrication process, the same approaches can be used to reduce the cost of manufacturing while keeping the quality of the fabrication process constant. For example, process quality assessment might determine that a process using a shorter etch time produces equivalent unbiased roughness measurement results as a process with longer etch times. Since the shorter etch time results in higher process throughput, the cost per device is reduced without a reduction in process quality.

Biased roughness measurement may not provide this same result if the bias in the measurement changes with etch time.

As a second example, the results shown in FIG. 21 show that reducing the number of frames of integration in a CD-SEM have a significant impact on biased roughness measurements for all cases, but has very little impact on unbiased roughness measurement at 8 frames or greater. The throughput of a SEM metrology tool is roughly inversely proportional to the number of frames of integration used, and so the cost of a measurement is roughly proportional to the number of frames of integration used in the measurement. By reducing the number of frames of integration, say, from 32 to 16, a significant reduction in metrology cost (close to a factor of 2) is achieved without loss of metrology precision or accuracy, but only if unbiased roughness measurements are used.

While the embodiments described above make reference to the measurement of structures found on semiconductor wafers, as used in the manufacture of semiconductor devices, the invention is not limited to these applications. The invention can be usefully employed to measure the roughness of feature edges found on flat panel displays, microelectromechanical systems, microfluidic systems, optical waveguides, photonic devices, and other electronic, optical, or mechanical devices. Further, the invention can be used to measure the feature edge characteristics of naturally occurring structures such as crystals or minerals, or man-made structures such as nanoparticles or other nanostructures. Further, the invention can be used to measure the feature edge characteristics of biological samples as well.

While the embodiments described above make reference to measurements using a scanning electron microscope, the invention is not limited to that imaging tool. Other imaging tools, such as optical microscopes, stimulated emission and depletion (STED) microscopes, x-ray microscopes, transmission electron microscopes (TEM), focused ion beam microscopes, and helium ion microscopes, can also be used. Other forms of microscopes, such as scanning probe microscopes (atomic force microscopes (AFM) and scanning near-field optical microscopes (SNOM), for example) can be used as well.

While the embodiments described above make reference to top-down images of nominally planar pattern structures to measure edge roughness, the invention is not limited to such pattern structure geometries. Three-dimensional structures, non-flat structures, curved surfaces, or tilted structures can be measured using this invention. Besides edge roughness, surface roughness can be measured and analyzed using similar techniques as described in this invention.

While the embodiments described above make reference to the measurement of roughness, the invention can be used to make other measurements as well. For example, highly accurate determination of pattern structure edges can be used in the measurement of feature width, feature placement, edge placement, and other similar measures. Contours of measured features can be used for many purposes, such as modeling or controlling the performance of the measured device. By collecting and statistically averaging the measurement of many samples, even greater accuracy (lower uncertainty) can be obtained.

Consistent with the above disclosure, the examples of systems and methods enumerated in the following clauses are specifically contemplated and are intended as a non-limiting set of examples.

Clause 1. A method comprising:
generating a model trained to predict a low-probability stochastic defect;
using the model to predict the low-probability stochastic defect;
determining a process window based on the low-probability stochastic defect; and
controlling, based on the process window, a lithography tool to manufacture a device.

Clause 2. The method of any preceding clause, wherein the process window is determined based on one or more parameters of a lithography tool.

Clause 3. The method of any preceding clause, further comprising modifying the one or more parameters based on the low-probabilistic stochastic defect.

Clause 4. The method of any preceding clause, wherein the one or more parameters comprise an exposure dose of a lithography tool.

Clause 5. The method of any preceding clause, wherein the one or more parameters comprise a focus of a lithography tool.

Clause 6. The method of any preceding clause, wherein:
the stochastic defect comprises a bridge or a break in a pattern of lines and spaces manufactured in a specific way,
calibrating is performed by measuring a stochastic behavior of a sampling of lines and spaces manufactured in the specific way, and
the stochastic behavior is characterized by a standard deviation of an edge position or linewidth, by a power spectral density of measured deviations, by a local critical dimension uniformity of short line segments as a function of a length of the line segments, by another metric, or some combination thereof.

Clause 7. The method of any preceding clause, wherein:
the stochastic defect comprises a merged feature, a missing contact hole or pillar feature, or both, and
calibrating is performed by measuring a distribution of contact hole or pillar feature sizes on a sample of having a certain size.

Clause 8. The method of any preceding clause, further comprising:
generating a yield model trained to predict an amount of yield based on one or more stochastic defects; and
determining, using the yield model, the amount of yield by inputting the stochastic defect into the yield model.

Clause 9. A system comprising:
a memory device storing instructions; and
a processing device communicatively coupled to the memory device, wherein the processing device executes the instructions to:
generate a model trained to predict a low-probability stochastic defect;
use the model to predict the low-probability stochastic defect;
determining a process window based on the low-probability stochastic defect; and
control, based on the process window, a lithography tool to manufacture a device.

Clause 10. The system of any preceding clause, wherein the process window is determined based on one or more parameters of a lithography tool.

Clause 11. The system of any preceding clause, further comprising modifying the one or more parameters based on the low-probabilistic stochastic defect.

Clause 12. The system of any preceding clause, wherein the one or more parameters comprise an exposure dose of a lithography tool.

Clause 13. The system of any preceding clause, wherein the one or more parameters comprise a focus of a lithography tool.

Clause 14. The wherein of any preceding clause, wherein:
the stochastic defect comprises a bridge or a break in a pattern of lines and spaces manufactured in a specific way,
calibrating is performed by measuring a stochastic behavior of a sampling of lines and spaces manufactured in the specific way, and
the stochastic behavior is characterized by a standard deviation of an edge position or linewidth, by a power spectral density of measured deviations, by a local critical dimension uniformity of short line segments as a function of a length of the line segments, by another metric, or some combination thereof.

Clause 15. The system of any preceding clause, wherein:
the stochastic defect comprises a merged feature, a missing contact hole or pillar feature, or both, and
the calibrating is performed by measuring a distribution of contact hole or pillar feature sizes on a sample of having a certain size.

Clause 16. The system of any preceding clause, wherein the processing device is further to:
generate a yield model trained to predict an amount of yield based on one or more stochastic defects; and
determine, using the yield model, the amount of yield by inputting the stochastic defect into the yield model.

Clause 17. A tangible, non-transitory computer-readable medium storing instructions that, when executed, cause a processing device to:
generate a model trained to predict a low-probability stochastic defect;
use the model to predict the low-probability stochastic defect; determining a process window based on the low-probability stochastic defect; and
control, based on the process window, a lithography tool to manufacture a device.

Clause 18. The computer-readable medium of any preceding clause, wherein the process window is determined based on one or more parameters of a lithography tool.

Clause 19. The computer-readable medium of any preceding clause, further comprising modifying the one or more parameters based on the low-probabilistic stochastic defect.

Clause 20. The computer-readable medium of any preceding clause, wherein the one or more parameters comprise an exposure dose of a lithography tool.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Note that not all of the activities described above in the general description or the examples are required, that a portion of a specific activity may not be required, and that one or more further activities can be performed in addition to those described. Still further, the order in which activities are listed are not necessarily the order in which they are performed.

It can be advantageous to set forth definitions of certain words and phrases used throughout this patent document. The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, can mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items can be used, and only one item in the list can be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

Benefits, other advantages, and solutions to problems have been described above with regard to specific embodiments. However, the benefits, advantages, solutions to problems, and any feature(s) that can cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, can also be provided in combination in a single embodiment. Conversely, various features that are, for brevity, described in the context of a single embodiment, can also be provided separately or in any subcombination. Further, references to values stated in ranges include each and every value within that range.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
generating a model trained to predict a low-probability stochastic defect;
using the model to predict the low-probability stochastic defect;
determining a process window based on the low-probability stochastic defect; and
controlling, based on the process window, a lithography tool to manufacture a device.

2. The method of claim 1, wherein the process window is determined based on one or more parameters of a lithography tool.

3. The method of claim 2, further comprising modifying the one or more parameters based on the low-probability stochastic defect.

4. The method of claim 2, wherein the one or more parameters comprise an exposure dose of a lithography tool.

5. The method of claim 2, wherein the one or more parameters comprise a focus of a lithography tool.

6. The method of claim 1, wherein:
the stochastic defect comprises a bridge or a break in a pattern of lines and spaces manufactured in a specific way,
calibrating is performed by measuring a stochastic behavior of a sampling of lines and spaces manufactured in the specific way, and
the stochastic behavior is characterized by a standard deviation of an edge position or linewidth, by a power spectral density of measured deviations, by a local critical dimension uniformity of short line segments as a function of a length of the line segments, by another metric, or some combination thereof.

7. The method of claim 1, wherein:
the stochastic defect comprises a merged contact hole or pillar feature, a missing contact hole or pillar feature, or both, and
calibrating is performed by measuring a distribution of contact hole or pillar feature sizes on a sample of having a certain size.

8. The method of claim 1, further comprising:
generating a yield model trained to predict an amount of yield based on one or more stochastic defects; and
determining, using the yield model, the amount of yield by inputting the stochastic defect probability into the yield model.

9. A system comprising:
a memory device storing instructions; and
a processing device communicatively coupled to the memory device, wherein the processing device executes the instructions to:
generate a model trained to predict a low-probability stochastic defect;
use the model to predict the low-probability stochastic defect; determining a process window based on the low-probability stochastic defect; and
control, based on the process window, a lithography tool to manufacture a device.

10. The system of claim 9, wherein the process window is determined based on one or more parameters of a lithography tool.

11. The system of claim 10, further comprising modifying the one or more parameters based on the low-probability stochastic defect.

12. The system of claim 10, wherein the one or more parameters comprise an exposure dose of a lithography tool.

13. The system of claim 10, wherein the one or more parameters comprise a focus of a lithography tool.

14. The system of claim 10, wherein:
the stochastic defect comprises a bridge or a break in a pattern of lines and spaces manufactured in a specific way,
calibrating is performed by measuring a stochastic behavior of a sampling of lines and spaces manufactured in the specific way, and
the stochastic behavior is characterized by a standard deviation of an edge position or linewidth, by a power spectral density of measured deviations, by a local critical dimension uniformity of short line segments as a function of a length of the line segments, by another metric, or some combination thereof.

15. The system of claim 10, wherein:
the stochastic defect comprises a merged contact hole or pillar feature feature, a missing contact hole or pillar feature, or both, and
the calibrating is performed by measuring a distribution of contact hole or pillar feature sizes on a sample of having a certain size.

16. The system of claim 10, wherein the processing device is further configured to:
generate a yield model trained to predict an amount of yield based on one or more stochastic defects; and
determine, using the yield model, the amount of yield by inputting the stochastic defect probability into the yield model.

17. A tangible, non-transitory computer-readable medium storing instructions that, when executed, cause a processing device to:
generate a model trained to predict a low-probability stochastic defect;
use the model to predict the low-probability stochastic defect; determining a process window based on the low-probability stochastic defect; and
control, based on the process window, a lithography tool to manufacture a device.

18. The computer-readable medium of claim 17, wherein the process window is determined based on one or more parameters of a lithography tool.

19. The computer-readable medium of claim 18, further comprising modifying the one or more parameters based on the low-probability stochastic defect.

20. The computer-readable medium of claim 18, wherein the one or more parameters comprise at least one of an exposure dose of a lithography tool and a focus of a lithography tool.

* * * * *